US009093967B2

(12) United States Patent
Gorbachov

(10) Patent No.: US 9,093,967 B2
(45) Date of Patent: Jul. 28, 2015

(54) POWER AMPLIFIER WITH CO-EXISTENCE FILTER

(75) Inventor: Oleksandr Gorbachov, Irvine, CA (US)

(73) Assignee: RFAXIS, INC., Irvine, CA (US)

( * ) Notice: Subject to any disclaimer, the term of this patent is extended or adjusted under 35 U.S.C. 154(b) by 351 days.

(21) Appl. No.: 13/462,737

(22) Filed: May 2, 2012

(65) Prior Publication Data
US 2012/0280754 A1 Nov. 8, 2012

Related U.S. Application Data

(60) Provisional application No. 61/481,557, filed on May 2, 2011.

(51) Int. Cl.
| H04B 1/38 | (2006.01) |
| H03F 3/68 | (2006.01) |
| H03F 1/56 | (2006.01) |
| H03F 3/195 | (2006.01) |
| H03F 3/24 | (2006.01) |
| H03F 3/72 | (2006.01) |
| H03H 7/01 | (2006.01) |

(52) U.S. Cl.
CPC .................. *H03F 3/68* (2013.01); *H03F 1/565* (2013.01); *H03F 3/195* (2013.01); *H03F 3/24* (2013.01); *H03F 3/72* (2013.01); *H03H 7/1741* (2013.01); *H03F 2200/222* (2013.01); *H03F 2200/294* (2013.01); *H03F 2200/387* (2013.01)

(58) Field of Classification Search
CPC ............. H04B 1/48; H04B 1/44; H04B 1/525
USPC ..................................................... 455/73, 78
See application file for complete search history.

(56) References Cited

U.S. PATENT DOCUMENTS

| 6,108,313 | A | 8/2000 | Lee et al. |
| 6,356,536 | B1 * | 3/2002 | Repke ........................... 370/282 |
| 6,937,845 | B2 | 8/2005 | Watanabe et al. |
| 6,977,552 | B2 * | 12/2005 | Macedo ........................ 330/283 |

(Continued)

FOREIGN PATENT DOCUMENTS

WO 2008/002697 3/2008

OTHER PUBLICATIONS

WLAN WiMAX PA & FEM Market, Feb. 12, 2009; 158 page presentation.

(Continued)

*Primary Examiner* — April G Gonzales
(74) *Attorney, Agent, or Firm* — Stetina Brunda Garred & Brucker

(57) ABSTRACT

A power amplifier architecture and front end circuits utilizing the same that connect a transceiver to an antenna are disclosed. The transceiver is configured for a specific operating frequency. An input matching segment is connected to an input port, and an output matching segment is connected to an output port. An amplifier segment includes at least one transistor with a first terminal connected to the input matching segment, a second terminal connected to the output matching segment, and a third terminal connected to a filter with a range of rejection frequencies. The filter is connected in close proximity to a first inductive interconnection tying a junction connected to the third terminal to a ground. A compensator is also connected to the input matching segment and the output matching segment to minimize instability of the filter.

43 Claims, 41 Drawing Sheets

(56) References Cited

U.S. PATENT DOCUMENTS

| | | | |
|---|---|---|---|
| 6,982,672 B2* | 1/2006 | Lin et al. | 343/700 MS |
| 7,315,730 B2 | 1/2008 | Galan | |
| 7,656,251 B1* | 2/2010 | Bauder et al. | 333/133 |
| 7,903,724 B2* | 3/2011 | Rofougaran | 375/219 |
| 8,005,504 B2 | 8/2011 | Sano et al. | |
| 8,036,148 B2* | 10/2011 | Fukamachi et al. | 370/282 |
| 2004/0209584 A1 | 10/2004 | Bargroff et al. | |
| 2004/0251966 A1* | 12/2004 | Yeh | 330/285 |
| 2006/0045202 A1 | 3/2006 | Rafi et al. | |
| 2006/0068730 A1 | 3/2006 | Khorram | |
| 2007/0188224 A1* | 8/2007 | Dow et al. | 330/129 |
| 2007/0222697 A1 | 9/2007 | Caimi et al. | |
| 2007/0232241 A1 | 10/2007 | Carley et al. | |
| 2008/0079499 A1* | 4/2008 | Tsai | 330/311 |
| 2008/0089252 A1 | 4/2008 | Choi | |
| 2008/0159458 A1 | 7/2008 | Cheng et al. | |
| 2008/0246547 A1* | 10/2008 | Blednov | 331/109 |
| 2008/0279262 A1* | 11/2008 | Shanjani | 375/219 |
| 2008/0299987 A1 | 12/2008 | Iyer et al. | |
| 2009/0036065 A1 | 2/2009 | Siu | |
| 2009/0167627 A1 | 7/2009 | Breiter | |
| 2009/0179702 A1 | 7/2009 | Blednov | |
| 2009/0207764 A1 | 8/2009 | Fukamachi et al. | |
| 2010/0327976 A1* | 12/2010 | Klemens et al. | 330/277 |
| 2011/0003563 A1* | 1/2011 | Gorbachov | 455/78 |
| 2011/0096705 A1* | 4/2011 | Kemmochi et al. | 370/297 |

OTHER PUBLICATIONS

Cirronet ZigBee High Power Module ZMN2405HP; Oct. 28, 2007; 6 pages.
Cirronet ZigBee High Power Module ZMN2430HP; Oct. 28, 2007; 6 pages.
Design of a Dual Band Wireless LAN SiGe-Bipolar Power Amplifier; from Sep. 2004 High Frequency Electronics; 8 pages.
EPCOS WLAN Modules Preliminary Datasheet R041_M01; Jun. 20, 2006; 14 pages.
EMBER Datasheet; EM2420 2.4 GHz IEEE 802.15.4 / ZigBee RF Transceiver; Copyright 2003, 2004 by Ember Corporation; 89 pages.
Free2Move Class 1 Bluetooth Module—F2M03C1 Datasheet; Rev. Sep. 13, 2005; 46 pages.
Freescale Semiconductor Technical Data Document No. MC13191/D; Rev. 1.2 Apr. 2005; MC13191: 2.4 GHz ISM Band Low Power Transceiver; 24 pages.
Freescale Semiconductor Technical Data Document No. MC13192; Rev. 3.2 May 2007; MC13192: 2.4 GHz Low Power Transceiver for the IEEE 802.15.4 Standard; 24 pages.
Freescale Semiconductor; MC13191: 2.4 GHz Low Power Transceiver for the IEEE 802.15.4 Standard; Reference Manual; Document No. MC13191RM; Rev. 1.2; Apr. 2005; 92 pages.
Freescale Semiconductor Technical Data; Document No. MC13192; Rev. 2.8, Apr. 2005; MC13192/MC13193: 2.4 GHz Low Power Transceiver for the IEEE 802.15.4 Standard; 23 pages.
Freescale Semiconductor MC131921MC13193: 2.4 GHz Low Power Transceiver for the IEEE 802.15.4 Standard; Reference Manual; Rev. 1.3 0412005; 111 pages.
California Eastern Laboratories; ZIC2410 Datasheet; Rev. A; Document No. 0005-05-07-00-000; Jun. 20, 2008; 119 pages.
CEL Preliminary Data Sheet; Apex & Apex LT Series Transceiver Modules; ZAXM-201-1, ZALM-301-1; May 7, 2008; 17 pages.
CEL Preliminary Data Sheet; Freestar Series Transceiver Module; ZFSM-101-1; May 7, 2008; 10 pages.
CEL Preliminary Data Sheet; Matrix Transceiver Modules; ZMXM-400 Series; May 7, 2008; 12.
J. Trachewsky, et al.; Broadcom WLAN Chipset for 802.11a/b/g; Broadcom Corporation, CA, USA; Aug. 17, 2003; 42 pages.
Anadigics; AWL6254; 1.4 GHz 802.11b/g/n; WLAN PA, LNA, and RF Switch Data Sheet—Rev 2.0; 0212008; 16 pages.
Anadigics; AWM6430; 3.3-3.6 GHz Power Amplifier Module; Preliminary Data Sheet; Rev 1.0; Jan. 2006; 12 pages.
Zhang, Weimin; A Low Voltage Fully-Integrated 0.18um CMOS Power Amplifier for 5GHz WLAN; Institute of Microelectronics, Singapore; 2002; 4 pages.
Copeland, Miles A.; 5-GHz SiGe HBT Monolithic Radio Transceiver with Tunable Filtering; IEEE Transactions on Microwave Theory and Techniques, vol. 48 No. 2, Feb. 1000, 12 pages.
Atherso: AR3011—ROCm Solutions for Bluetooth; Radio-On-Chip for Mobile (ROCm) Products; Jan. 22, 2008; 2 pages.
Atheros: AR3000—ROCm Solutions for Bluetooth Radio-On-Chip for Mobile (ROCm) Products; Jan. 22, 2008; AR3031; 2 pages.
Atheros: ROCm Platform; Radio-On-Chip for Mobile (ROCm; AR6001GL; Embedded 802.11b/g Solution for Mobile and Battery-Operated Devices; 2006; 2 pages.
Atheros; AR6002 Breaking the Power Barrier in Mobile WiFi; Aug. 28, 2008; 2 pages.
Atheros:AR6001GL; Embedded 802.11b/g Solution for Mobile and Battery-Operated Devices; 2006; 2 pages.
Atheros; AR6001XL; Embedded 802.11a/b/g Solution for Mobile and Battery-Operated Devices; 2006; 2 pages.
Atheros; AR6101G; World's Most Integrated, Cost-Effective Single-Chip WLAN Handset Design Brings Voice-Over-WiFi to the Mainstream; 2006; 2 pages.
Atheros; AR9285 Single-chip PCIe based on 802.11n 1-stream specification; Oct. 28, 2008; 2 pages.
Atheros; AR9002AP-1S; AP/Router solution based on 802.11n 1-stream specification; Oct. 28, 2008; 2 pages.
California Eastern Laboratories Fully-Integrated RF Transceiver System-on-Chip for ZigBee/IEEE 802.15.4 Applications Announced; California Eastern Laboratories, Aug. 6, 2008; 2 pages.
SiGe PA Enables Smallest System Footprint for Embedded WLAN; Semiconductor Online; Dec. 15, 2008; 3 pages.
Skyworks: SKY65336: 2.4 GHz Transmit/Receive Front-End Module with Integrated LNA; Skyworks Solutions, Inc.; Aug. 20, 2008; 2 pages.
Skyworks; SKY65337: 2.4 GHz Transmit/Receive Front-End Module; Skyworks Solutions, Inc.; Aug. 20, 2008; 2 pages.
Skyworks; SKY65241-12: WLAN 802.11a, b, g, n. Dual-Band Intera Front-End Module Single Antenna; Skyworks Solutions, Inc.; Mar. 12, 2008; 9 pages.
Skyworks; SKY65243-11: WLAN 802.11a, b, g, n. Dual-Band Intera Front-End Module Dual Antennas; Skyworks Solutions, Inc.; Mar. 12, 2008; 8 pages.
Skyworks; SKY65256-11: WLAN 802.11a, b, g, n. Dual-Band Front-End Module Single Antenna; Skyworks Solutions, Inc.; Sep. 28, 2007; 10 pages.
Skyworks; SKY65228-11: WLAN 802.11n Single Band 4.9-5.85 GHz MIMO Intera Front-End Module; Skyworks Solutions, Inc.; Oct. 9, 2007; 9 pages.
Skyworks; SKY65206-13: WLAN 802.11b/g Intera Front-End Module; Skyworks Solutions, Inc.; Aug. 21, 2007; 7 pages.
Skyworks; SKY65249-11: WLAN 802.11b, g, n. Intera Front-End Module; Skyworks Solutions, Inc.; Nov. 30, 2007; 9 pages.
Skyworks; SKY65227-11: WLAN 802.11n Single Band Intera 2.4 GHz MIMO Intera Front-End Module; Skyworks Solutions, Inc.; Oct. 9, 2007; 9 pages.
Skyworks; SKY65230-11: WLAN 802.11 n 2 × 2 MIMO Intera Front-End Module with 3 Antenna Ports; Skyworks Solutions, Inc.; Oct. 9, 2007; 13 pages.
Skyworks; SKY65225-11: WLAN 802.11n 2 × 2 MIMO Intera Front-End Module; Skyworks Solutions, Inc.; May 7, 2007; 11 pages.
Skyworks; SKY65135: WLAN Power Amplifier; Skyworks Solutions, Inc.; Mar. 26, 2007; 13 pages.
Skyworks; SKY65209: WLAN 802.11b/g Front-End Module ; Skyworks Solutions, Inc.; Jan. 18, 2006; 8 pages.
4.9-5.8 GHz High-Linearity Power Amplifier SST11LP11; SST Communications Corp; 2005, 14 pages.
4.9-5.8 GHz High-Linearity Power Amplifier SST11LP12; SST Communications Corp; 2005, 14 pages.
2.4 GHz Power Amplifier SST12LP00; SST Communications Corp; 2005, 9 pages.
2.4 GHz High-Linearity Power Amplifier SST12LP10; SST Communications Corp; 2005, 12 pages.

(56) References Cited

OTHER PUBLICATIONS 2.4 GHz Power Amplifier SST12LP14; SST Communications Corp; 2005, 12 pages.
2.4 GHz High-Power, High-Gain Amplifier SST12LP15; SST Communications Corp; 2005, 12 pages.
2.4 GHz High-Power, High-Gain Amplifier SST12LP15A; SST Communications Corp; 2005, 12 pages.
STLC2500C: Bluetooth ESR Single Chip Data Brief; STMicroelectronics; Jan. 2006, 4 pages.
STLC4550: Single Chip 802.11b/g WLAN radio Data Brief; STMicroelectronics; Feb. 2006, 5 pages.
ZigBee—compliant wireless control and sensoring network solutions; STMicroelectronics; Jun. 2006; 8 pages.
Amin, Yasar, et al; Integration of Passives for Receiver Front-End for 5GHz Wireless LAN Applications; Royal Institute of Technology, Sweden & U of Engineering & Tech, Taxila, Pakistan; 2004; p. 24-29.
Texas Instruments: CC2591; 2.4-GHz RF Front End, data sheet, Jun. 2008, Texas Instruments, Inc. 18 pages.
Texas Instruments: CC2436; High-Power Dual-Band (2.4-GHz and 4.9-GHz to 5.9-GHz) RF Front End, data sheet, May 2007; Texas Instruments, Inc. 15 pages.
Hoppenstein, Russell; High-Performance WiMAX RF Chipset Enable CPE and BTS Applications; Texas Instruments Inc.; Oct. 20, 2006.
Texas Instruments: Technology for Innovators: WiLink 4.0 single-chip mobile WLAN solutons Product Bulletin; 2006 Texas Instruments Inc., 2 pages.
Chipcon Products from Texas Instruments: CC2420; 2.4 GHz IEEE 802.15.41 ZigBee-ready RF Transceiver; 2008, Texas Instruments Inc., 89 pages.
Chipcon Products from Texas Instruments: CC2430; A True System-on-Chip solution for 2.4 GHz IEEE 802.15.41 ZigBee; 2007, Texas Instruments Inc., 212 pages.
Texas Instruments: CC2520 Datasheet; 2.4 GHz IEEE 802.15.4/SIZBEE RF Transceiver; Dec. 2007; Texas Instruments Inc.; 2007; 128 pages.
Zheng, Shaoyong, et al.; Distributed Power Amplifier/Feedback Low Noise Amplifier Switch-Less Front-End; Dept. Electronic Engineering, City University of Hong Kong, Feb. 8, 2006, p. 1659-1662.
Masse, Cecile; Analog/RF Front End; A direct-conversion transmitter for WiMAX and WiBro applications; www.rfdesign.com ; Jan. 2006, 3 pages.
XBEE OEM RF Modules; ZigBee 1802.15.4 OEM RF Modules by MaxStream, Inc. Specifications; MaxStream, Inc., 2005, 2 pages.
Fanucci, L, et al.; A Novel Fully Integrated Antenna Switch for Wireless Systems; Pisa, Italy, Sep. 16, 2003; 4 pages.
RFMD: Mobile Computing: Front End Module Portfolio; rfmd.com; 2009, 2 pages.
Maxim: Application Note 686; QPSK Modulation Demystified; May 1, 2002; 7 pages.
ATMEL: Bluetooth Front-end IC T7024 Design Guide; Jun. 2004; 18 pages.
ATMEL: Integrated SiGe Front-end RF ICs;2003, 2 pages.
ATMEL: 5-GHz WLAN Power Amplifier for 802.11a, ATR3515 Preliminary; 2004, 7 pages.
ATMEL: High Gain Power Amplifier for 802.11b/g WLAN Systems, ATR7032 Preliminary; 2006, 15 pages.
ATMEL: ZigBee IEEE 802.15.4 Radio Transceiver; AT86RF230, Preliminary; 2007, 82 pages.
Anadigics: AWM6430; 3.5 GHz WiMAX Power Amplifier Module, Advanced Product Information—Rev. 0.1; Jan. 2005; 12 pages.
Broadcom; BCM4328 Product Brief; Air Force One Single-Chip IEEE 802.11a/b/g MAC/Baseband/Radio With Integrated CPU; Dec. 5, 2006; 2 pages.
Broadcom; BCM4326 Product Brief; Air Force One Single-Chip IEEE 802.11b/g MAC/Baseband/Radio With Integrated CPU; Dec. 5, 2006; 2 pages.
Broadcom: BCM94318 Product Brief: Airforce One Chip 802.11 Reference Design; Oct. 7, 2004; 2 pages.
Xin He, Fully Integrated Transceiver Design in SOI Processes, a Dissertation, Kansas State University, 2004, 129 pages.
Maxim: Industry's First Ultra-Low-Power, 802.11g/b RF Transceiver to Integrate PA, Rx/Tx/Antenna Diversity Switches, and Crystal Oscillator Circuitry; Apr. 30, 2008; 2 pages.
Maxim: MAX2830 Industry's First802.11G/B RF Transceiver with Integrated PA, Rx/Tx and Antenna Switches; Apr. 30, 2008; 3 pages.
Meshnetics: ZigBit Amp OEM Modules; ZDM-A1281-PN/PNO (MNZG-A24-UFL/UO) Revision 2.2; Ultra-Compact 2.4GHz 802.15.4/ZigBee Modules with Power Amplifier for Wireless Networking Applications; Oct. 2008, 18 pages.
Meshnetics M2M-100-2008: ZigBit Amp Module; 2.4 GHz Amplified Modules for IEEE 802.15.4/ZigBee Wireless Mesh Networking Applications; 2008; 2 pages.
Meshnetics: ZigBit Amp OEM Modules ZDM-A1281-PN/PNO Revision 2.1; Ultra-Compact 2.4GHz 802.15.4/ZigBee Modules with Power Amplifier for Wireless Networking Applications; Dec. 2007, 15 pages.
Murata MF2400PJ-SF0702; PA MMIC for 2.4GHz Wireless Communication; Jan. 18, 2003; 11 pages.
CEL; GaAs Integrated Circuit PG2250T5N; 1.8 V, Power Amplifier for Bluetooth Class 1; NEC Electronics Corp.; 2006, 12 pages.
CEL NEC's Power Amplifier for Bluetooth Class 1: UPG2301TQ Data Sheet; Feb. 4, 2004; 7 pages.
CEL: GaAs HBT Integrated Circuit PG2314T5N: Power Amplifier for Bluetooth Class 1; Jul. 2006, 10 pages.
CEL Application Note: AN1048 UPG2150T5L Switch; Sep. 29, 2005, 1 page.
CEL California Eastern Laboratories: AN1049 UPG2314T5N HBT PA IC for Bluetooth and ZigBee; Oct. 17, 2006; 5 pages.
RT2501 Wireless Chipset 802.11 b/g solution featuring Packet-OVERDRIVE Technology; Ralink Technology Corp; 2006, 1 page.
RT2501U; USB2.0 Wireless Chipset 802.11 b/g solution featuring Packet-OVERDRIVE Technology; Ralink Technology Corp., 2006, 1 page.
RT2600 MIMO XR Wirless Chipset 802.11b/g solution featuring Packet-OVERDRIVE and Range-OVERDRIVE Technologies; Ralink Technology Corp; 2006, 1 page.
RT2700 MIMO Wireless Chipset Family; 802.11n Solution featuring MIMObility Technology; Ralink Technology Corp; 2006, 2 pages.
RT2800 MIMO Wireless Chipset Family 802.11n Solution featuring MIMObility Technology; Ralink Technology Corp; 2006, 2 pages.
RT5201 Wireless Chipset 802.11 a/b/g solution featuring Packet-OVERDRIVE Technology; Ralink Technology Corp; 2006, 1 page.
RT5201U USB 2.0 Wireless Chipset 802.11 a/b/ solution featuring Packet-OVERDRIVE Technology; Ralink Technology Corp; 2006, 1 page.
RT5600 MIMMO XR Wireless Chipset 802.11 a/b/g solution featuring Packet-OVERDRIVE and Range-OVERDRIVE Technologies; Ralink Technology Corp; 2006, 1 page.
Agnelli, Federico, et al; Wireless Multi-Standard Terminals: System Analysis and Design of a Reconfigurable RF Front-end; IEEE Circuits and Systems Magazine; First Quarter 2006; p. 38-59.
Cutler, Tim; ZigBee: RF power options in ZigBee solutions; Emerging Wireless Technology/A Supplement to RF Design; www.rfdesign.com; Mar. 2006; p. 18-21.
Richwave RTC6682 V0.3 Data Sheet; www.richwave.com.tw; Aug. 2006; 7 pages.
PCT International Search Report and written opinion for PCT/US2012/036187; Sep. 24, 2012; 14 pages.

* cited by examiner

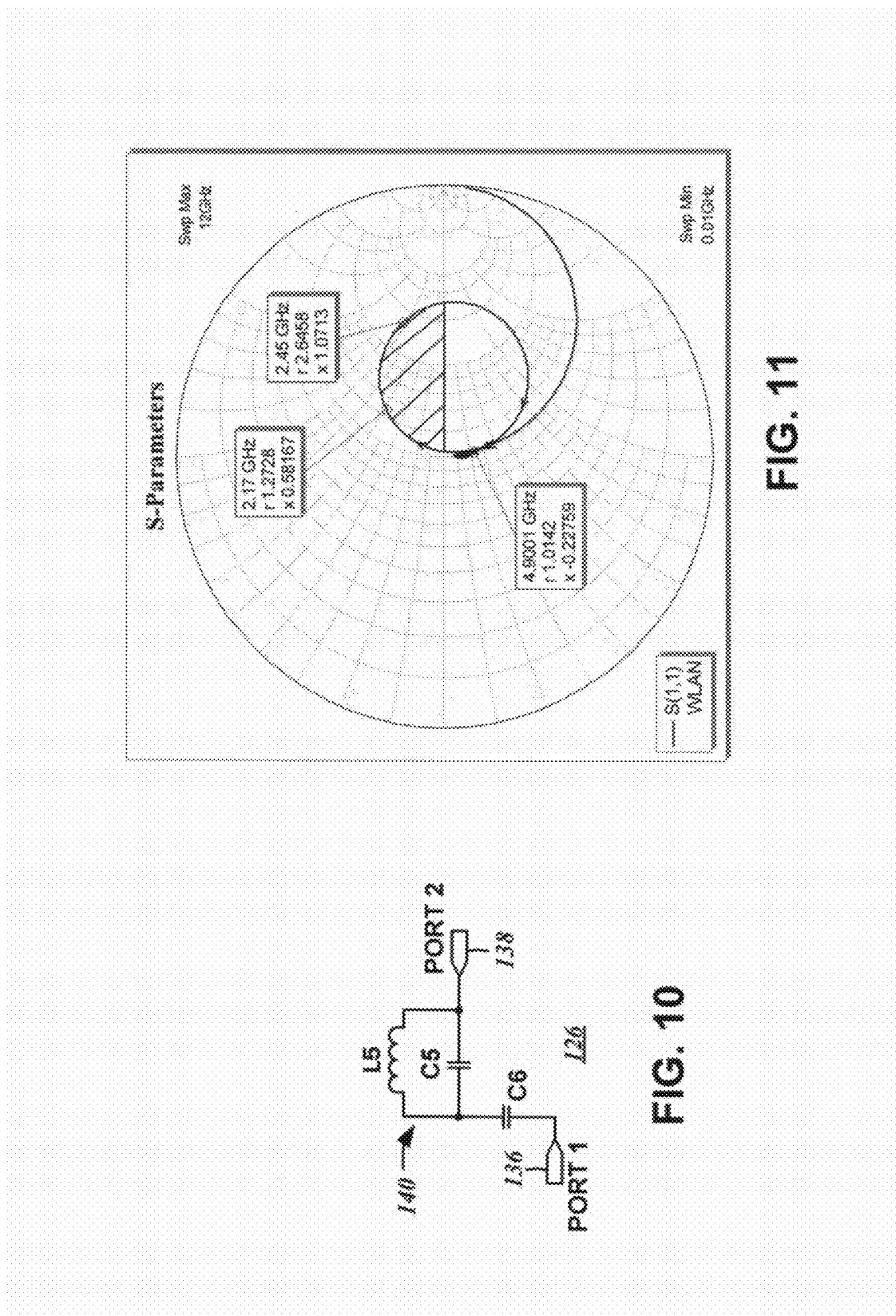

POWER AMPLIFIER WITH CO-EXISTENCE FILTER

CROSS-REFERENCE TO RELATED APPLICATIONS

This application relates to and claims the benefit of U.S. Provisional Application No. 61/481,557, filed May 2, 2011 and entitled WLAN POWER AMPLIFIER ARCHITECTURE WITH CO-EXISTENCE FILTER FOR WCDMA HANDSET APPLICATIONS, which is wholly incorporated by reference herein.

STATEMENT RE: FEDERALLY SPONSORED RESEARCH/DEVELOPMENT

Not Applicable

BACKGROUND

1. Technical Field

The present disclosure relates generally to radio frequency (RF) signal circuitry, and more particularly, to wireless local area network (WLAN) power amplifiers with a co-existence filter for mobile wireless communications devices.

2. Related Art

Wireless communications systems find application in numerous contexts involving data transfer over long and short distances alike, and there exists a wide range of modalities suited to meet the particular needs of each. Chief amongst these systems with respect to popularity and deployment is the mobile or cellular phone, and it has been estimated that there are over 4.6 billion subscriptions worldwide.

Generally, wireless communications involve a radio frequency (RF) carrier signal that is variously modulated to represent data, and the modulation, transmission, receipt, and demodulation of the signal conform to a set of standards for coordination of the same. Many different mobile communication technologies or air interfaces exist, including GSM (Global System for Mobile Communications), EDGE (Enhanced Data rates for GSM Evolution), and UMTS (Universal Mobile Telecommunications System). Various generations of these technologies exist and are deployed in phases, with one common third generation (3G) UMTS-related modality referred to as UMTS-FDD (frequency division duplexing) being W-CDMA (Wideband Code Division Multiplexing). Besides mobile communications modalities such as these, mobile phones also incorporate local area data networking modalities such as Wireless LAN, or WLAN (IEEE 80.11x).

A fundamental component of mobile handsets, or any wireless communications system for that matter, is the transceiver, that is, the combined transmitter and receiver circuitry. The transceiver encodes the data to a baseband signal and modules it with an RF carrier signal. Upon receipt, the transceiver down-converts the RF signal, demodulates the baseband signal, and decodes the data represented by the baseband signal. An antenna connected to the transmitter converts the electrical signals to electromagnetic waves, and an antenna connected to the receiver converts the electromagnetic waves back to electrical signals. Conventional mobile handset transceivers typically do not generate sufficient power or have sufficient sensitivity for reliable communications standing alone. Thus, additional conditioning of the RF signal is necessary. The circuitry between the transceiver and the antenna that provide this functionality is referred to as the front-end module, which include a power amplifier for increased transmission power, and/or a low noise amplifier for increased reception sensitivity.

A functionality frequently demanded of the mobile phone networks by its users is multitasking, particularly with regard to simultaneous use of the mobile communications or cellular network modality for voice calls, and the data communications or WLAN modality to browse the Internet or download data files. There are a number of challenges associated with this, one of these being the crowded RF environment within which the WLAN subsystem operates. Furthermore, some mobile communications subsystems such as WCDMA/UMTS utilize a frequency domain duplex protocol in which the transmitter and the receiver are always activated. The transmissions from the WLAN subsystem, notwithstanding different operating frequencies, tend to cause spurious noise and interference. The diminutive size of the handset and the attendant necessity for positioning the respective antennas of the different communications subsystems in relatively close proximity to each other add another layer of challenges. Within these restrictions, one of the important objectives is to prevent the base band and other types of noise from the WLAN communications subsystem from interfering with reliable cellular network reception, without overloading or de-sensitizing the mobile communications subsystem.

Consequently, filtering is critical in the implementation of multimode mobile communications handsets. In the combined WCDMA and WLAN operating environment, bandpass co-existence filters are used to minimize the degradation of the WCDMA receive chain sensitivity. Additional rejection of unwanted spectrum emissions such as harmonics of WLAN transmissions may be possible with such filters. However, these are typically low temperature co-fired ceramic (LTCC) devices that tend to be bulkier and thereby increase the overall footprint of the printed circuit board. Furthermore, such co-existence filters also degrade the performance of the WLAN system due to increased current consumption and degraded reception sensitivity. Recently, different types of filters such as SAW (surface acoustic wave) or BAW (bulk acoustic wave) are being utilized. The fabrication of such filters can be accomplished with a smaller footprint, but the costs are significantly higher.

Some filtering can be incorporated into the WLAN power amplifier chain in order to minimize the demand for external filtering. The filter is typically connected at the input of the power amplifier, and though it would be advantageous to fabricate the same on-die, the performance of such implementations is inadequate. Problematically, the fairly low Q-factors of on-die components necessitated the addition of an external co-existence filter. In particular, such external filters connected to the output of the WLAN chain have an insertion loss of approximately 1.5 dB to 2.0 dB. This would require a higher output from the power amplifier, thereby leading to greater current consumption from the power source (battery). The insertion loss associated with the external co-existence filter also decreases the receive sensitivity of the WLAN chain, adversely affecting the link distance and data throughput.

Thus, there is a need in the art for eliminating the external co-existence filters from front end circuits implementing combined WLAN and WCDMA wireless communications modalities while retaining adequate performance parameters for both. Consequently, there is a need for the on-die fabrication of the co-existence filter, which would reduce the cost of the front end system, reduce its size, as well as its current consumption during WLAN transmission. It would be advantageous for such front end circuit to have increased sensitivity during WLAN reception, as well as high sensitivity during WCDMA reception.

BRIEF SUMMARY

In accordance with various embodiments of the present disclosure, there is contemplated a power amplifier architecture for connecting a transceiver to an antenna, and include an input port and an output port. The transceiver may be configured for a specific operating frequency. There may be an input matching segment that connected to the input port, as well as an output matching segment that is connected to the output port. There may be at least one filter with a range of rejection frequencies. The power amplifier architecture may also include an amplifier segment that may have at least one transistor with a first terminal connected to the input matching segment, a second terminal connected to the output matching segment, and a third terminal connected to the filter. The filter may be connected in close proximity to a first inductive interconnection tying a junction connected to the third terminal to a ground. Furthermore, there may be a compensator that is connected to the input matching segment and the output matching segment to minimize instability of the filter.

Another embodiment contemplates a radio frequency (RF) front end architecture for connecting a transceiver to an antenna. There may be a transmit input port connectible to an output line of the transceiver, and a receive output port connectible to an input line of the transceiver. Additionally, there may be a power amplifier with an operating frequency that is connected to the transmit input port. The power amplifier may include an input matching segment, an output matching segment, and an amplifier segment. The front end architecture may further include a filter with a range of rejection frequencies connected to an emitter side of the amplifier segment. Notwithstanding the reference to an emitter, which is specific to bipolar transistors, other types of transistors such as various field effect types may be substituted. In such case, the emitter is understood to correspond to the source. There may also be a compensator connected to the output matching segment and the input matching segment of the power amplifier to minimize instability effects associated with the emitter side filter. A low noise amplifier that is connected to the receive output port may be provided. There may be a switch having a first port connected to the antenna, a second port connected to the low noise amplifier, and a third port connected to the power amplifier. The low noise amplifier and the second may being selectively connectible to the antenna by the switch.

In yet another embodiment, there may be an RF front end circuit that can connect a first transceiver operating in a first frequency band to a first antenna and a second transceiver operating in a second frequency band to a second antenna. The front end circuit may include a first power amplifier connectible to a transmit line from the first transceiver, as well as a first low noise amplifier connectible to a receive line from the first transceiver. Furthermore, the front end circuit may include a second power amplifier connectible to a transmit line from the second transceiver, and a second low noise amplifier connectible to a receive line from the second transceiver. There may be a co-existence filter in a transmit chain defined by an interconnection between the transmit line from the second transceiver and the second antenna including the second power amplifier. The co-existence filter can reject a portion of a transmitted signal of the second frequency band overlapping in frequency with a reception of the first frequency band. The first power amplifier and the first low noise amplifier may be connectible to the first antenna, and the second power amplifier and the second low noise amplifier may be selectively connectible to the second antenna. The co-existence filter may be fabricated on-die together with the second power amplifier and the second low noise amplifier.

The present invention will be best understood by reference to the following detailed description when read in conjunction with the accompanying drawings.

BRIEF DESCRIPTION OF THE DRAWINGS

These and other features and advantages of the various embodiments disclosed herein will be better understood with respect to the following description and drawings, in which:

FIG. 10 is a schematic diagram of one embodiment of the compensation circuit;

FIG. 11 is a Smith chart illustrating a response of the compensation circuit shown in FIG. 10;

FIGS. 23A-24D are graphs of simulated S-parameters over load phase;

FIGS. 24A-24D are graphs of simulated S-parameters over source mismatch phase;

Common reference numerals are used throughout the drawings and the detailed description to indicate the same elements.

DETAILED DESCRIPTION

The present disclosure contemplates various radio frequency (RF) front ends, particularly power amplifiers and related transmit chain circuitry. The detailed description set forth below in connection with the appended drawings is intended as a description of the presently preferred embodiments of the disclosure, and is not intended to represent the only form in which they may be developed or utilized. The description sets forth the functions in connection with the illustrated embodiments. It is to be understood, however, that the same or equivalent functions may be accomplished by different embodiments that are also intended to be encompassed within the scope of the present disclosure. It is further understood that the use of relational terms such as first and second and the like are used solely to distinguish one from another entity without necessarily requiring or implying any actual such relationship or order between such entities.

The described examples are particular to a dual operational mode communications system that includes a WCDMA (Wideband Code Division Multiple Access) mobile communications modality, as well as a WLAN (Wireless Local Area Network) data networking modality. In many cases, the terms WCDMA and WLAN are utilized as modifiers of various components of the system. However, the contemplated disclosure is understood to be applicable to other communications and networking modalities, such as GSM (Global System for Mobile communications), GPRS (General Packet Radio Service), EDGE (Enhanced Data rates for GSM Evolution), WCDMA-HSPA (High Speed Packet Access)-LTE (Long Term Evolution), CDMA2000, and so forth. Those having ordinary skill in the art will be able to implement corresponding systems for such alternative communications modalities and particular operating frequencies attendant thereto based upon the disclosures herein. As such, reference to a specific communications modality in relation to particular components is by way of example only and not of limitation. Broader descriptors will also be referenced to the extent possible, but may be omitted for the sake of simplification.

Figure 1:
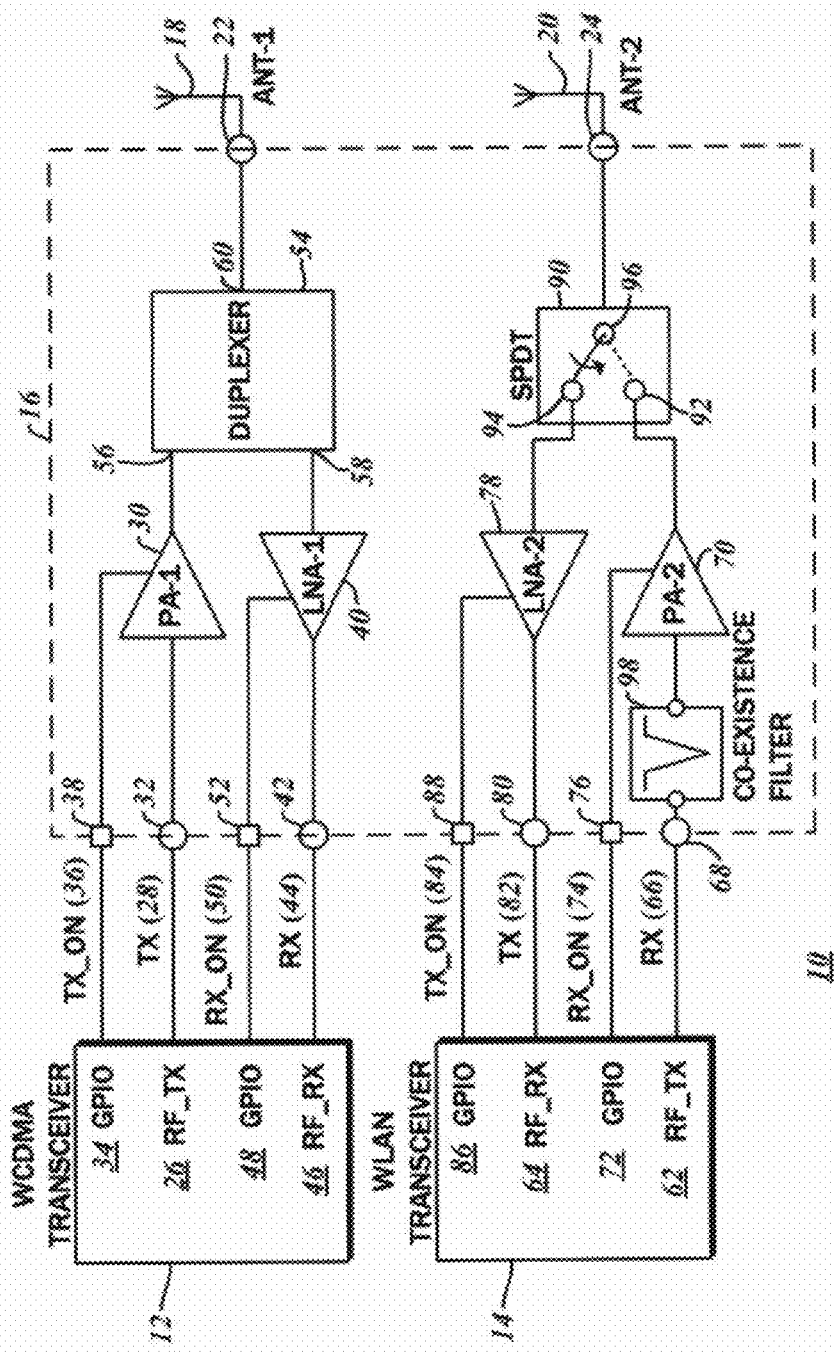
FIG. 1 is a block diagram illustrating one embodiment of a dual operational mode communications system including a first transceiver, a second transceiver, a front end circuit, and a pair of antennas.

Referring now to the block diagram of FIG. 1, there is shown a dual operational mode communications system 10. More particularly, there is a first transceiver 12 that transmits and receives RF signals compliant with the WCDMA modality/standard, and a second transceiver 14 that transmits and receives RF signals compliant with the WLAN modality standard. The first transceiver 12 and the second transceiver 14 are connected to a front end circuit 16, which in turn is connected to a first (WCDMA) antenna 18 and a second (WLAN) antenna 20 via a first antenna port 22 and a second antenna port 24, respectively.

The first transceiver 12 generates an RF signal for transmission to a counterpart remote receiver on a first modality (WCDMA) transmit port 26. This signal, also referred to as a WCDMA transmit signal 28, is passed to a first (WCDMA) power amplifier 30 through a transmit input port 32 on the front end circuit 16. As mentioned above, the power level of the WCDMA transmit signal 28 may be inadequately low for reliable and longer distance RF communications, and is increased by the first power amplifier 30 The first power amplifier 30 is enabled and disabled from a signal generated on a general purpose input/output (GPIO) port 34 of the first transceiver 12. This signal may be referred to as a WCDMA transmit enable signal 36, and is passed to the first power amplifier 30 via a WCDMA transmit enable input port 38 on the front end circuit 16.

The first transceiver 12 typically lacks the sensitivity to detect the received RF signals on the first antenna 18, and the power levels are accordingly increased by a first (WCDMA) low noise amplifier 40. The amplified signal is passed to a WCDMA receive output port 42 of the front end circuit 16 as a WCDMA receive signal 44. The WCDMA receive output port 42 is connected to a first modality (WCDMA) receive port 46 on the first transceiver 12. To enable and disable signal reception, the first transceiver 12, on the second GPIO port 48, generates a WCDMA receive enable signal 50 that is passed to the first low noise amplifier 40 via a WCDMA receive enable input port 52 on the front end circuit 16.

The output of the first power amplifier 30, and the input to the first low noise amplifier 40 are connected to a duplexer 54. More particularly, the duplexer 54 has a first port 56 that is connected to the first power amplifier 30, a second port 58 connected to the first low noise amplifier 40, and a third port 60 connected to the first antenna port 22. As understood, frequency domain duplexing is utilized with the WCDMA communications modality of the first transceiver 12. Accordingly, signal transmission and reception takes place on two different frequencies, and so the first antenna 18 can be simultaneously connected to both the first power amplifier 30 and the first low noise amplifier 40.

The dual operational mode communications system 10 also includes the second transceiver 14, which is specific to a WLAN communications modality. The front end circuit 16 includes components and features specific to the second transceiver 14 that are for the most part equivalent to those for the first transceiver 12 described above.

In this regard, the second transceiver 14 includes a second (WLAN) modality transmit port 62, as well as a second (WLAN) modality receive port 64. The second transceiver 14 generates a WLAN transmit signal 66 that is passed to a WLAN transmit input port 68 of the front end circuit 16 and amplified by a second (WLAN) power amplifier 70. Another GPIO port 72 on the second transceiver 14 outputs a WLAN transmit enable signal 74 and passed to the second power amplifier 70 via a WLAN transmit enable input port 76.

The power of the signals received via the second antenna 20 is increased by a second (WLAN) low noise amplifier 78, the output of which is connected to a WLAN receive output port 80. A received and amplified WLAN signal 82 is passed to the second (WLAN) modality receive port 62 of the second transceiver 14. The receive functionality is activated and deactivated based upon a WLAN receive enable signal 84 generated on a GPIO port 86 and passed to a WLAN receive enable input port 88 that is connected to the second (WLAN)

low noise amplifier 78. Since the second power amplifier 70 is specific to the WLAN communications modality, it is understood that the specific implementations thereof discussed in greater detail below are capable of generating signal power levels as specified by the IEEE 802.11 standards, and operate in linear mode. Along these lines, it is possible for the various contemplated circuitry to tune to an extent typical with other linear power amplifiers.

In contrast to WCDMA, WLAN utilizes a time domain duplex protocol in which the transmission and reception are on the same frequency, but is alternated in separate time intervals. Accordingly, the second antenna 20 is selectively connected to either the transmit chain or the receive chain. For such selective connectivity, there is a single pole, double throw RF switch 90 with a first port 92 connected to an output of the second power amplifier 70, a second port 94 connected to an input of the second low noise amplifier 78, and a third port 96 connected to the second antenna port 24.

Figure 2:
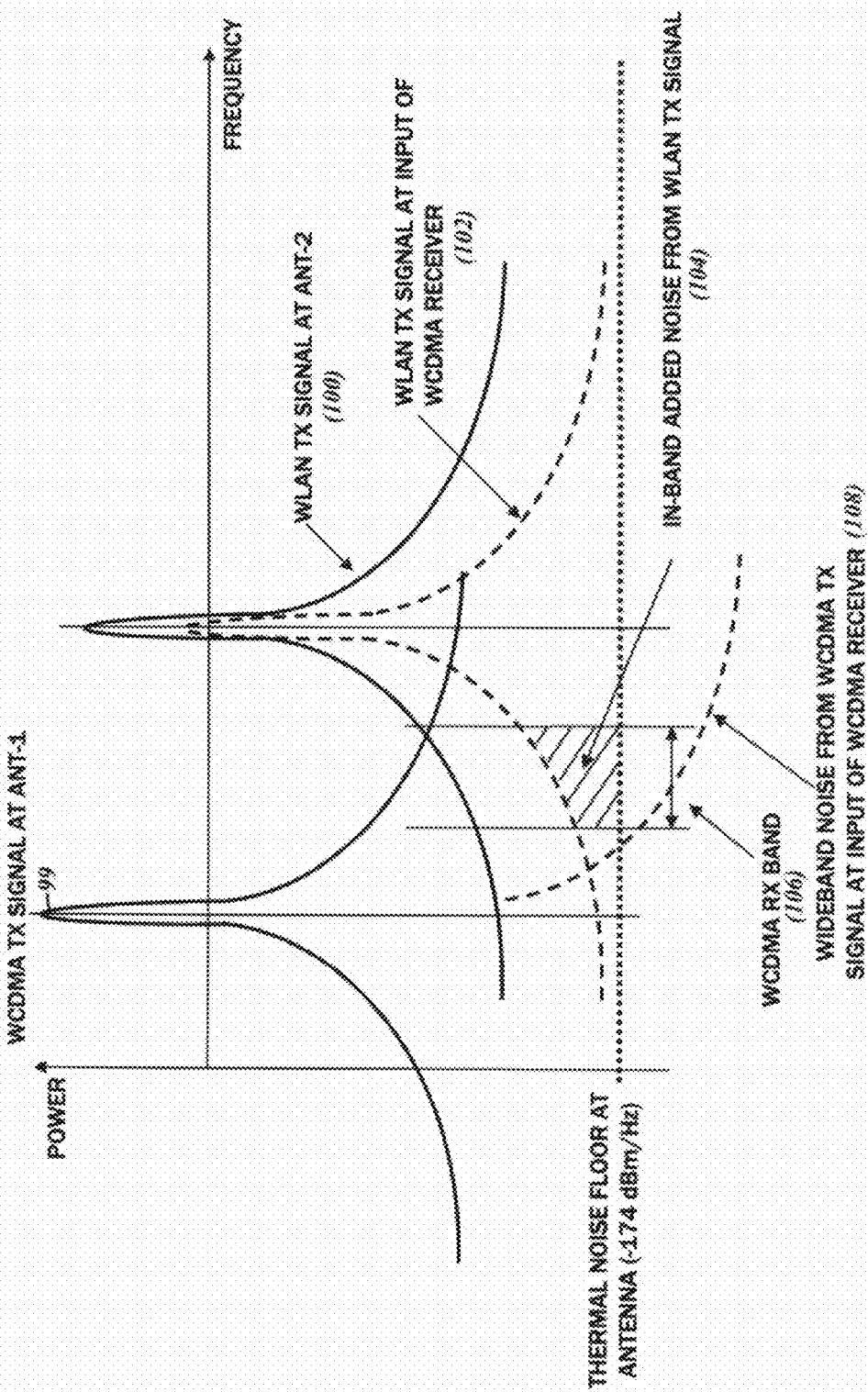
FIG. 2 is a graph showing the spectrum plots of a WCDMA signal and a WLAN signal, with those overlapping segments being highlighted.

The front end circuit 16 further includes a co-existence filter 98 that is envisioned to attenuate certain portions of the WLAN transmit signal 66 that coincide with the WCDMA receive signal 44 in the frequency domain. It is expressly contemplated that with the co-existence filter 98, no additional external filters are necessary. With reference to the graph of FIG. 2, a plot 99 shows an example frequency spectrum of the WCDMA transmit signal 28 at the first antenna 18, and a plot 100 shows an example frequency spectrum of the WLAN transmit signal 66 at the second antenna 20. In typical implementations, the first antenna 18 is isolated from the second antenna 20 by approximately 15 dB to 20 dB. A plot 102 shows the frequency spectrum of such a reduced power WLAN transmit 66 received on the first antenna 18. Notwithstanding this signal level reduction, without additional filtering the WLAN transmit signal 66 is too strong and degrades the receiver sensitivity of the WCDMA chain.

It is understood that WLAN operates between 2.4 GHz and 2.5 GHz, and the higher of the WCDMA reception bands is between 2.11 GHz to 2.17 GHz. Nevertheless, there is a coinciding region 104 along the lower shoulder of the WLAN transmit frequency spectrum within which there may be in-band noise including phase noise, modulation spectrum contribution, and so forth that overlaps with a WCDMA reception band 106. Additionally, a plot 108 illustrates the frequency spectrum of wideband noise from the WCDMA transmit signal 28. However, the duplexer 54 is understood to be able to reduce this noise level by about 6 dB below a thermal noise floor of −174 dBm/Hz. Even with this reduction, the total noise at the WCDMA receive port 46 may be increased by 1 dB, leading to a corresponding reception sensitivity degradation.

In accordance with various embodiments of the present disclosure, for the exemplary dual operational mode communications system 10 including WCDMA and WLAN modalities considered herein, an acceptable degradation of WCDMA reception sensitivity is understood to be no more than 0.5 dB to 1.0 dB with concurrent WLAN operation. To achieve such performance, the additional permissible noise level from the WLAN transmission is approximately −180 dBM/Hz, though this is also dependent upon the noise figure of the first transceiver 12 in the receive mode.

Figure 3:
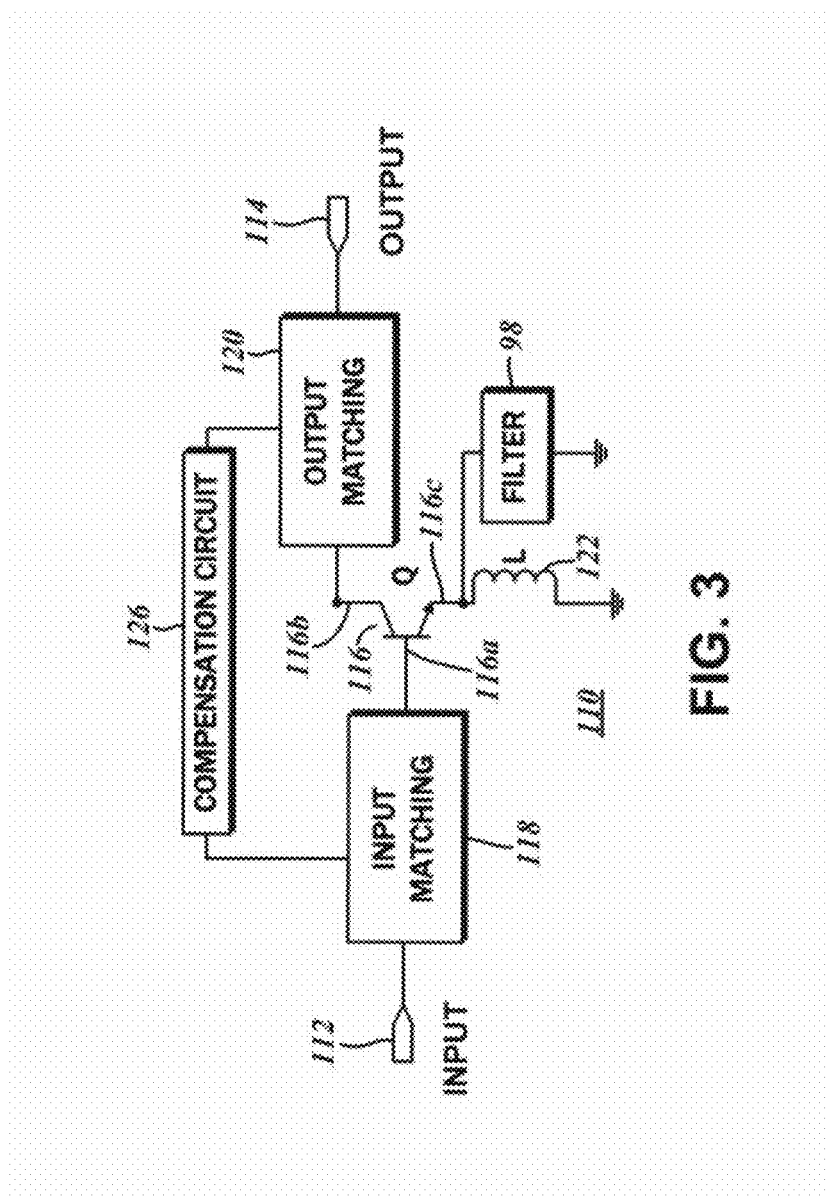
FIG. 3 is a block diagram of a power amplifier architecture in accordance with one embodiment of the present disclosure including a filter and a compensation circuit.

Referring now to the block diagram of FIG. 3, additional details of the front end circuit 16, and in particular a power amplifier architecture 110 thereof, will be considered. The entirety of the power amplifier architecture 110 may also be referred to as a transmit chain, and include the components in the front end circuit 16 that are part of an electrical circuit between the WLAN transmit input port 68 and the second antenna port 24. Accordingly, the power amplifier architecture 110 is specific to the WLAN operating mode, and therefore has an operating frequency band of 2.4 GHz to 2.5 GHz. In some cases, other components such as the second antenna 20 or the second transceiver 14 may also be considered to be a part of the transmit chain. There is an input 112 that generally corresponds to the aforementioned WLAN transmit input port 68, as well as an output 114 that is connectible to the second antenna 20 via the switch 90.

In its most basic form, the power amplifier architecture 110 includes a transistor 116 with a first or base terminal 116a, a second or collector terminal 116b, and a third or emitter terminal 116c. It will be recognized that the transistor 116 is a bipolar type, but alternative embodiments utilizing a field effect type are also possible. In such case, the first terminal 116a is a gate terminal, the second terminal 116b would be a drain terminal, and the third terminal 116c would be the source terminal. The first terminal 116a is connected to an input matching segment 118, which in turn is connected to the input 112. The second terminal 116b is connected to an output matching segment 120, which in turn is connected to the output 114. The input matching segment 118, and output matching segment 120 match the impedance (typically at 50 Ohms) as seen by the second transceiver 14, and the second antenna 20, respectively.

The third terminal 116c is tied to ground, though in a conventional semiconductor die implementation, the bond wire or multiple bond wires to ground exhibits an inductance 122. Although conventional modalities utilize a filter at either of the matching segments 118, 120, various embodiments of the present disclosure contemplate the co-existence filter 98 that is connected to the emitter or third terminal 116c in parallel with the existing bond wire or inductive interconnection that ties the emitter to ground. In various embodiments, the inductive interconnection is a bond wire, but it will be appreciated that any other type of inductive interconnection such as on-die printed inductors may be substituted. When referencing the bond wire feature, unless otherwise noted it is understood to be interchangeable with such alternative implementations. The illustrated example shows a single amplification stage with one transistor, but it is understood that there may be multiple stages, with individual co-existence filters 98 for some or all of the stages. The high Q factor of the inductance 122 and the co-existence filter 98 is understood to precisely reject closely positioned frequency bands and exhibit steep filtering characteristics. Additional details pertaining to the co-existence filter 98 will be considered more fully below.

It will be recognized that the insertion of the co-existence filter 98 at the emitter side of the transistor 116 can result in instability of the amplifier circuit at certain frequencies. To mitigate such instability, various embodiments of the present disclosure contemplate a compensation circuit 126. The details of such compensation circuit 126 will also be discussed below.

The illustrated components of the power amplifier architecture 110 may all be fabricated on a single semiconductor die. Beneficially, this is understood to permit the elimination of an external filter at the antenna side, thereby improving the sensitivity of the WLAN receive chain. Furthermore, an integrated device reduces the overall footprint of the dual operational mode communications system 10 along with its attendant costs. The additional footprint of the added on-die co-existence filter 98 and the compensation circuit 126 is minimal at less than 5% for single stage configurations and less than 10% for multi-stage configurations. As mentioned above, the transistor 116 may be a bipolar type or a field effect type, and can utilize any semiconductor architecture such as Metal Oxide Semiconductor Field Effect (MOSFET), Metal Semiconductor Field Effect (MESFET), hetero-junction bipolar, Silicon-on-Insulator (SOI) and High Electron Mobility (HEMT), and utilize any suitable semiconductor substrate such as Silicon, Gallium Arsenide (GaAs), and so forth. It is to be understood that the present disclosure is not limited to any particular semiconductor fabrication technology.

Figure 4:
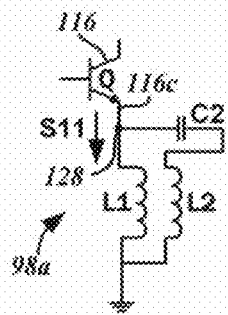
FIG. 4 is a schematic diagram of a first embodiment of the filter.

With reference to the schematic diagram of FIG. 4, a first embodiment of the co-existence filter 98a includes a capacitor C2 connected to a junction 128 that is tied to a third terminal 116c of the transistor 116. Connected in series with the capacitor C2 is an inductor L2 tied to ground. As indicated above, there is an inductance 122 that corresponds to the bond wire that ties the third terminal 116c to ground, and this is shown as inductor L1. Similarly, the inductor L2 is also implemented as a bond wire with a high Q-factor. The bond wires corresponding to the inductors L1 and L2 are positioned in close proximity to each other, and the coupling coefficient between the die pads for the bond wires define a coupling coefficient which has typical values of 0.4 to 0.5.

Figure 5:
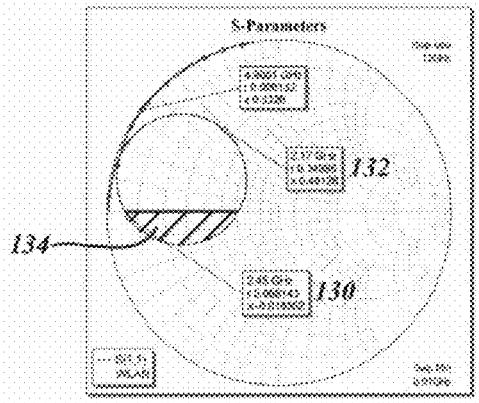
FIG. 5 is a Smith chart illustrating a response of the first embodiment of the filter shown in FIG. 4.

The values for the capacitor C2 and the inductors L2 and L1 are selected such that the impedance at junction 116c looking from emitter side down at the WLAN operating frequency (2.4 GHz to 2.5 GHz), there is a small resistive value. In some embodiments, this resistive impedance is less than 3 to 4 Ohms. Further, at such operating frequency, the reactive impedance is almost zero. The inductor L2 along with capacitor C2 is understood to result in an increased gain as well. The Smith chart of FIG. 5 illustrates the simulated response/scattering parameters (S11) of the first embodiment of the co-existence filter 98a, and at the operating frequency of 2.45 GHz highlighted in a marker 130.

In the WCDMA reception frequency that is to be rejected (2.17 GHz), the co-existence filter 98a has a higher resistive impedance of greater than 15 to 20 Ohm. The reactive component of the impedance is also higher, at greater than 20 to 25 Ohm. Marker 132 highlights the response at 2.17 GHz. As shown, it is possible to achieve a high level of rejection of WLAN transmit noise coinciding with the WCDMA reception frequency.

Figure 6:
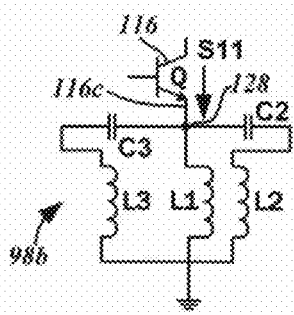
FIG. 6 is a schematic diagram of a second embodiment of the filter.

Referring now to the schematic diagram of FIG. 6, there is depicted a second embodiment of the co-existence filter 98b. This variation likewise includes the capacitor C2 connected to the junction 128 tied to the third terminal 116c, and the inductor L2 connected in series with the capacitor C2 and tied to ground. Additionally, there is a capacitor C3 also connected to the junction 128, and an inductor L3 connected in series with the capacitor C3 and tied to ground. As indicated above, the inductor L1 may implemented as a bond wire that ties the third terminal 116c of the transistor 116 to ground. Along these lines, the inductors L2 and L3 may also be bond wires that are physically positioned in close proximity to each other. The coupling coefficient between the die pads of the inductor L1 and the inductor L2, as well as between those of the inductor L1 and the inductor L3 are understood to be typically 0.4 to 0.5, while the coupling coefficient between die pads of the inductor L2 and the inductor L3 are understood to be typically 0.2 to 0.3.

Figure 7:
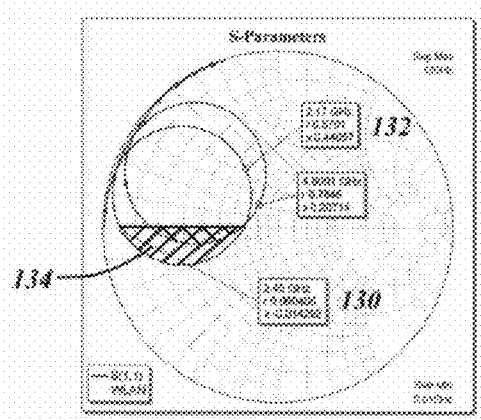
FIG. 7 is a Smith chart illustrating a response of the second embodiment of the filter shown in FIG. 6.

The Smith chart of FIG. 7 shows the S-parameters (S11) of the co-existence filter 98b at the operating frequency of 2.45 GHz and the rejection frequency of 2.17 GHz, with the values of the capacitors C2 and C3, and the inductors L2 and L3 being set to substantially equal those parameters discussed above in relation to the co-existence filter 98a.

Figure 8:
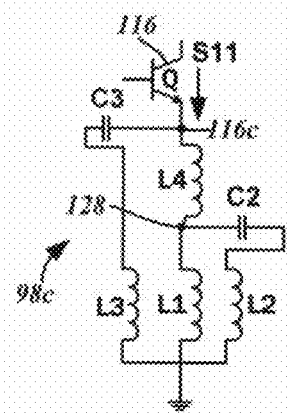
FIG. 8 is a schematic diagram of a third embodiment of the filter.

The schematic diagram of FIG. 8 illustrates yet another, third embodiment of the co-existence filter 98c. In this embodiment, an inductor L4 separates the junction 128 from the third terminal 116c of the transistor 116. However, the capacitor C3 in series with the inductor L3 is directly connected to the third terminal 116c, while the second capacitor C2 in series with the second inductor L2 remains connected to the junction 128. Again, each of the inductors L1, L2, and L3 are implemented as bond wires, and the die pads to which they are attached define various magnetic coupling coefficients that are in line with the parameters discussed above.

Figure 9:
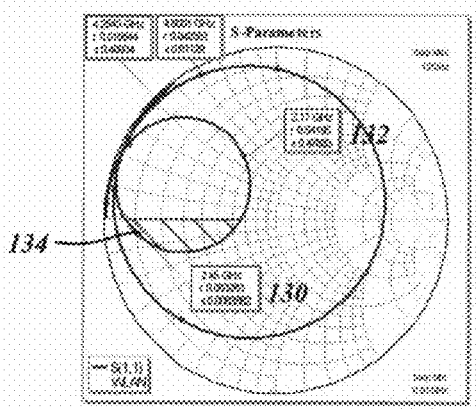
FIG. 9 is a Smith chart illustrating a response of the third embodiment of the filter shown in FIG. 8.

The various components of the co-existence filter 98c can be adjusted to exhibit the aforementioned impedance characteristics at the operating frequency and the rejection frequency band, and the simulated response shown in the Smith chart of FIG. 9 illustrates conformance therewith. The third embodiment of the co-existence filter 98c is understood to extend the flexibility of the overall impedance matching, and improve primary performance parameters such as the input return loss of the power amplifier architecture.

As shown in the Smith charts of FIGS. 5, 7, and 9, each of the disclosed embodiments of the co-existence filter 98a-98c are characterized by a potentially unstable frequency region 134, as attributable to the inclusion of a filter at the emitter of the transistor 116. Referring now to the schematic diagram of FIG. 10, one embodiment of the compensation circuit 126 includes a first port 136 that is connected to the input matching segment 118, and a second port 138 that is connected to the output matching segment 120. In further detail, the compensation circuit 126 is comprised of a parallel resonant circuit 140 including a capacitor C5 and an inductor L5. The parallel resonant circuit 140 is connected in series with a capacitor C6.

With additional reference to the Smith chart of FIG. 11, the values of the inductor L5 and the capacitor C5 are selected to define a resonance frequency approximate the WLAN operating frequency of 2.45 GHz. Furthermore, the parallel resonant circuit 140 is configured to present an inductive component of the impedance at the unstable frequency region 134 to counteract the same. Additionally, the capacitor C6 is understood to be a direct current (DC) block between the bias supply of the output matching segment 120 and the control block, thereby providing the appropriate voltage to the base terminal 116a of the transistor 116. Further tuning of the capacitor C6 is understood to affect the overall performance of the power amplifier architecture 110 as well.

Figure 12:
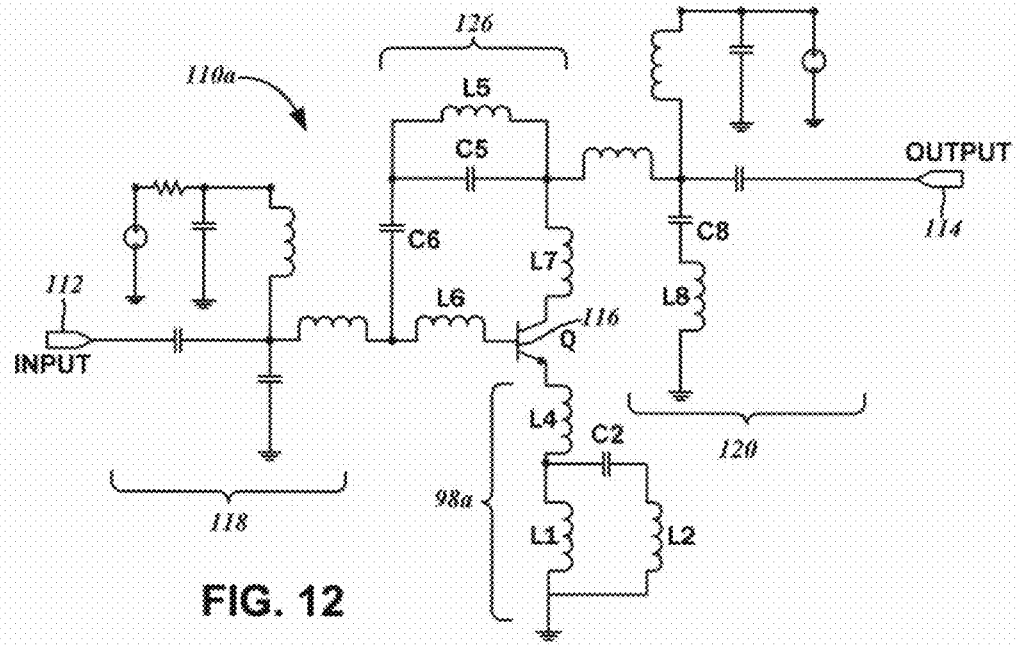
FIG. 12 is a schematic diagram of a first embodiment of the power amplifier architecture incorporating the first embodiment of the filter shown in FIG. 4 and the compensation circuit shown in FIG. 10.

The above-described co-existence filter 98 and compensation circuit 126 may be incorporated into the power amplifier architecture 110 according to various embodiments thereof. Further, and more broadly, such power amplifier architectures 110 may be incorporated into the dual operational mode communications system 10. The schematic diagram of FIG. 12 illustrates a first exemplary embodiment of the power amplifier architecture 110a, which can be generally segregated into the input matching segment 118, the amplifier/transistor 116, the compensation circuit 126, the output matching segment 120, and the co-existence filter 98. In the example, the co-existence filter 98 is the first embodiment 98a thereof. The input 112 is connected to the input matching segment 118, and the output 114 is connected to the output matching segment 120. The component values for the inductors L4, L6, and L7 may be kept low, e.g., less than 0.1 to 0.2 nH to simplify tuning. Furthermore, with regard to the output matching segment 120, the capacitor C8 and inductor L8 thereof may be configured for series resonance at second harmonic frequencies of the operating frequency.

The operation of the first embodiment of the power amplifier architecture 110a is a combination of the functions of the various components as discussed above, and will not be repeated. Within the context of the overall power amplifier architecture 110a and its various active and passive components, additional tuning possibilities will be considered. In particular, the value of the capacitors C6 may be adjusted for a wider frequency rejection range outside the aforementioned 2.11 GHz to 2.17 GHz WCDMA receive band. Other sensitive frequency bands, including 800 MHz, 1000 MHz, 1.7 GHz, and 2.0 GHz as utilized by various cellular communications modalities such as GSM, GPRS, EDGE, 3G WCDMA, HSPA, LTE, CDMA-2000, etc., GPS frequency bands (1.575 GHz), and other video and audio broadcasting systems that may be handled by the communications system 10 may also be filtered. The increased rejection of unwanted signals is contemplated to permit reduced antenna-to-antenna distance and hence smaller devices, as well as increased coupling between the communications modalities while retaining high reception sensitivity for the WCDMA chain.

Figure 13:
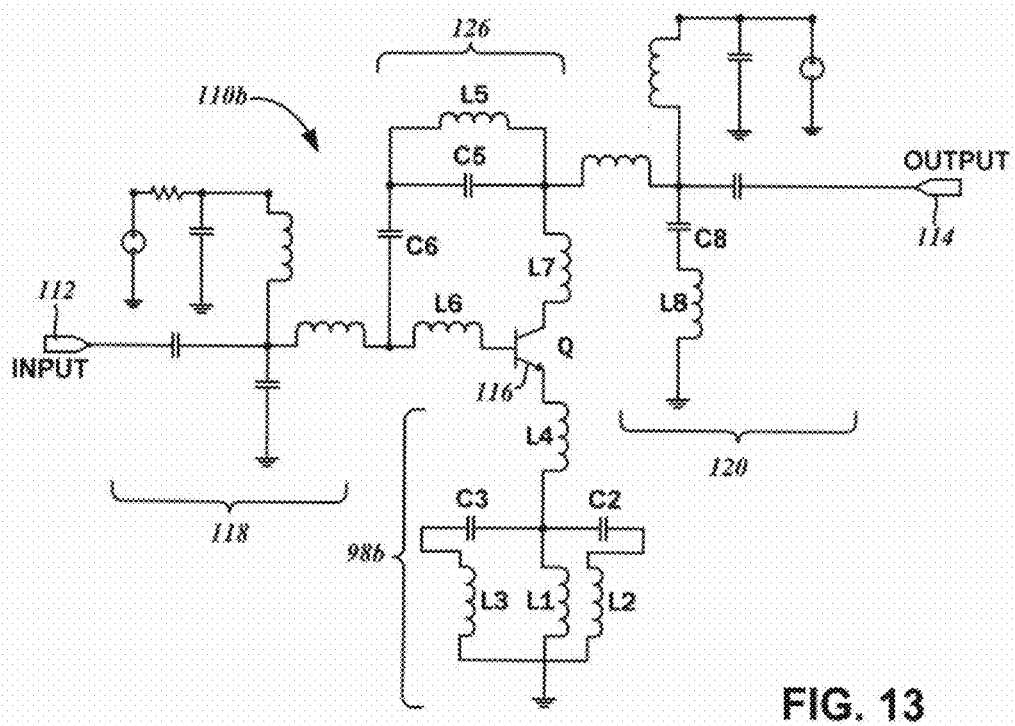
FIG. 13 is a schematic diagram of a second embodiment of the power amplifier architecture incorporating the second embodiment of the filter shown in FIG. 6.

A second embodiment of the power amplifier architecture 110b is shown in FIG. 13. This likewise includes the input matching segment 118, the output matching segment 120, and the same compensation circuit 126. However, the second embodiment of the co-existence filter 98b is substituted. The employment of the second embodiment of the co-existence filter 98b is understood to reject a larger portion of the signal/noise at the 2.11 GHz to 2.17 GHz frequency (WCDMA) band, but is otherwise identical in operation to the first embodiment 110a.

Figure 14:
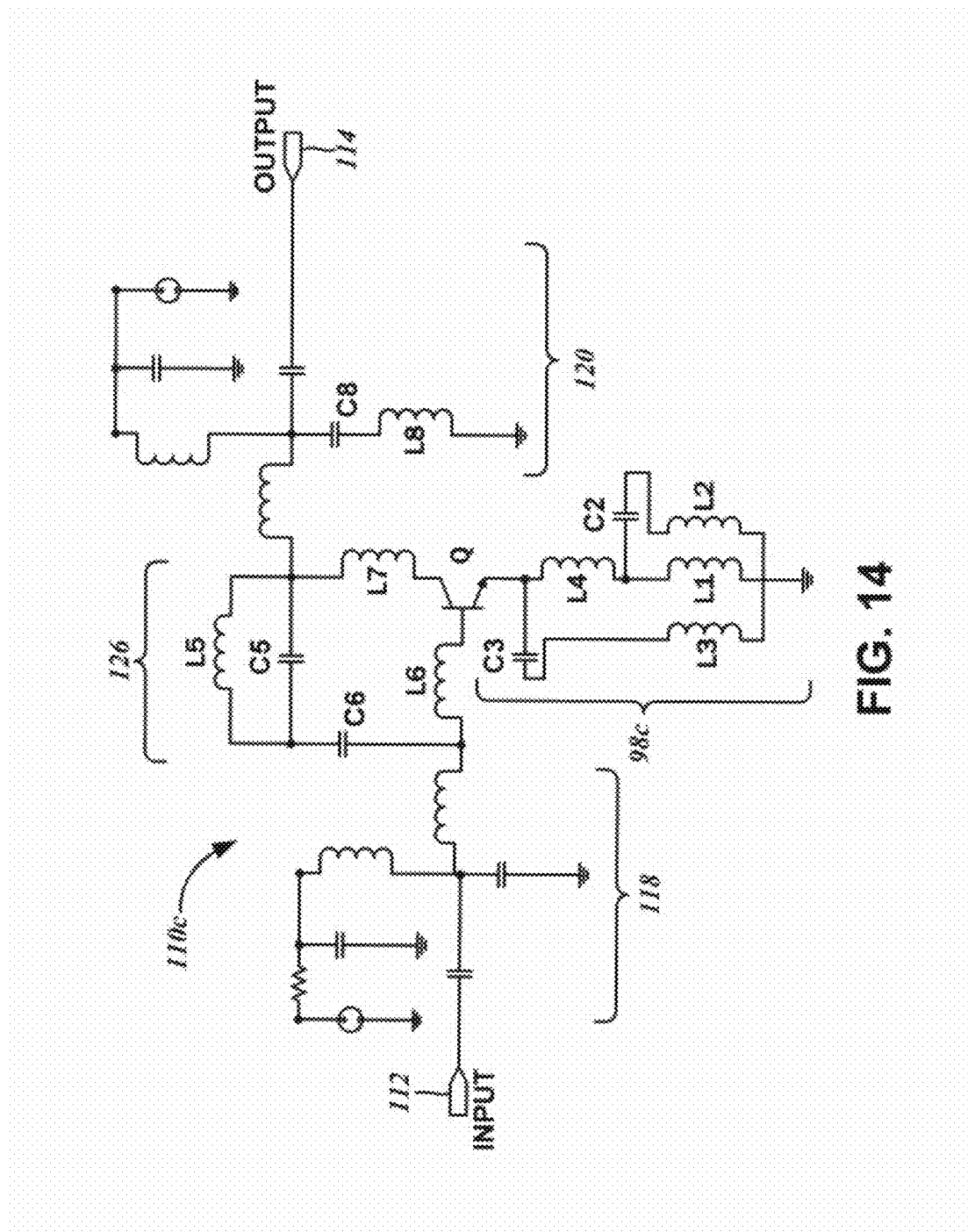
FIG. 14 is a schematic diagram of a third embodiment of the power amplifier architecture incorporating the third embodiment of the filter shown in FIG. 8.

The schematic diagram of FIG. 14 is a third embodiment of the power amplifier architecture 110c. Again, the input matching segment 118 is connected to the input 112 and the base terminal 116a of the transistor 116, and an output matching segment 120 is connected to the output 114 and the collector terminal 116b of the transistor 116. Connected to the emitter terminal 116c is the third embodiment of the co-existence filter 98c. Between the input matching segment 118 and the output matching segment 120, the compensation circuit 126 is connected. The third embodiment of the power amplifier architecture 110c is understood to mitigate any potential impedance mismatch issues at the input matching segment 118.

As briefly noted above, it is possible for the power amplifier architecture 110 to be comprised of multiple amplification stages that are cascaded. This is understood to improve rejection at the desired rejection frequency bands. When the third embodiment of the power amplifier architecture 110c is utilized as the final stage, voltage standing wave ratio (VSWR) mismatches are better tolerated, leading to reduce voltage swings across the terminals of the transistor 116. With an anticipated lower voltage swing, in turn, the transistor 116 can be low voltage types with attendant cost reductions.

Figure 15:
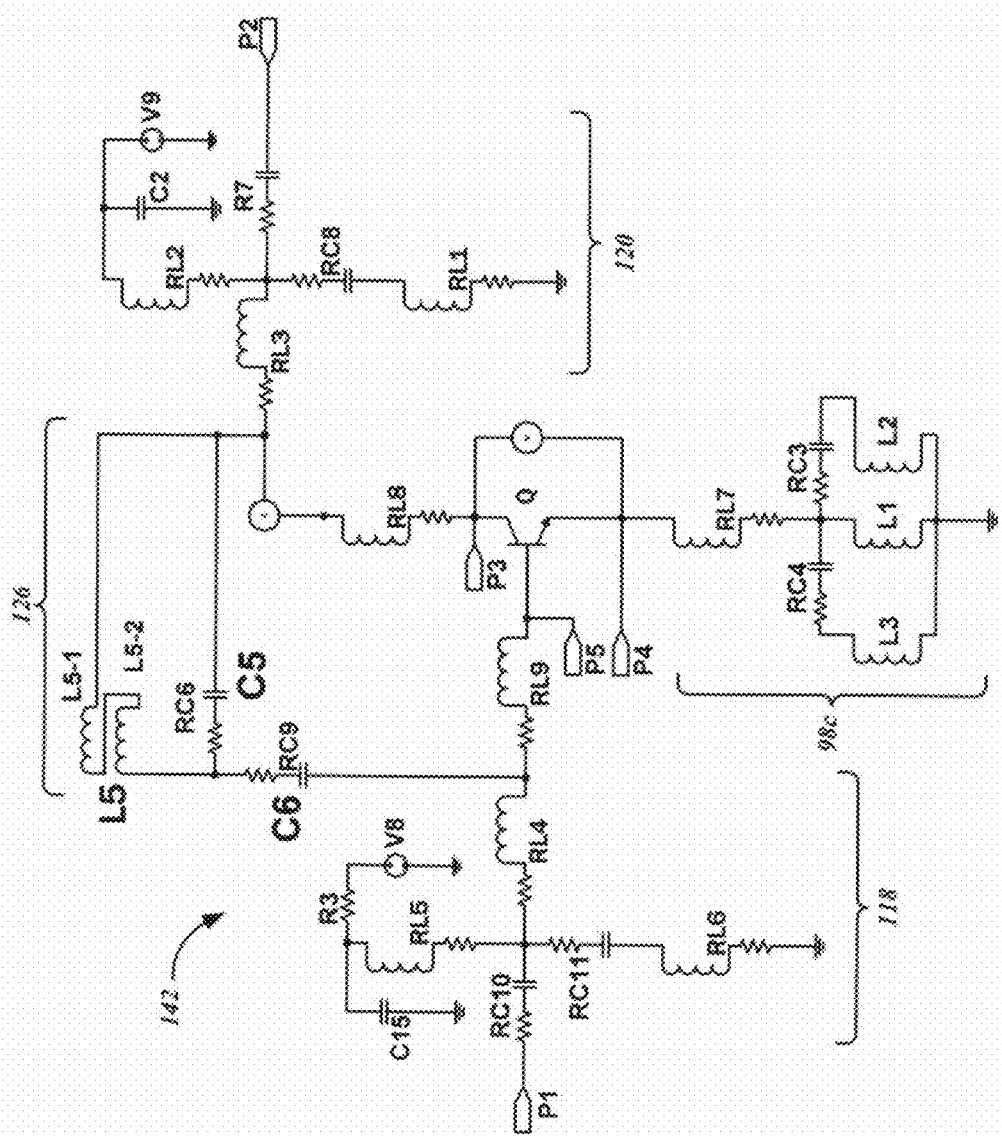
FIG. 15 is a schematic diagram of an example power amplifier architecture equivalent to that shown in FIG. 13, but further including component losses for simulation purposes.

The performance of the second embodiment of the power amplifier architecture 110b has been simulated with an exemplary circuit 142 shown in the schematic diagram of FIG. 15. In addition to the components noted above, the exemplary circuit includes additional resistors that represent typical resistive losses associated with the various inductors and capacitors. Various simulated measurements are recorded at ports P1-P5 based upon time domain current and voltage waveforms applied to the circuit simulation. The following table shows the component values included in the exemplary circuit 142 as shown in FIG. 15, presented by way of example only and not of limitation.

TABLE 1

Power Amplifier Architecture (Second Embodiment) Component Values

| | |
|---|---|
| Co-existence Filter 98 | |
| L-1 | 0.57 nH/0.144 Ω |
| L-2 | 0.57 nH/0.144 Ω |
| L-3 | 0.57 nH/0.144 Ω |
| RC3 | 8.9 pF/0.2 Ω |
| RC4 | 2.1 pF/0.5 Ω |
| RL7 | 0.15 nH/0.15 Ω |
| Compensation Circuit 126 | |
| RC6 (C5) | 5 pF/0.2 Ω |
| L'-1 | 0.25 nH/0.5 Ω |
| L'-2 | 0.25 nH/0.5 Ω |
| RC9 (C6) | 13 pF/0.2 Ω |
| Input Matching Segment 118 | |
| RC10 | 11 pF/0.2 Ω |
| RC11 | 0.7 pF/0.2 Ω |
| RL6 | 0.57 nH/0.15 Ω |
| RL5 | 0.8 nH/0.8 Ω |
| C15 | 100 pF |
| R3 | 12 Ω |
| V8 | 0.77 V |
| RL4 | 0.5 nH/0.5 Ω |
| RL9 | 0.1 nH/0.1 Ω |
| Output Matching Segment 120 | |
| RL8 | 0.1 nH/0.1 Ω |
| RL3 | 0.3 nH/0.3 Ω |
| RL2 | 1.5 nH/1.5 Ω |
| C2 | 100 pF |
| V9 | 3.3 V |
| RC8 | 1.85 pF/0.2 Ω |
| RL1 | 0.57 nH/0.15 Ω |
| RC7 | 2.7 pF/0.2 Ω |

Figure 16A:
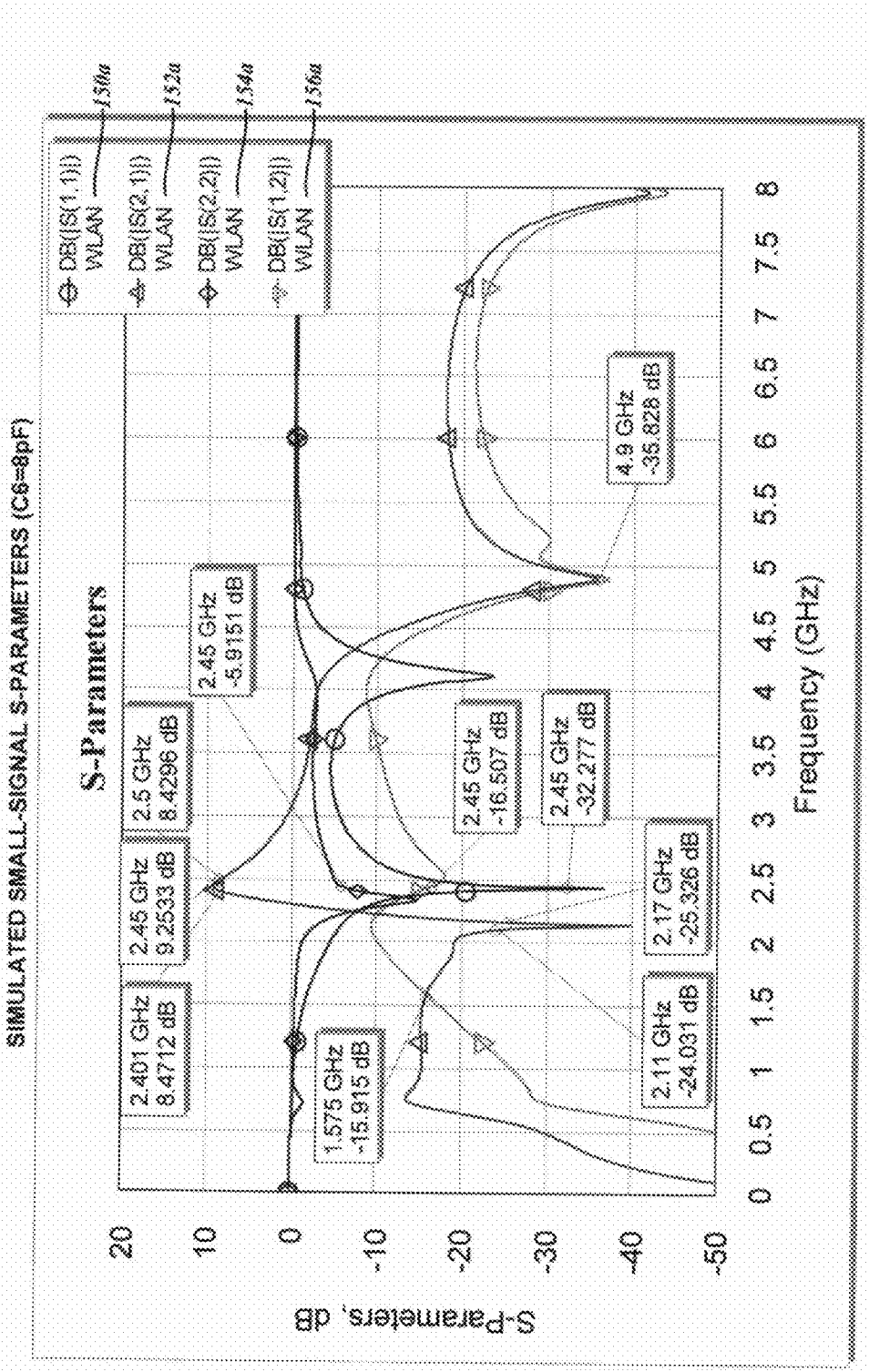
FIGS. 16A-16D are various graphs illustrating the scattering parameters of the example power amplifier architecture depicted in FIG. 15 with different values of a compensation circuit capacitor C6.
Figure 16B:
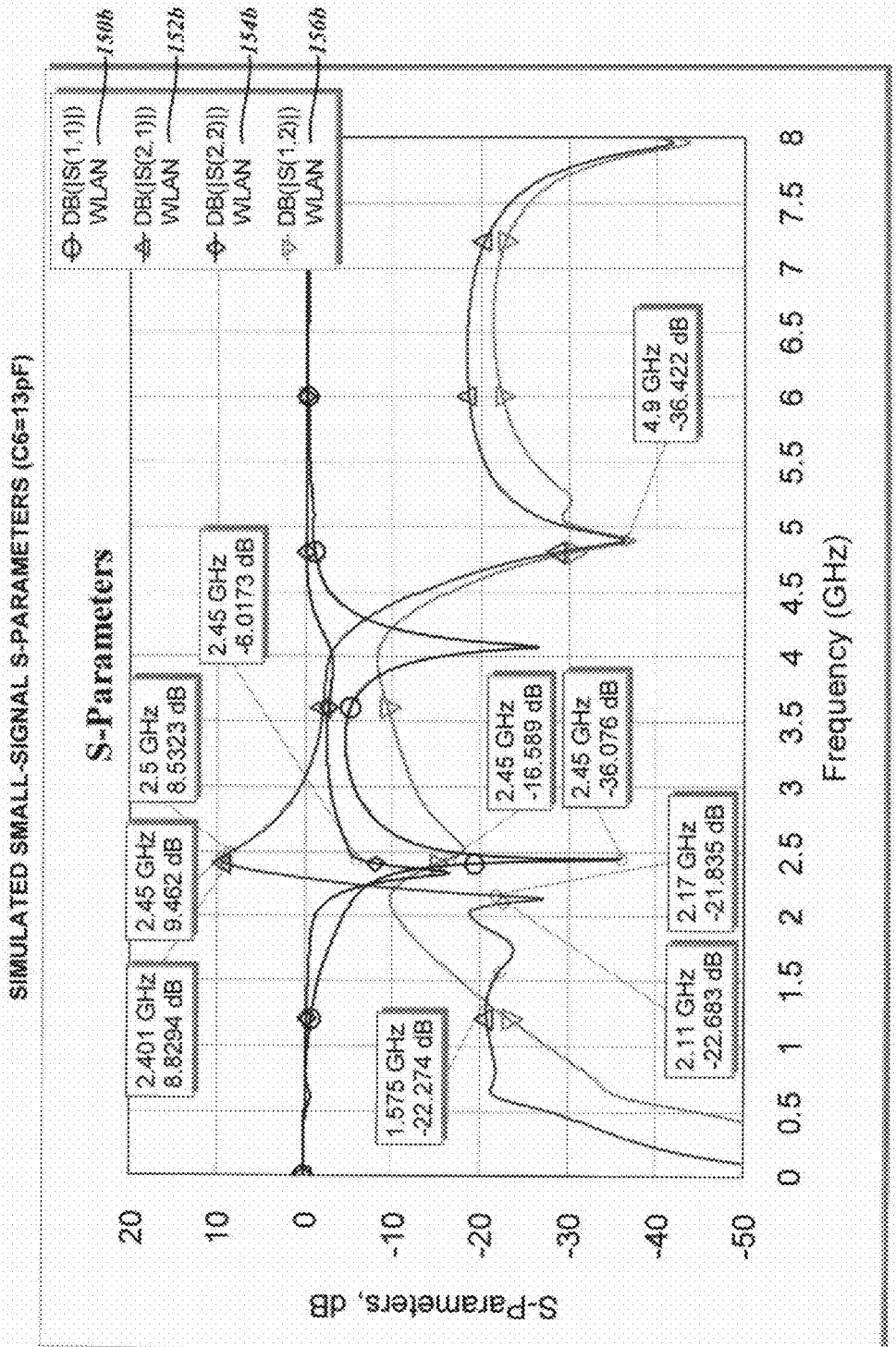
Figure 16C:
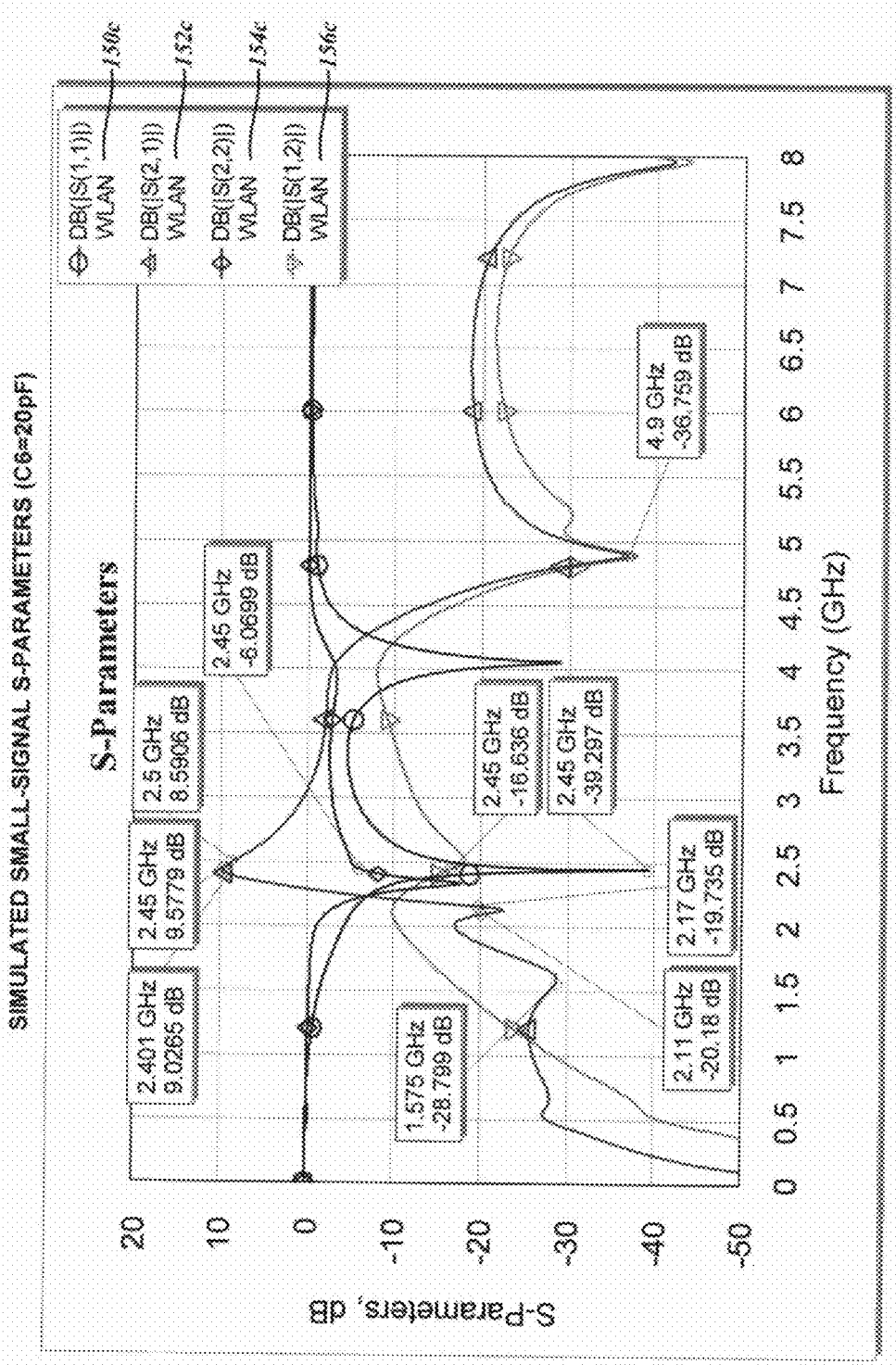
Figure 16D:
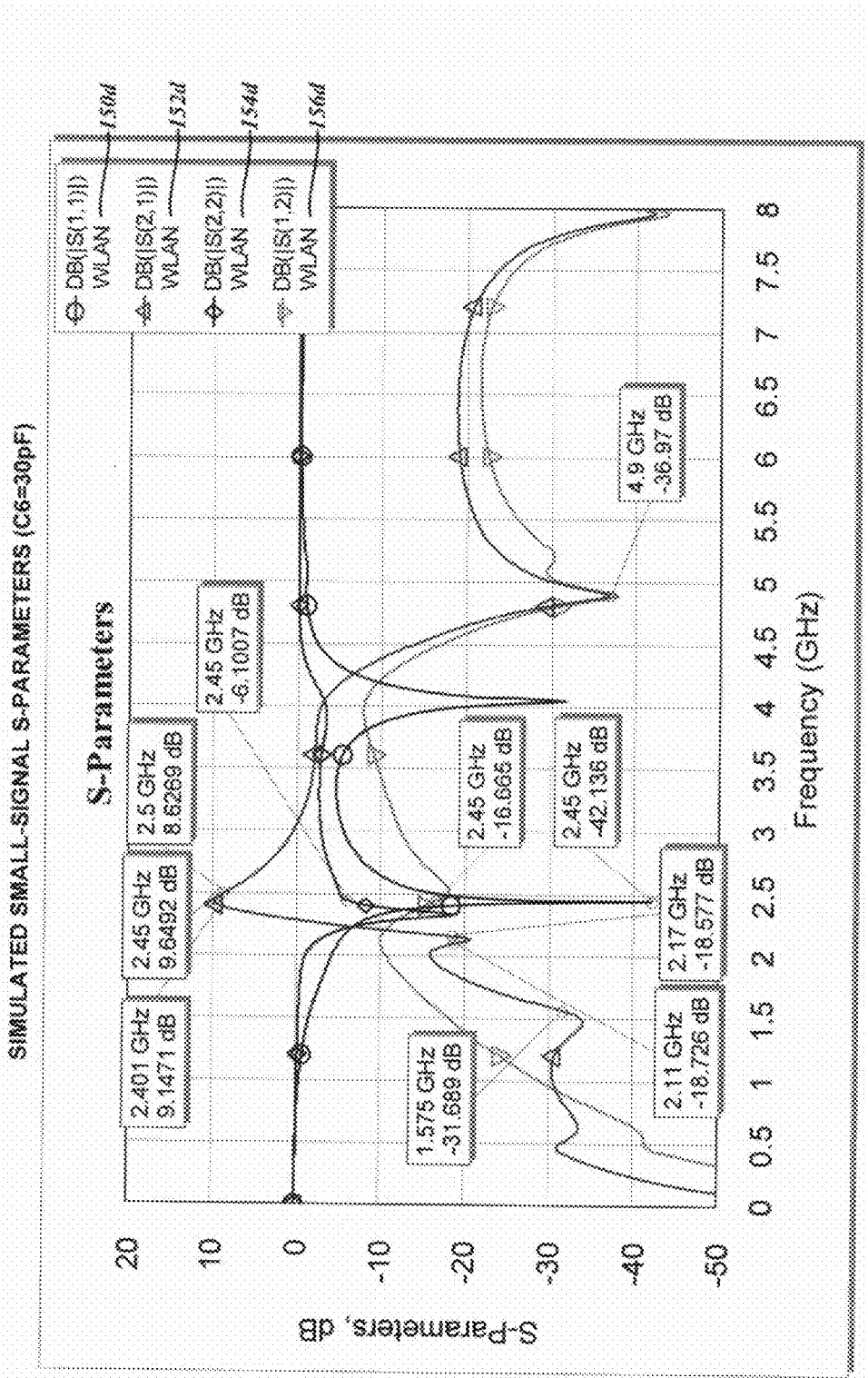

The graphs of FIGS. 16A-16D each show plots of S-parameters of the exemplary circuit 142 corresponding to the second embodiment of the power amplifier architecture 110b. In each separate graph, there is a first plot 150 for the port 1 (input) reflection coefficient S11, a second plot 152 for the forward voltage gain S21, a third plot 154 for the port 2 (output) reflection coefficient S22, and a fourth plot 156 for the reverse voltage gain S12. The graph of FIG. 16A in particular illustrates a simulation with the value of the capacitor C6 being 8 pF. As shown therein, rejection of noise at the WCDMA receive band frequencies of 2.11 GHz to 2.17 GHz is readily achieved. Another simulation with the capacitor C6 set to 13 pF is depicted in FIG. 16B, and proves that frequencies below 2 GHz can be rejected with such additional tuning. Additional simulations are plotted for a value of C6 set to 20 pF and 30 pF in FIGS. 16C and 16D, respectively.

Figure 17A:
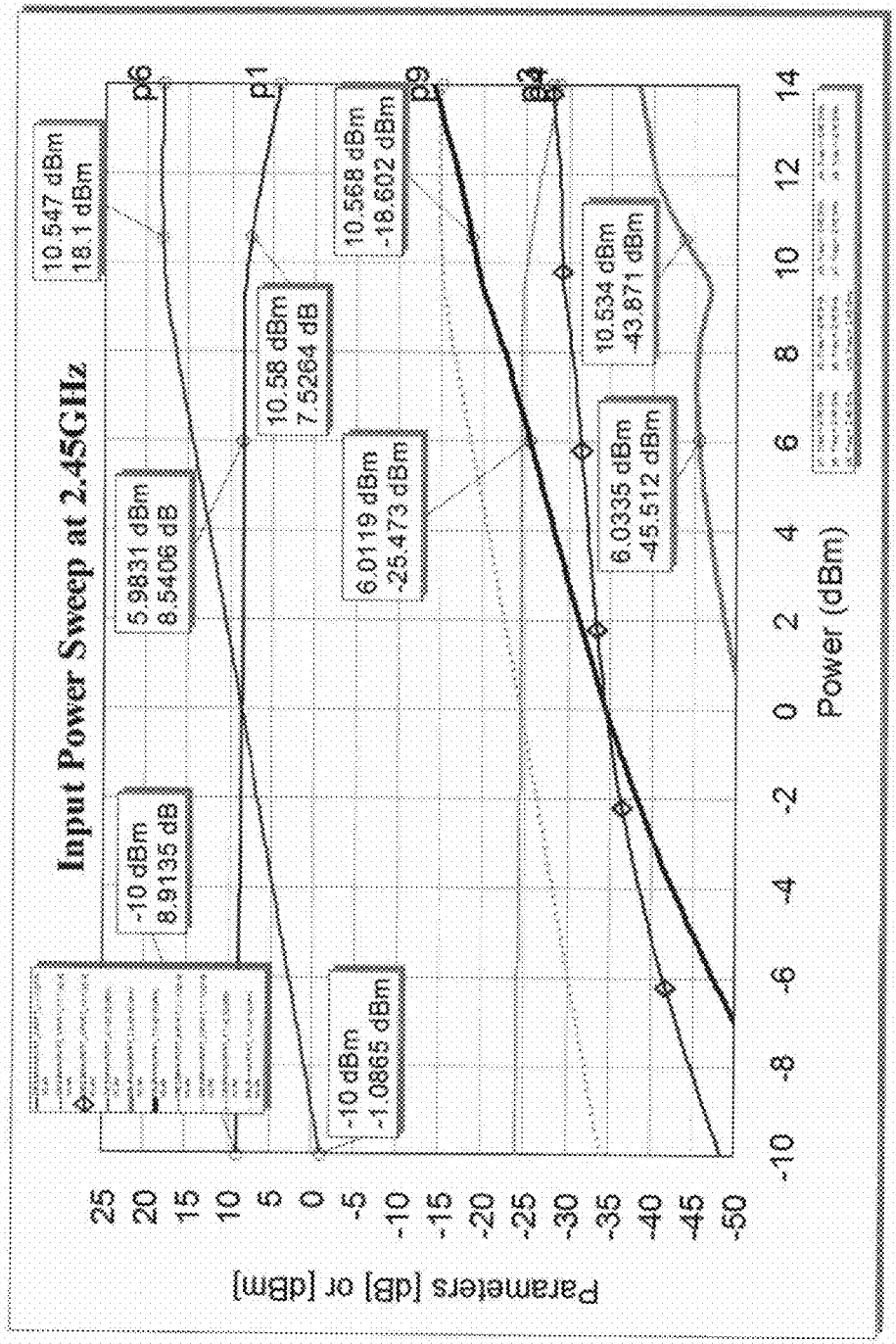
FIGS. 17A-17D are graphs showing different performance measurements in response to input power sweeps.
Figure 17B:
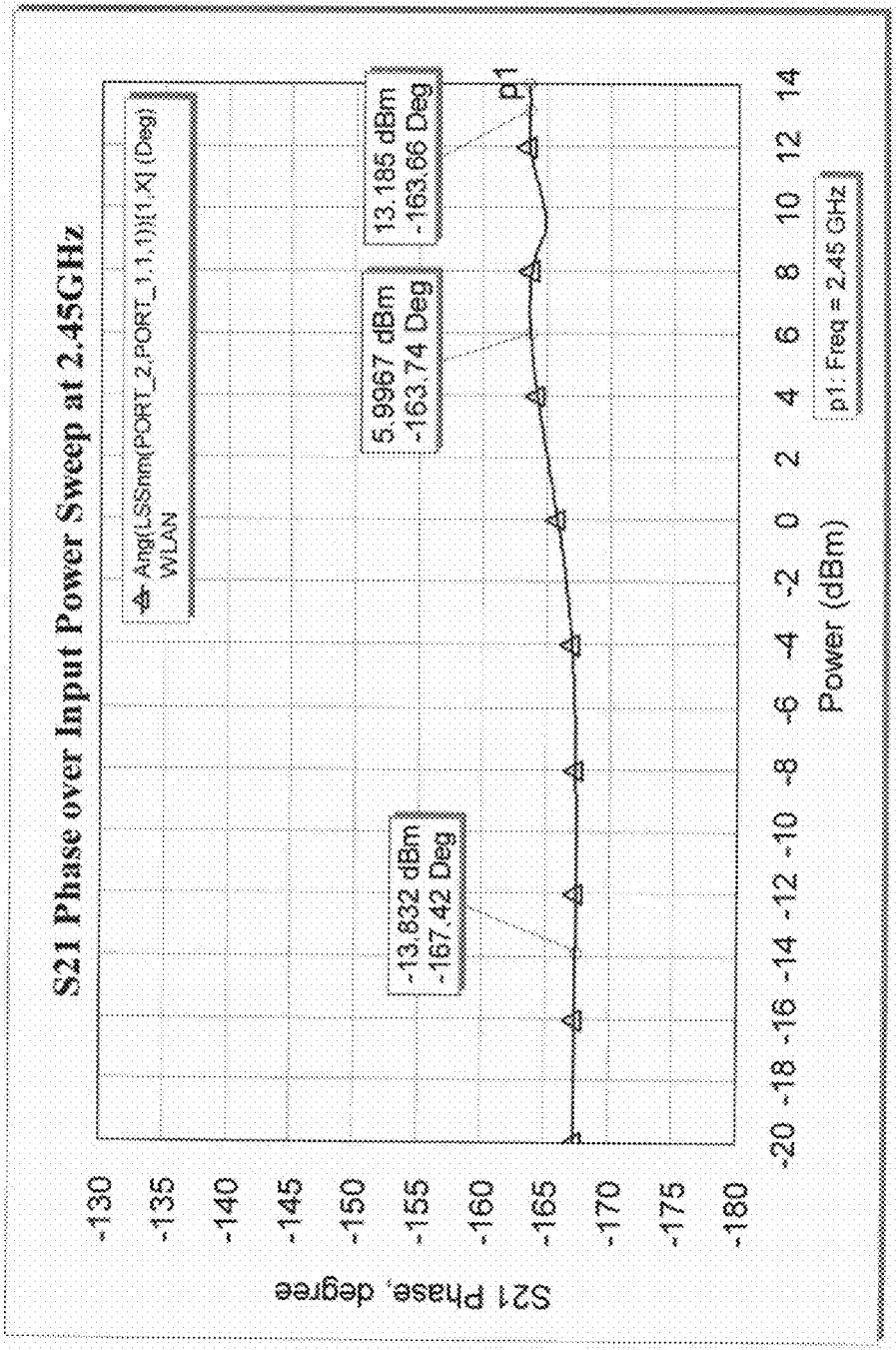
Figure 17C:
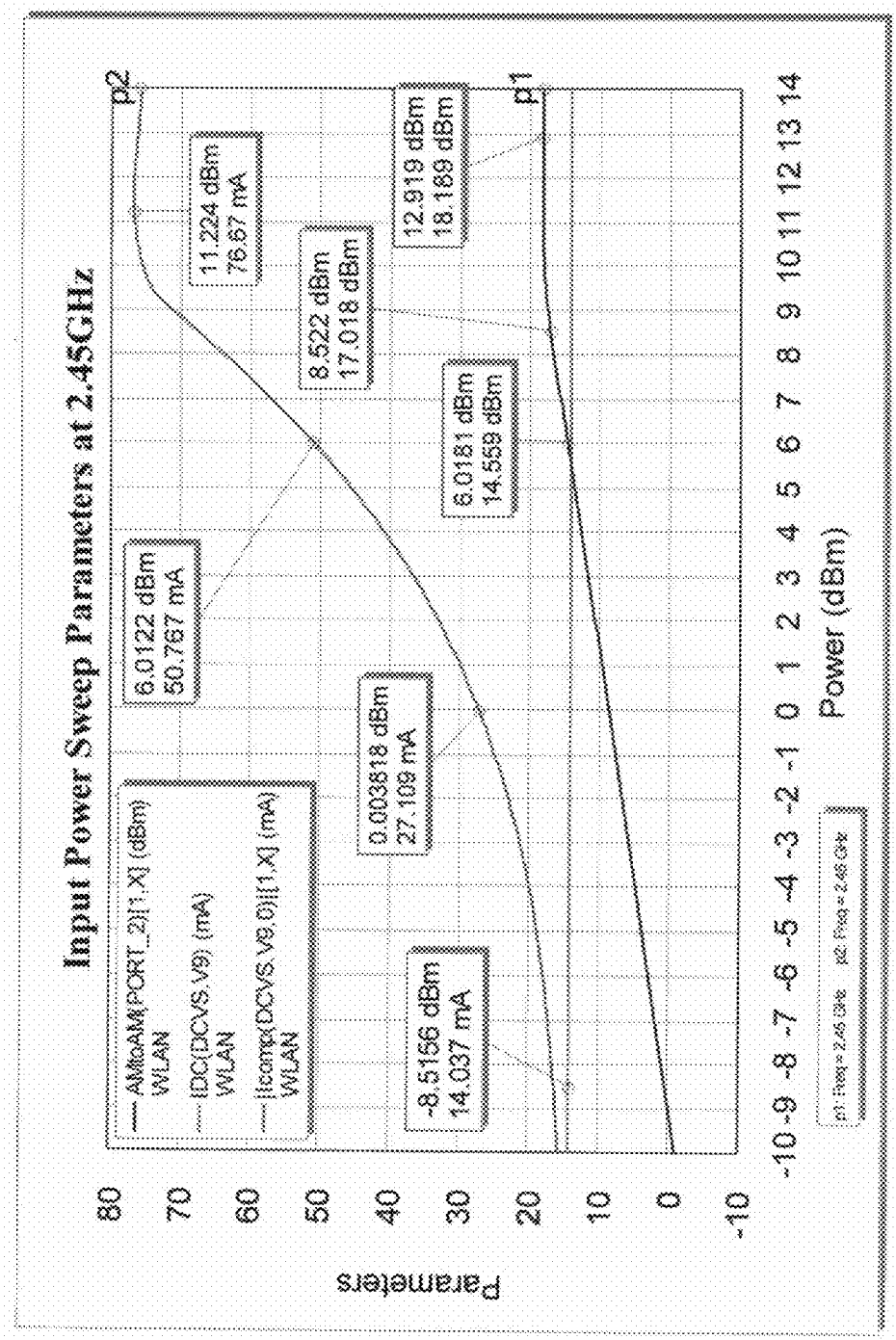
Figure 17D:
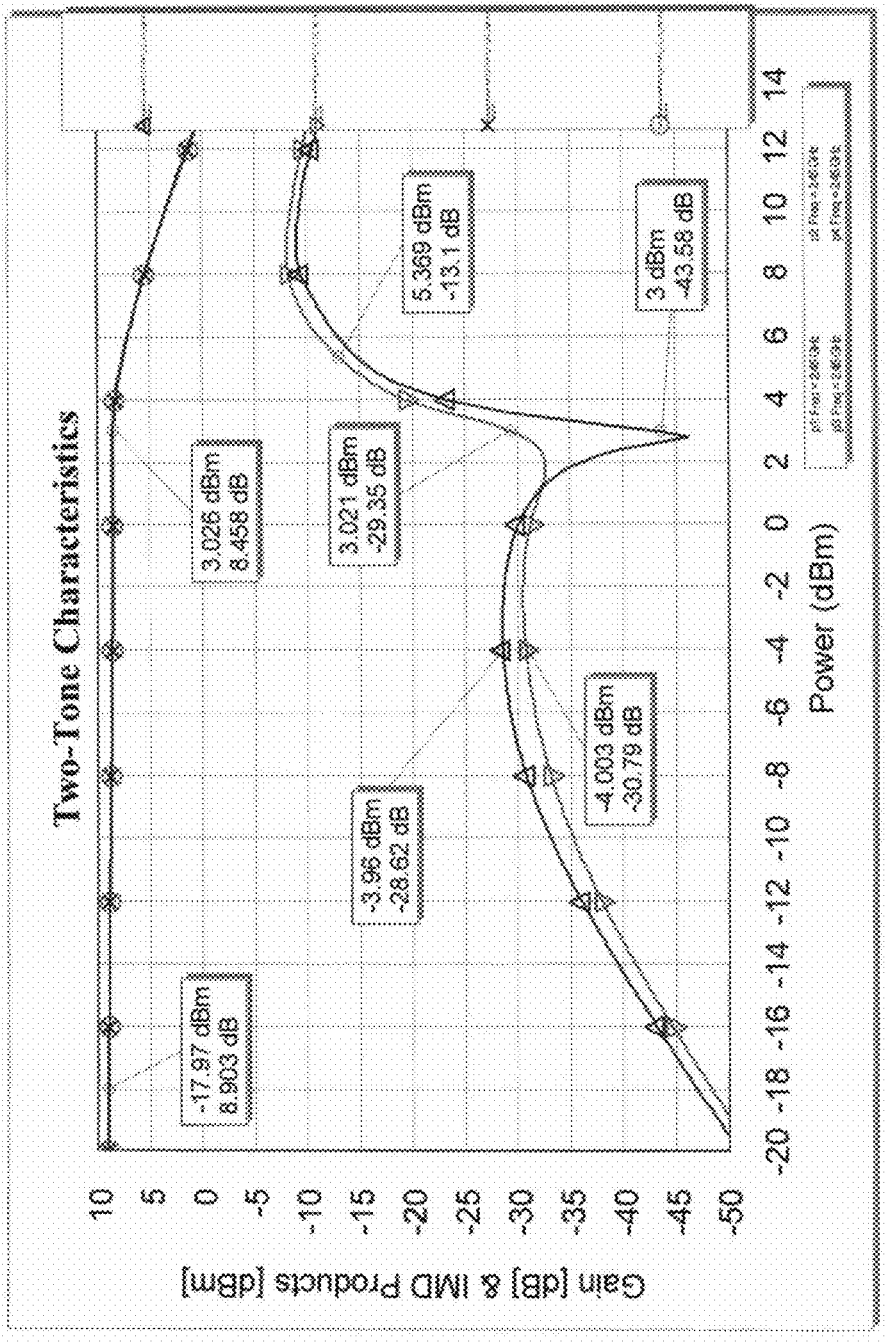

The graphs of FIGS. 17A-17D show the performance characteristics of the exemplary circuit 142 in response to a continuous wave power sweep at the WLAN operating frequency of 2.45 GHz. Additionally, for these simulations, the value of the capacitor C6 of the compensation circuit 126 has been set to 13 pF. According to the graph of FIG. 17A, the output power 1 dB gain compression (P1 dB) is approximately 18 dBm, thereby resulting in approximately 12 to 13 dBm linear power for WLAN transmissions with an error vector magnitude of around 3%. As shown in the graph of FIG. 17B, the phase of the forward voltage gain S21 over various input power levels deviates less than 5 degrees, and thus the power amplifier architecture 110 is understood to operate linearly. As briefly noted above, one of the contemplated advantages of the present power amplifier architecture is the reduced power consumption of the WLAN chain. The graph of FIG. 17C shows the DC current drawn at various input power levels. In particular, the current draw at the maximum power level of 14 dBm is below 50 mA. Furthermore, the graph of FIG. 17D, which illustrates a two-tone input power sweet at 2.45 GHz and a 6 MHz offset therefrom, with the previously configured value of the capacitor C6 of 13 pF. Third-order intermodulation distortion, which specifies the linearity of the exemplary circuit 142, is below −38 dBc at output power levels below 14 dBm.

Figure 18:
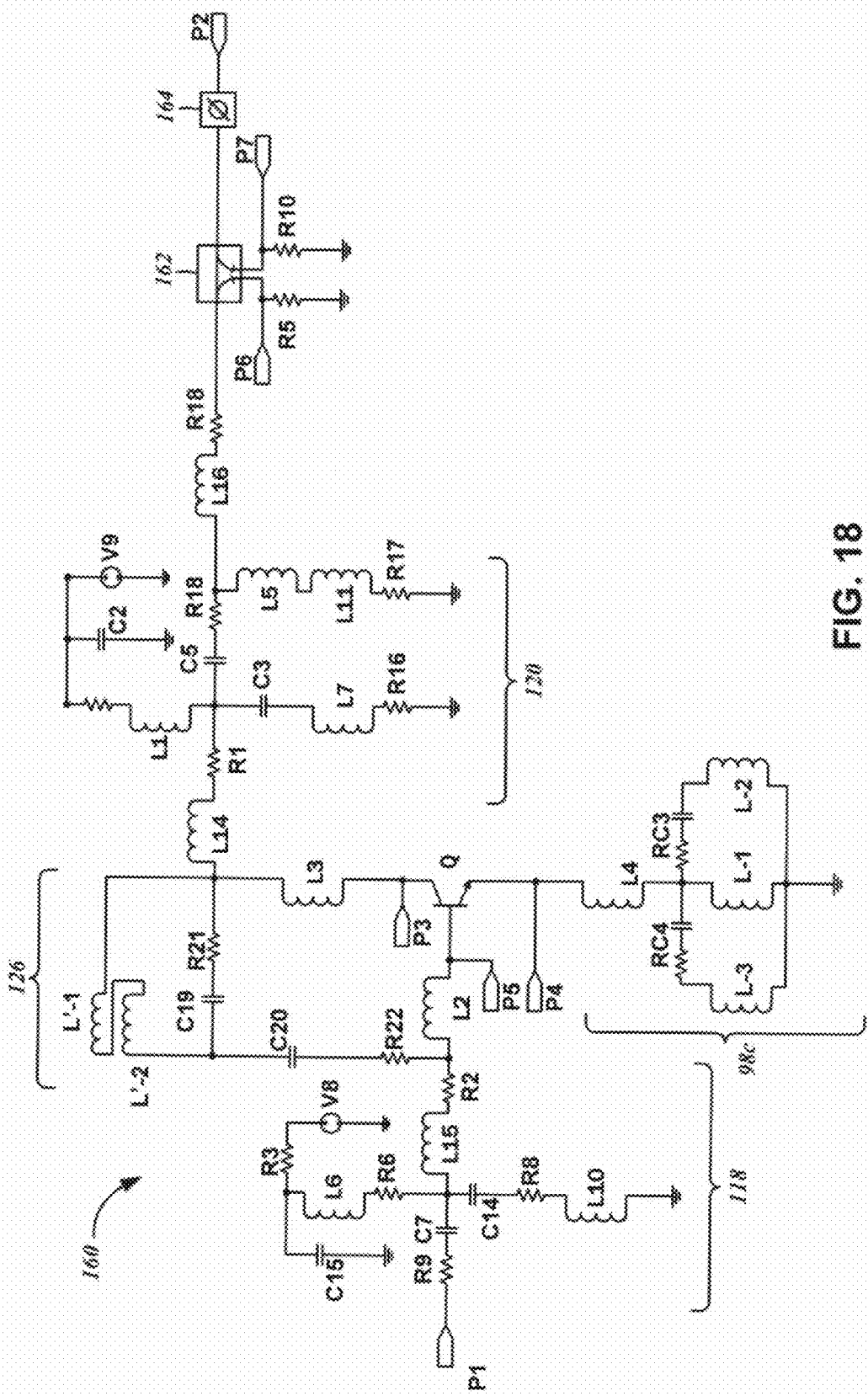
FIG. 18 is a schematic diagram of another exemplary power amplifier architecture for the simulation of high power, high VSWR mismatch operating conditions.

The foregoing example in FIG. 18 illustrates the small-signal performance of the power amplifier architecture 110. Higher power applications with increased load VSWR are also contemplated. A second exemplary circuit 160 is simulated, with the values of the components therein provided in Table 2:

TABLE 2

Power Amplifier Architecture Component Values for High VSWR Simulation

| Co-existence Filter 98 | |
|---|---|
| L-1 | 0.57 nH/0.144 Ω |
| L-2 | 0.57 nH/0.144 Ω |
| L-3 | 0.57 nH/0.144 Ω |
| RC3 | 9.05 pF/0.2 Ω |
| RC4 | 2.1 pF/0.2 Ω |
| L4 | 0.15 nH |
| Compensation Circuit 126 | |
| R21 | 0.2 Ω |
| C19 | 5 pF |
| C20 | 10 pF |
| R22 | 0.2 Ω |
| L-1 | 0.25 nH/0.5 Ω |
| L-2 | 0.25 nH/0.5 Ω |
| Input Matching Segment 118 | |
| R9 | 0.2 Ω |
| C7 | 8 pF |
| C14 | 0.7 pF |
| R8 | 0.35 Ω |
| L10 | 0.57 nH |
| R6 | 1.2 Ω |
| L6 | 0.8 nH |
| C15 | 100 pF |
| R3 | 12 Ω |
| V8 | 0.78 V |
| L15 | 0.5 nH |
| R2 | 1 Ω |
| L2 | 0.1 nH |
| Output Matching Segment 120 | |
| L3 | 0.1 nH |
| L14 | 0.3 nH |
| R1 | 0.3 Ω |
| C2 | 100 pF |
| R13 | 2.7 Ω |
| V9 | 3.3 V |
| C3 | 1.85 pF |
| L7 | 0.57 nH |
| R16 | 0.35 Ω |
| C5 | 2.7 pF |
| R18 | 0.2 Ω |
| L5 | 1.5 nH |
| L11 | 0.57 nH |
| R17 | 2.1 Ω |
| L16 | 0.75 nH |
| R11 | 0.15 Ω |

Figure 19:
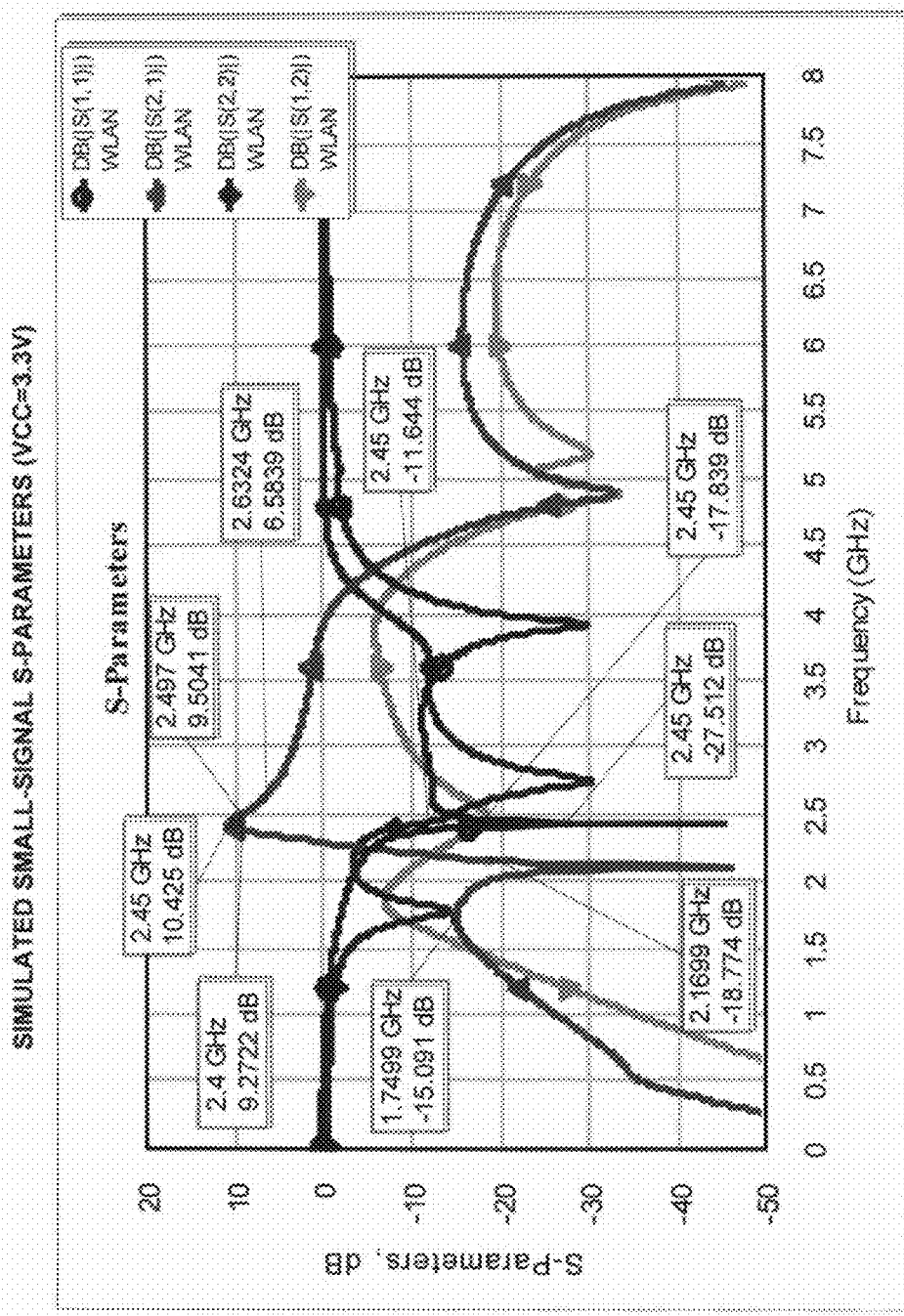
FIG. 19 is a graph showing the small signal scattering parameters of the power amplifier architecture depicted in FIG. 18.
Figure 20A:
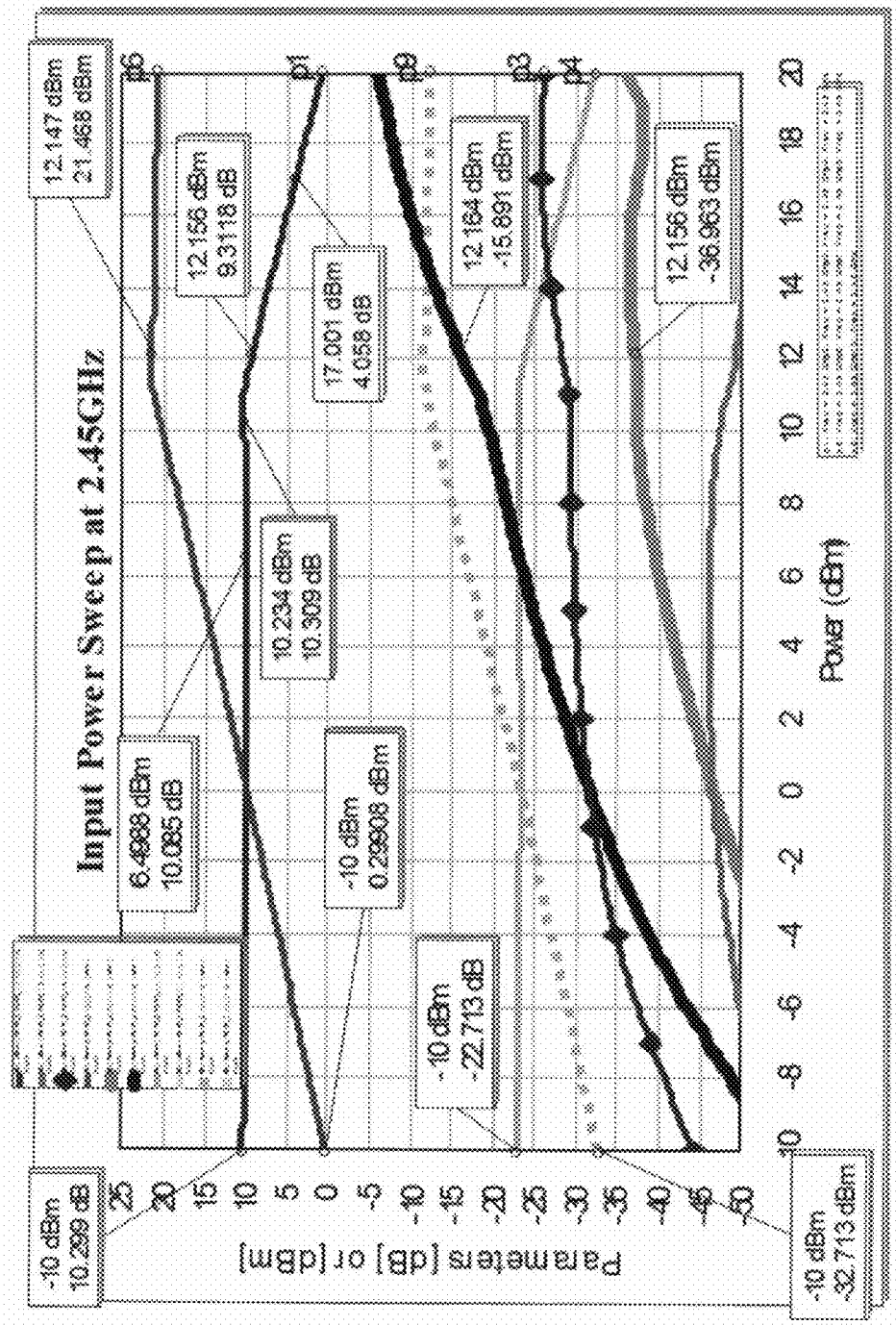
FIG. 20A-20C are graphs illustrating the performance of the power amplifier architecture in response to an input power sweep.
Figure 20B:
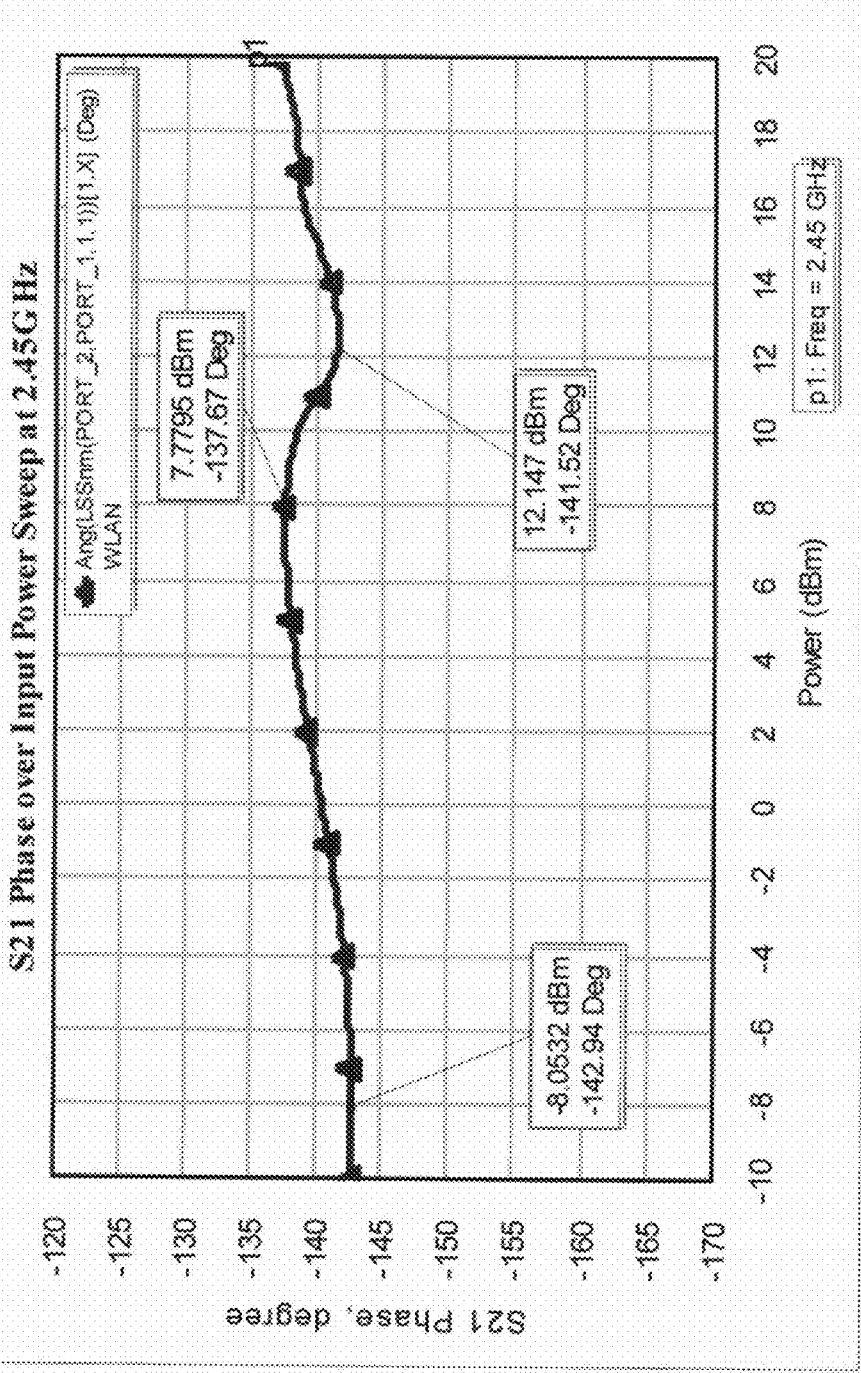
Figure 20C:
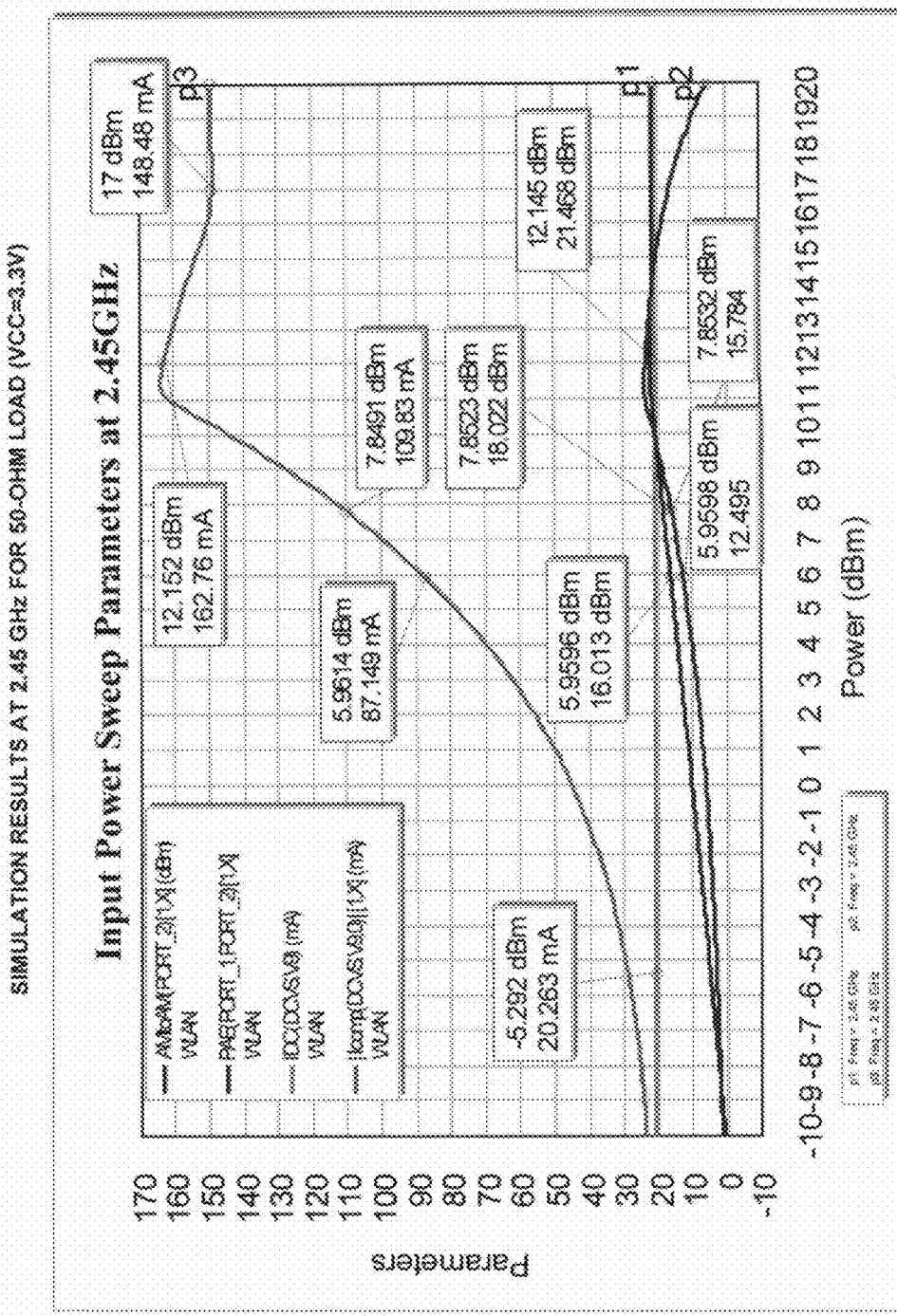
Figure 21:
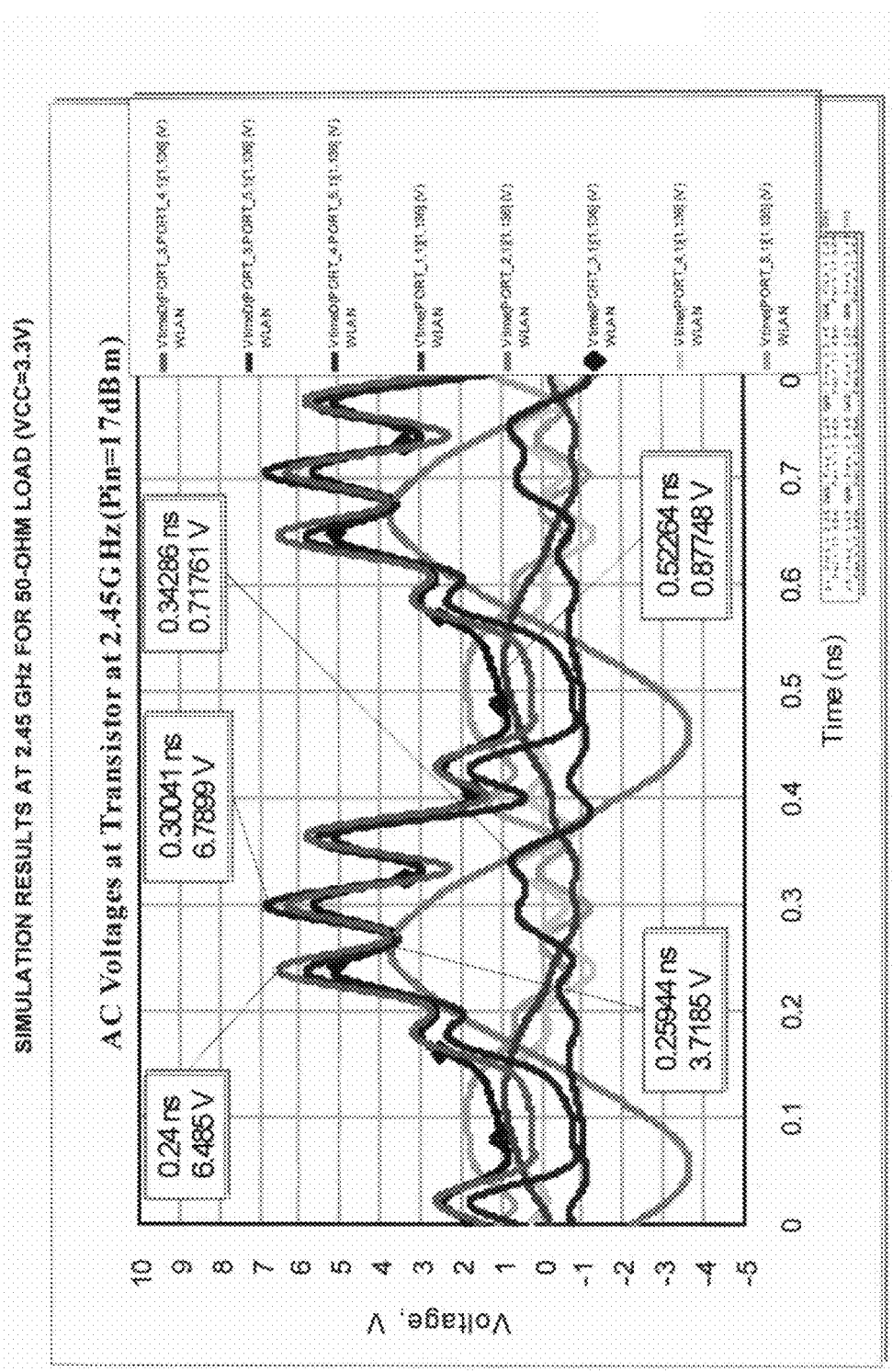
FIG. 21 is a graph showing AC voltages at the transistor.

To simulate power directed towards a VSWR mismatched antenna, an ideal coupler 162 is connected. For a 10:1 VSWR, the test load resistance is fixed at 5 Ohms, and an ideal phase shifter 164 is used to rotate phase. As shown in the graph of FIG. 19, the small signal S-parameters from the simulation of the second exemplary circuit 160 resemble that of the previously discussed first exemplary circuit 142. The rejection of noise at the 2.11 GHz to 2.17 GHz range corresponding to the WCDMA receive band is anticipated to be above 27 dB. Referring to the graph of FIG. 20A, the 1 dB gain compression (P1 dB) is approximately 21.5 dBm. Furthermore, according to the graph of FIG. 20B, the phase of the forward voltage gain S21 over various input power levels again deviates less than 5 degrees. The graph of FIG. 20C presents appropriate DC current consumption characteristics over input power sweep. The graph of FIG. 20A shows that the maximum input linear power corresponding to 1 dB gain compression is approximately 17 dBm, which is understood to be typical for mobile communications modalities. With the input power at 17 dBm, the graph of FIG. 21 depicts the AC voltages at the transistor 116 for a 2.45 GHz signal. Relatedly, these simulations each involve input power sweeps at the 2.45 GHz operating frequency. It is contemplated that the DC current consumption at 16 dBm linear power corresponding to an error vector magnitude (EVM) of approximately 3.0% is approximately 87 mA, which is comparable to conventional amplifiers.

Figure 22A:
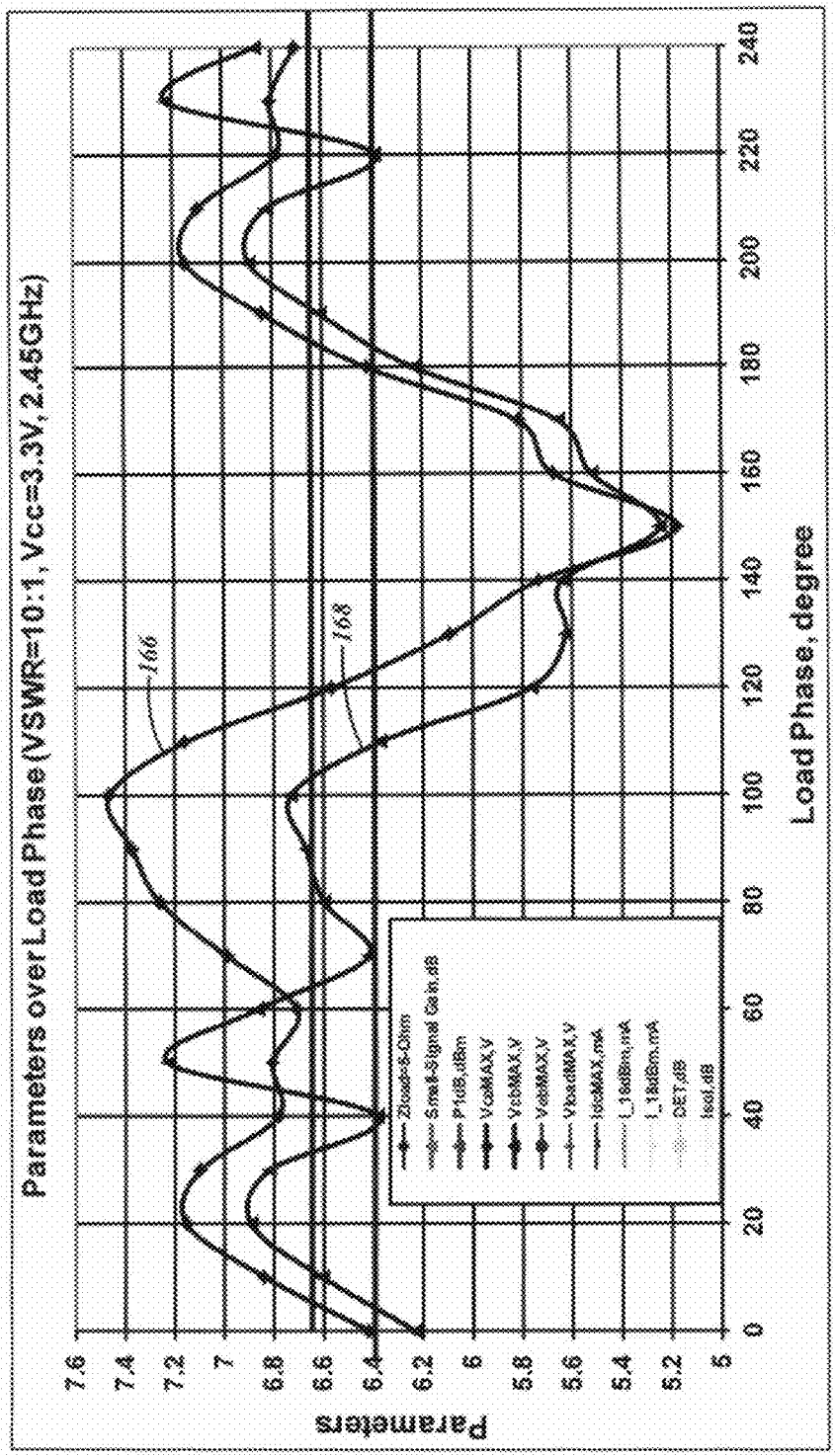
FIGS. 22A-22D are graphs showing various performance measurements of the power amplifier architecture in relation to load phase where the VSWR is 10:1.
Figure 22B:
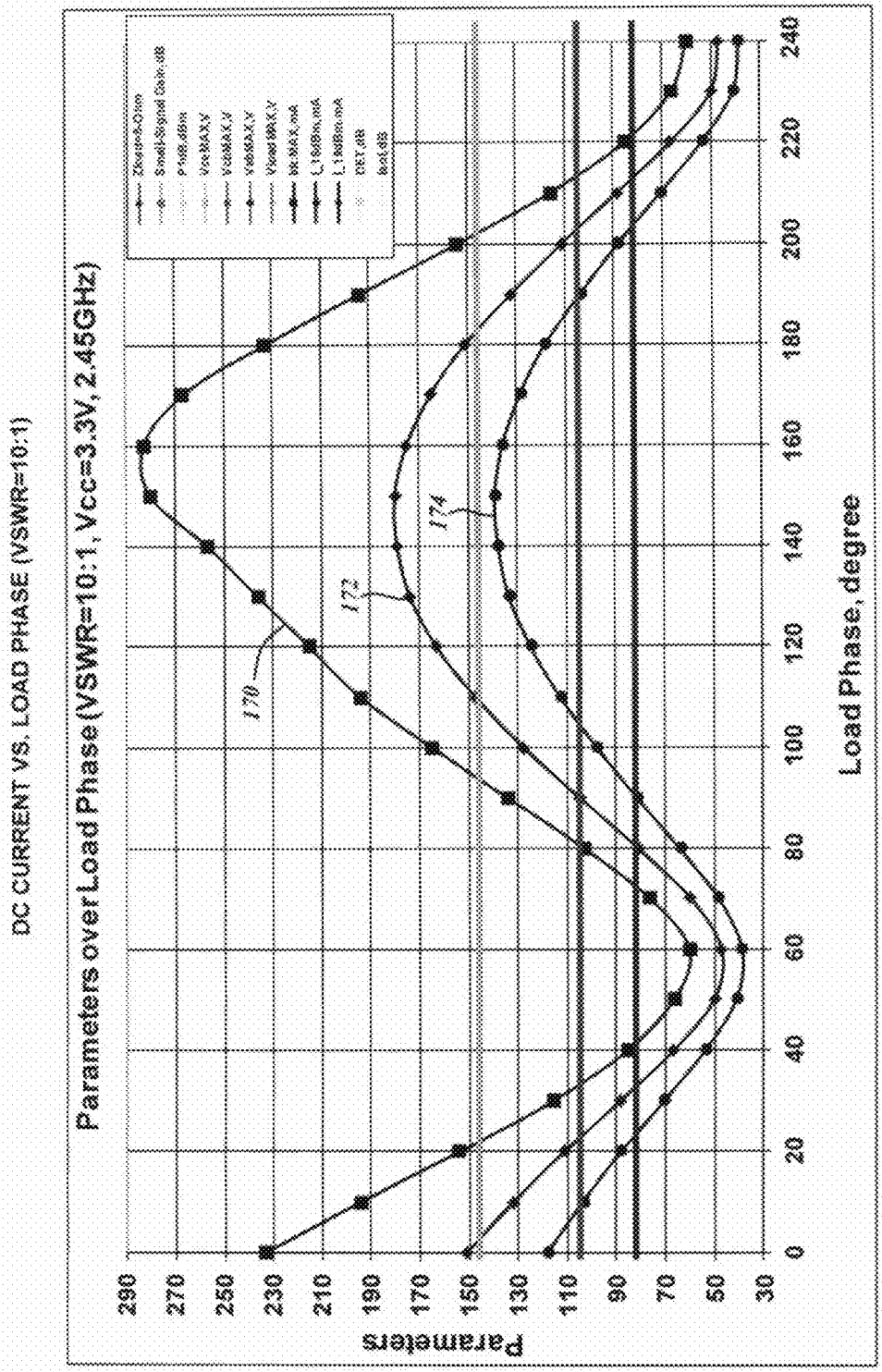
Figure 22C:
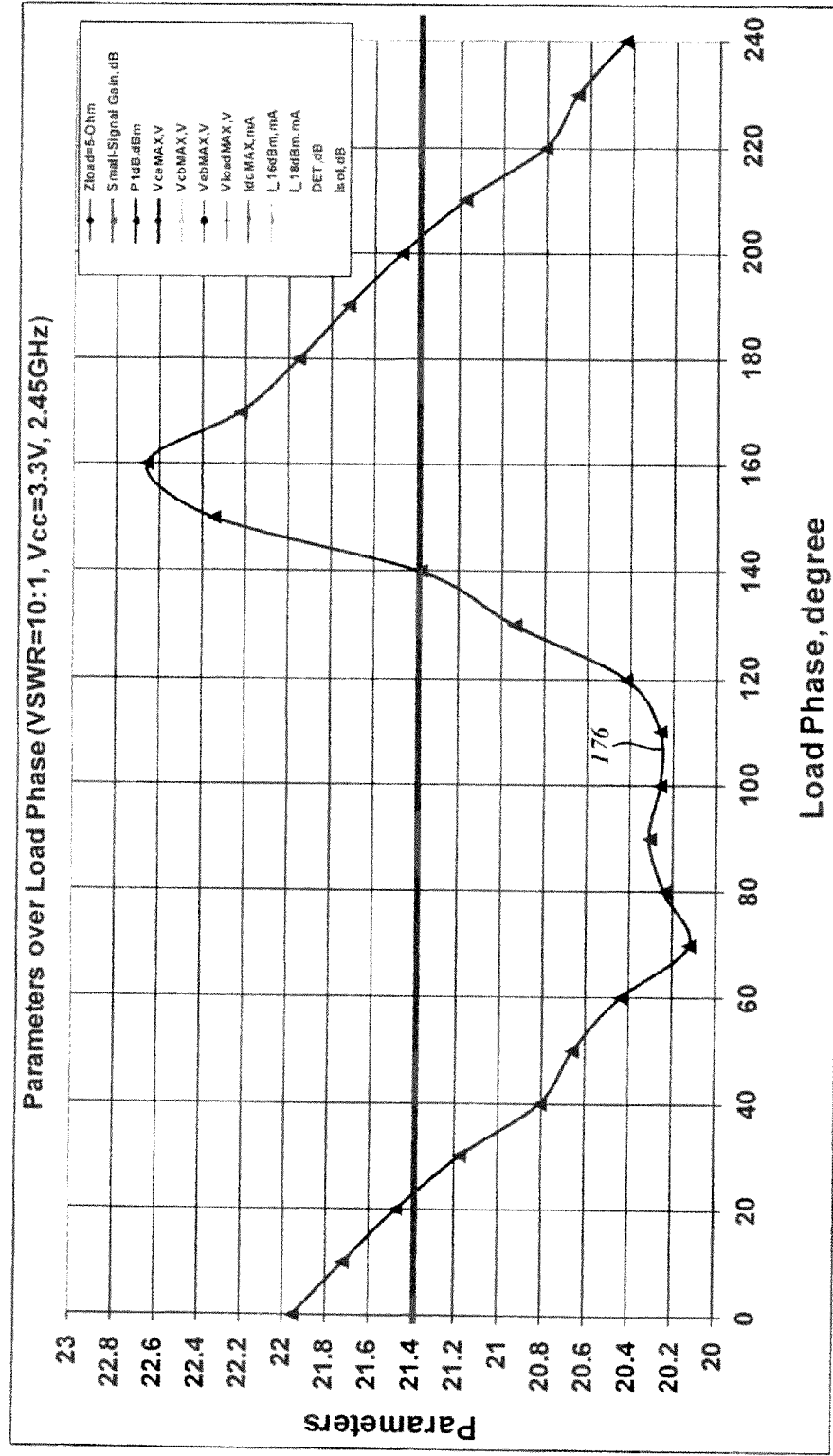
Figure 22D:
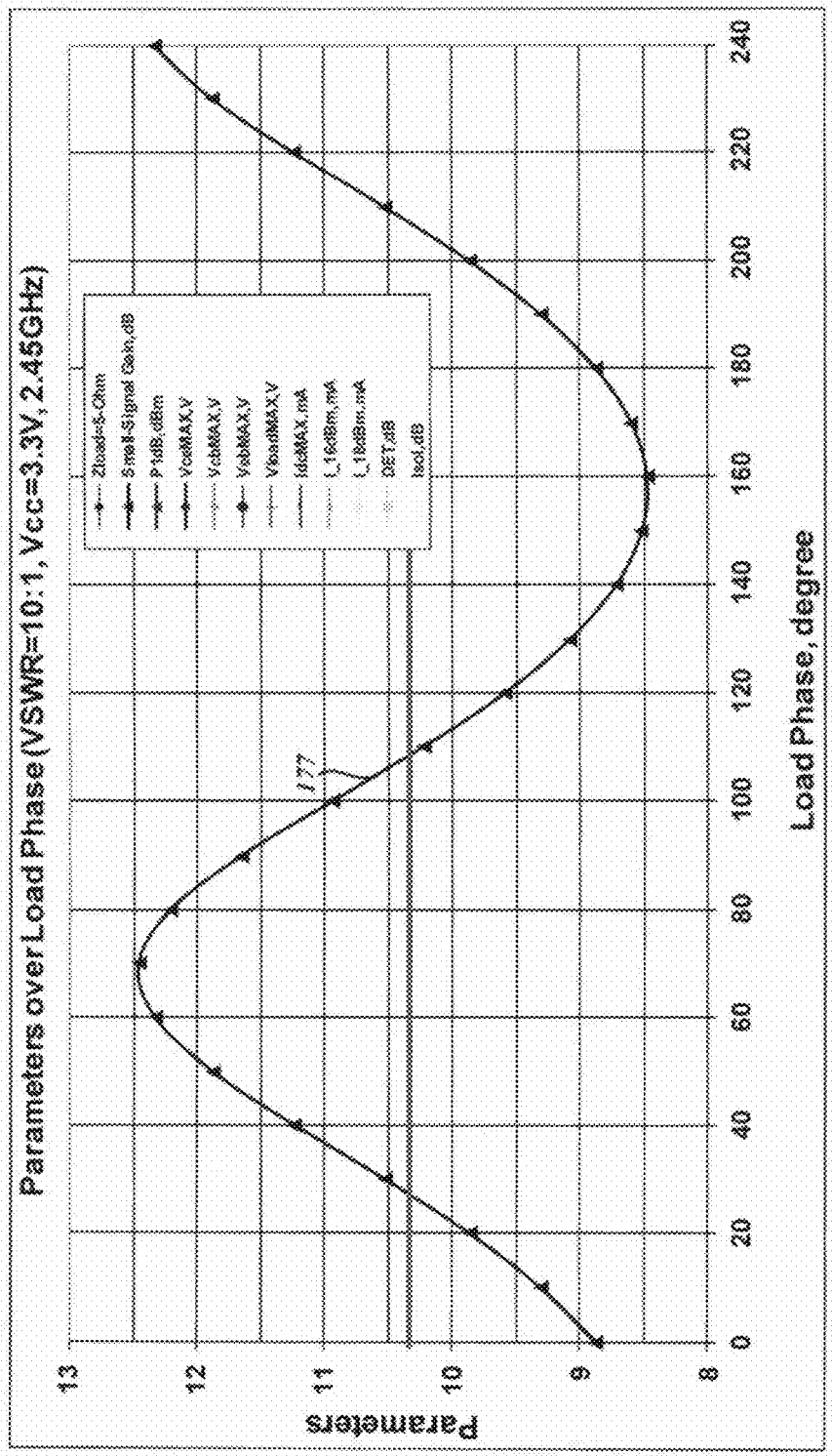

Referring now to the graphs of FIGS. 22A-22D, different plots of collector-emitter and collector-base voltages, DC current, output 1 dB gain compression, and small signal gain in relation to load phase with a VSWR of 10:1, a supply voltage of 3.3 V, and an operating frequency of 2.45 GHz are shown. In particular, the graph of FIG. 22A shows a simulated collector-emitter plot 166 and collector-base plot 168 with a maximum input power of 17 dBm. At this VSWR mismatch, the maximum voltage between the collector and the base increased less than 0.6V. The related graph of FIG. 22B, with a plot 170, shows the simulated DC currents for a maximum input signal of 18 dBm across different phases. A plot 172 shows the same for an input signal of 17 dBm, while a plot 174 is for an input signal of 16 dBm. The graph of FIG. 22C, in a plot 176, shows the output power 1 dB gain compression at a load VSWR of 10:1 for different phases. As shown, the variation of P1 dB, as well as the maximum linear power is contemplated to be less than 1.4 dB, a figure that is significantly lower than conventional configurations. Moreover, the graph of FIG. 22D in a plot 177, shows the small signal gain at a load VSWR of 10:1 for different phases. The variation is +/−2.5 dB.

Figure 23A:
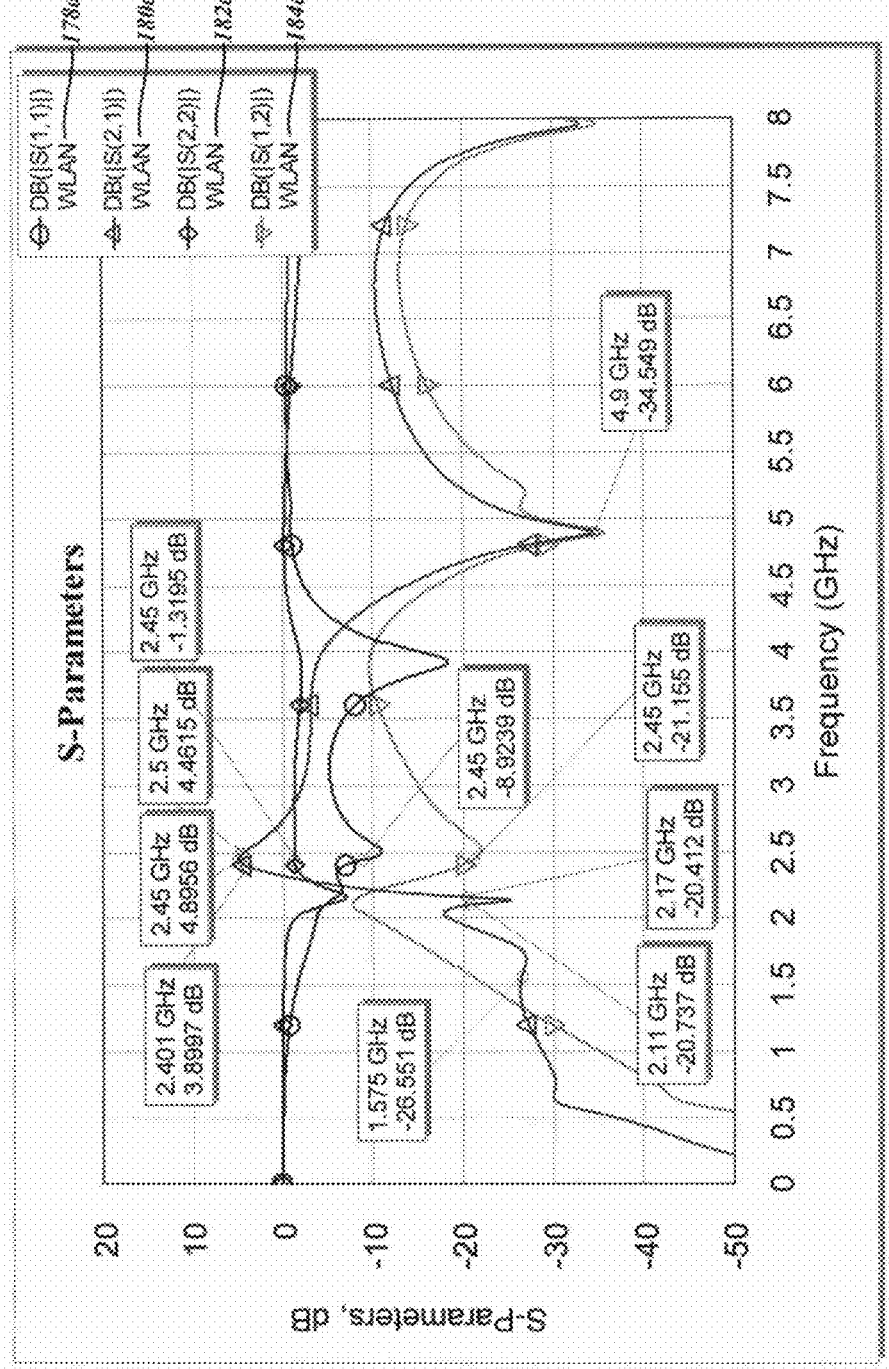
Figure 23B:
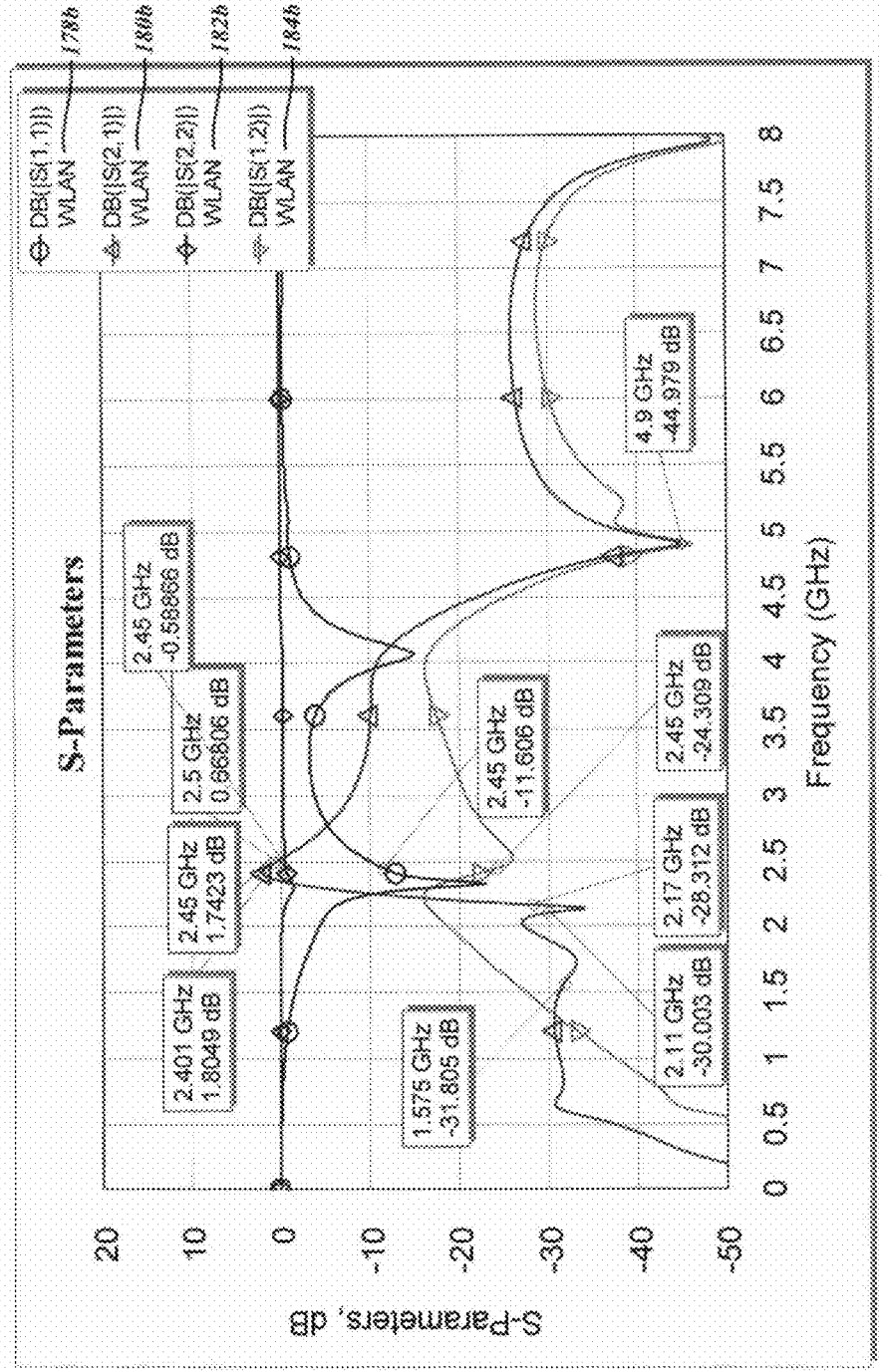
Figure 23C:
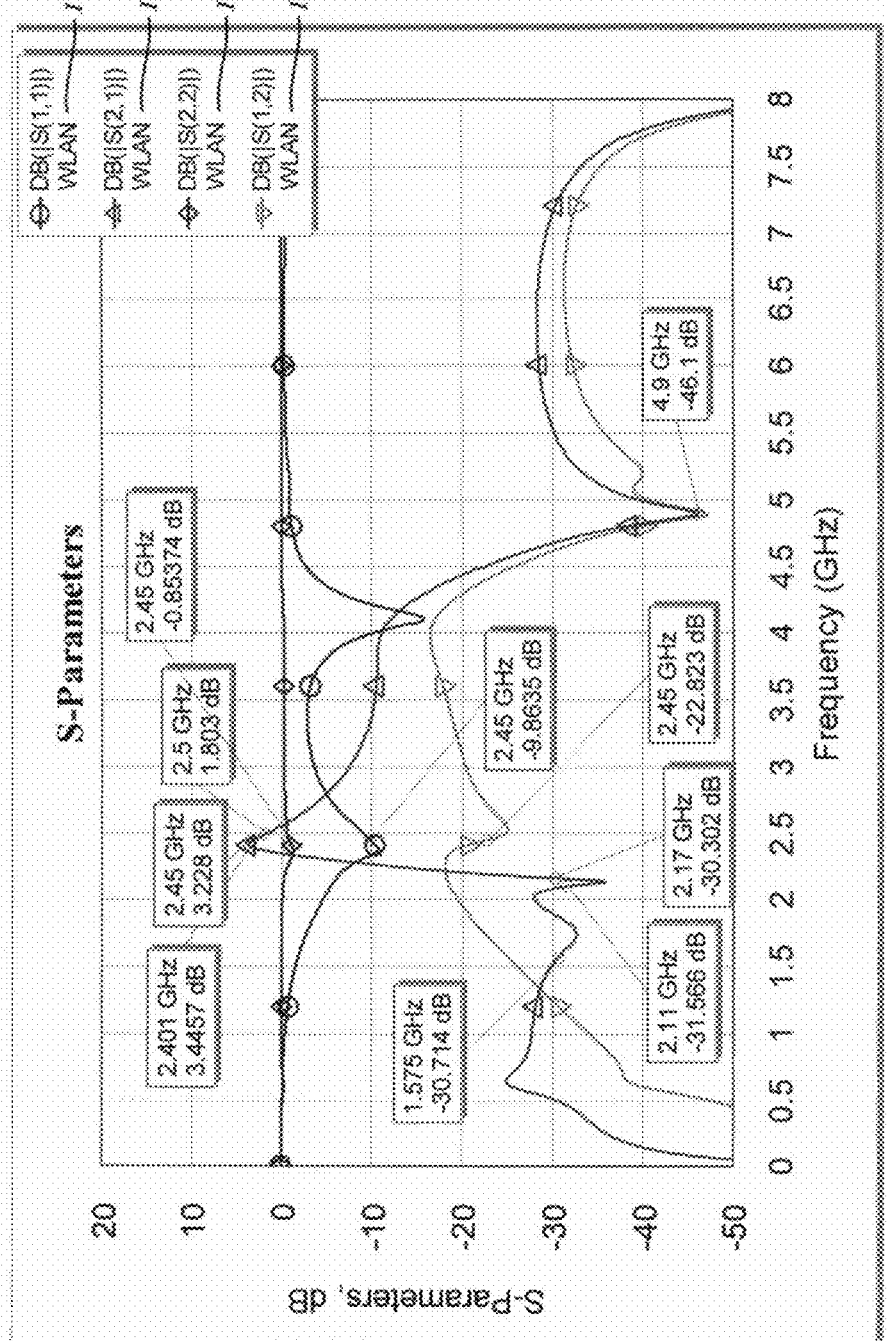
Figure 23D:
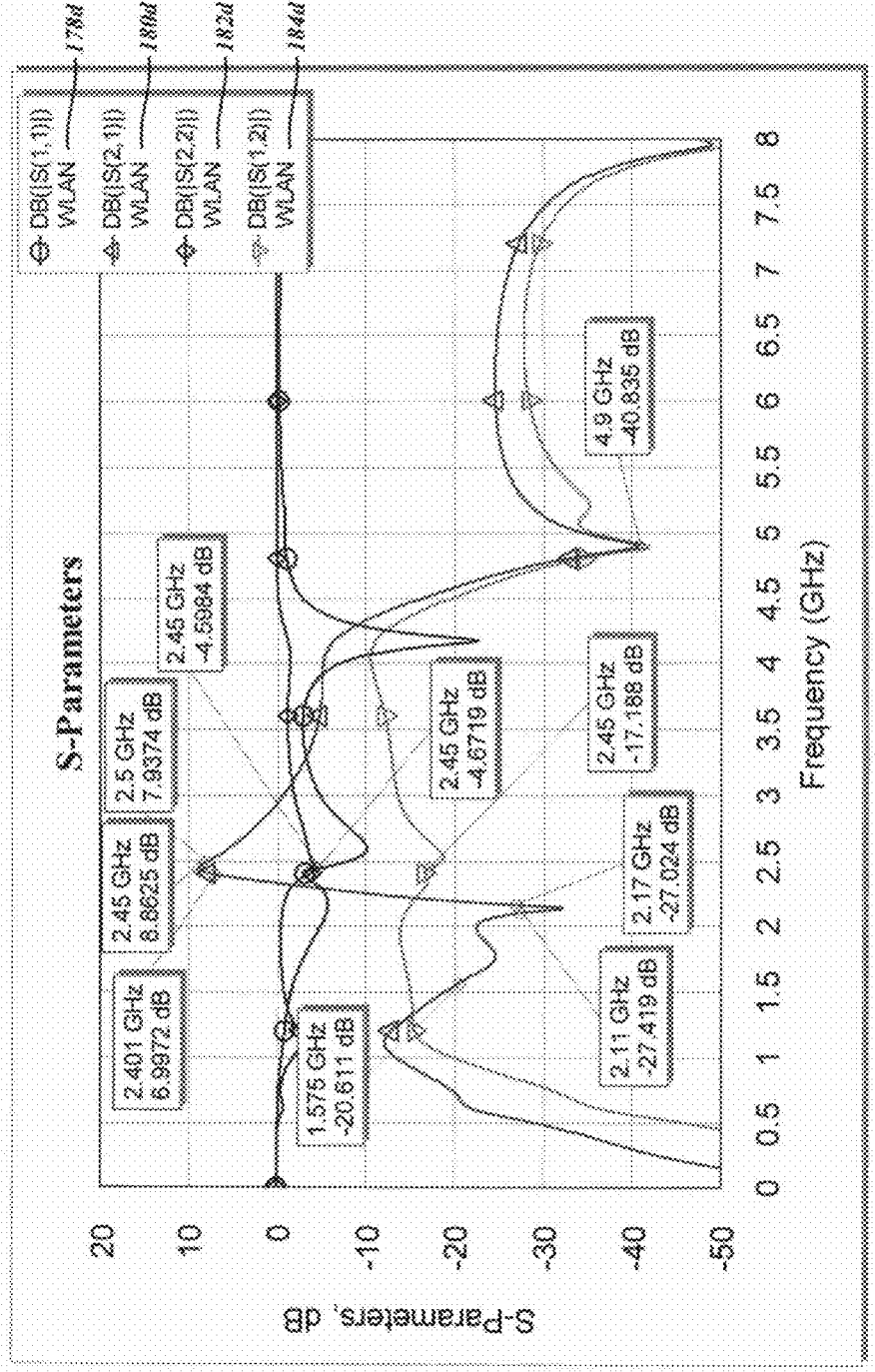

As shown in the following graphs, even over a wide range of load and signal source VSWR variation, the rejection of the WCDMA receive band at 2.11 GHz to 2.17 GHz remains high. The graphs of FIGS. 23A-23D plot the simulated S-parameters over load phase with a load of 5 Ohms, and the capacitor C6 of 13 pF. Each of the graphs include a first plot 178 for the port 1 (input) reflection coefficient S11, a second plot 180 for the forward voltage gain S21, a third plot 182 for the port 2 (output) reflection coefficient S22, and a fourth plot 184 for the reverse voltage gain S12. FIG. 23A, along with plots 178a, 180a, 182a, and 184a is for a phase of 0 degrees, FIG. 23B, along with plots 178b, 180b, 182b, and 184b is for a phase of 45 degrees, FIG. 23C, with plots 178c, 180c, 182c, and 184c is for a phase of 90 degrees, and FIG. 23D with plots 178d, 180d, 182d, and 184d is for a phase of 135 degrees.

Figure 24A:
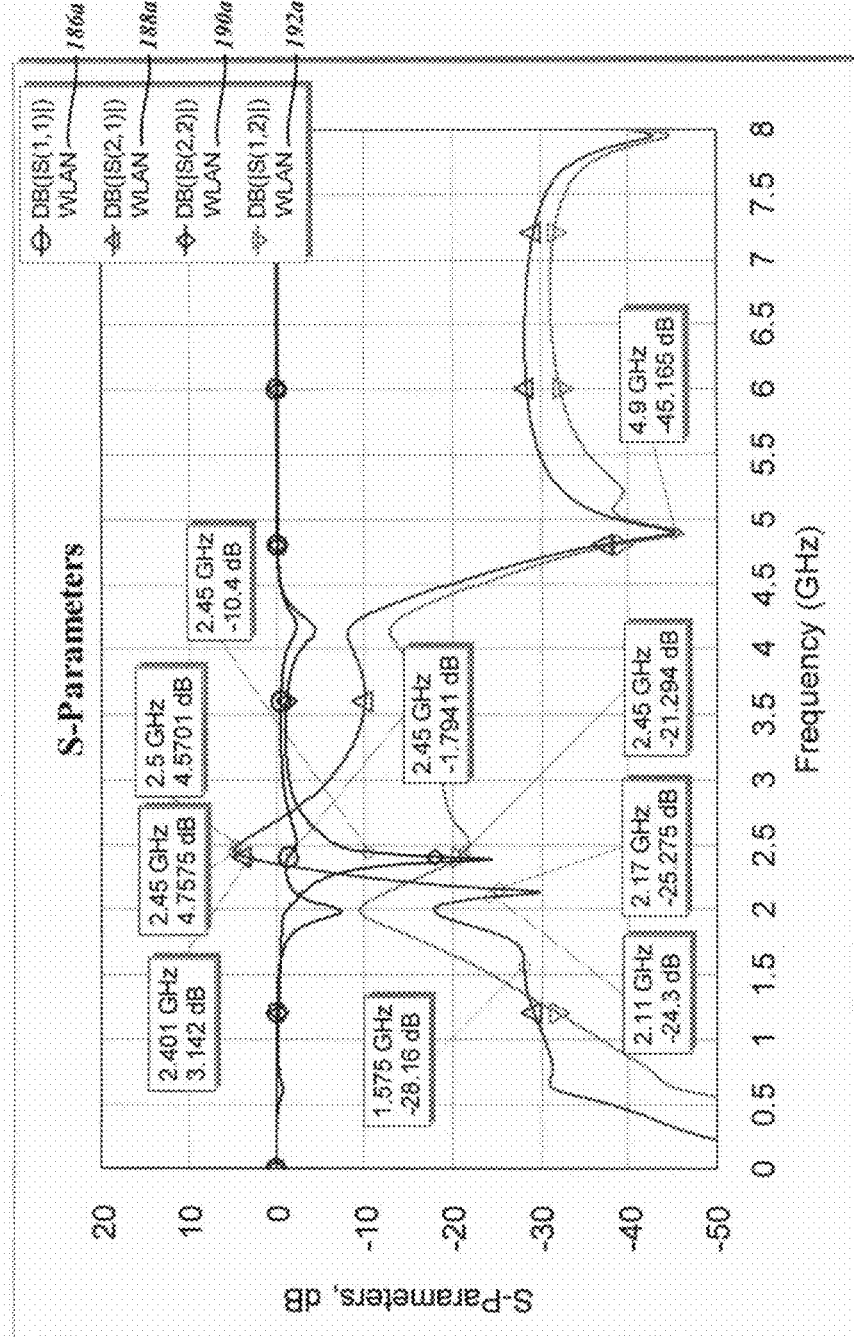
Figure 24B:
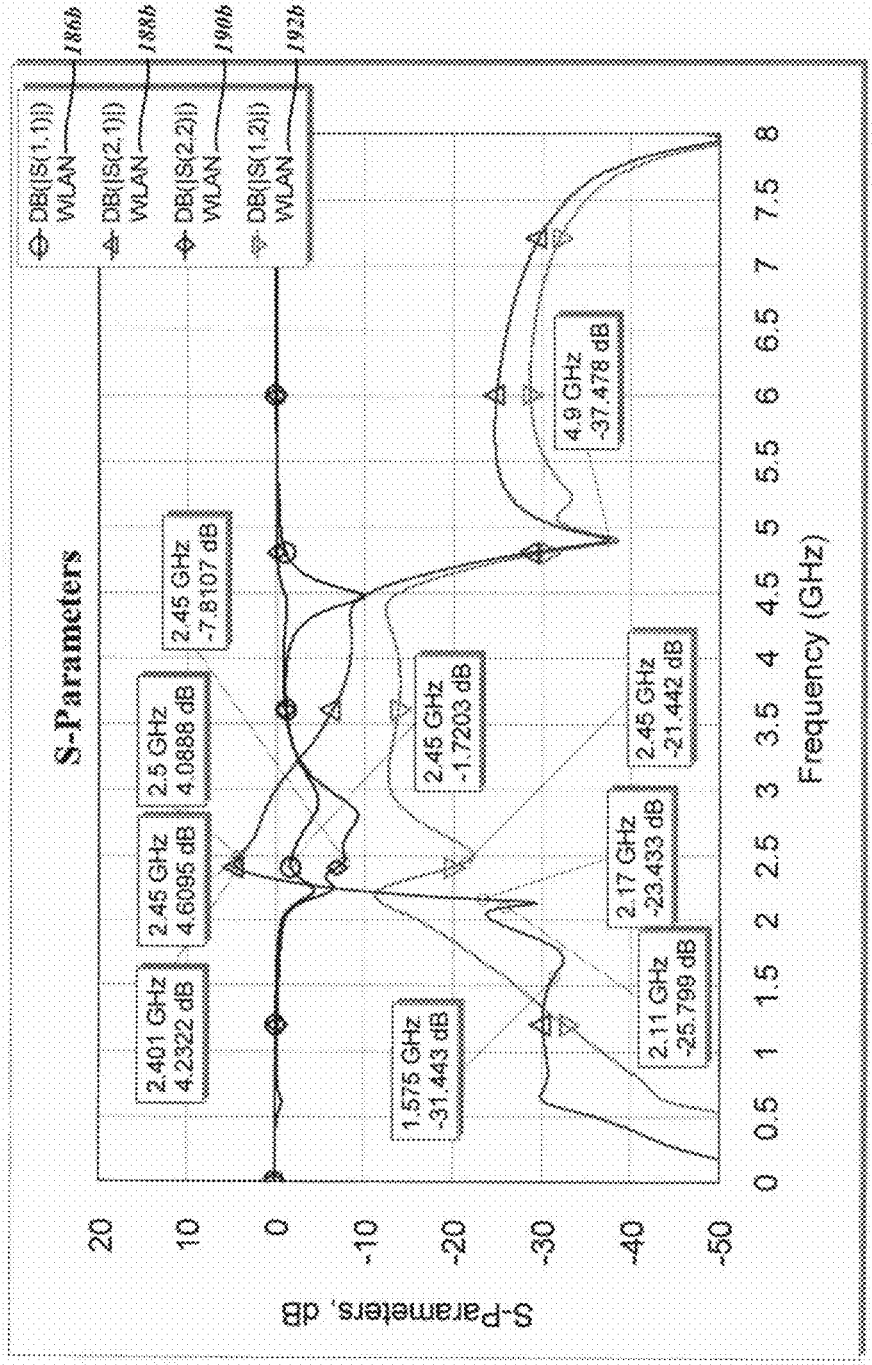
Figure 24C:
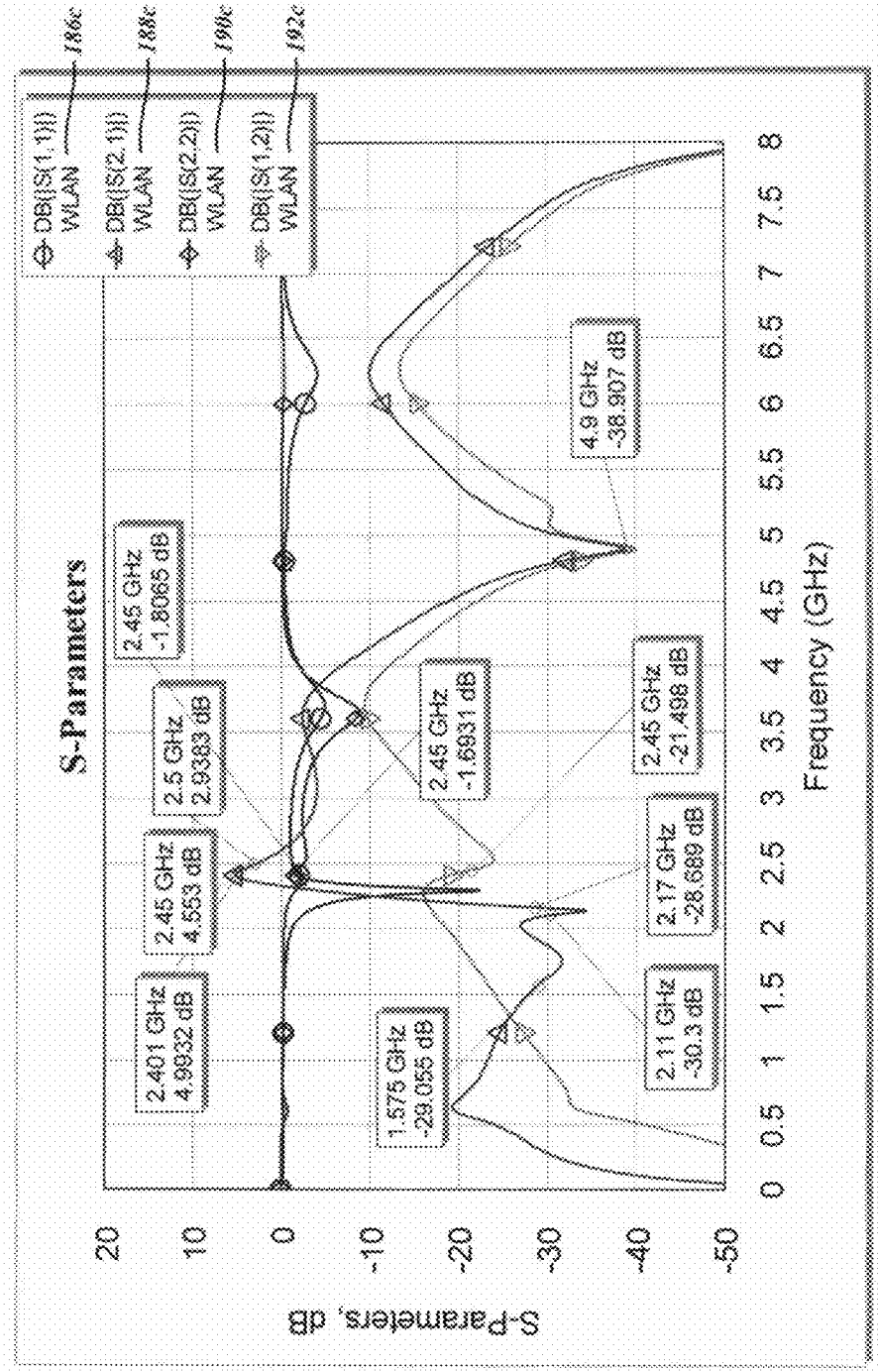
Figure 24D:
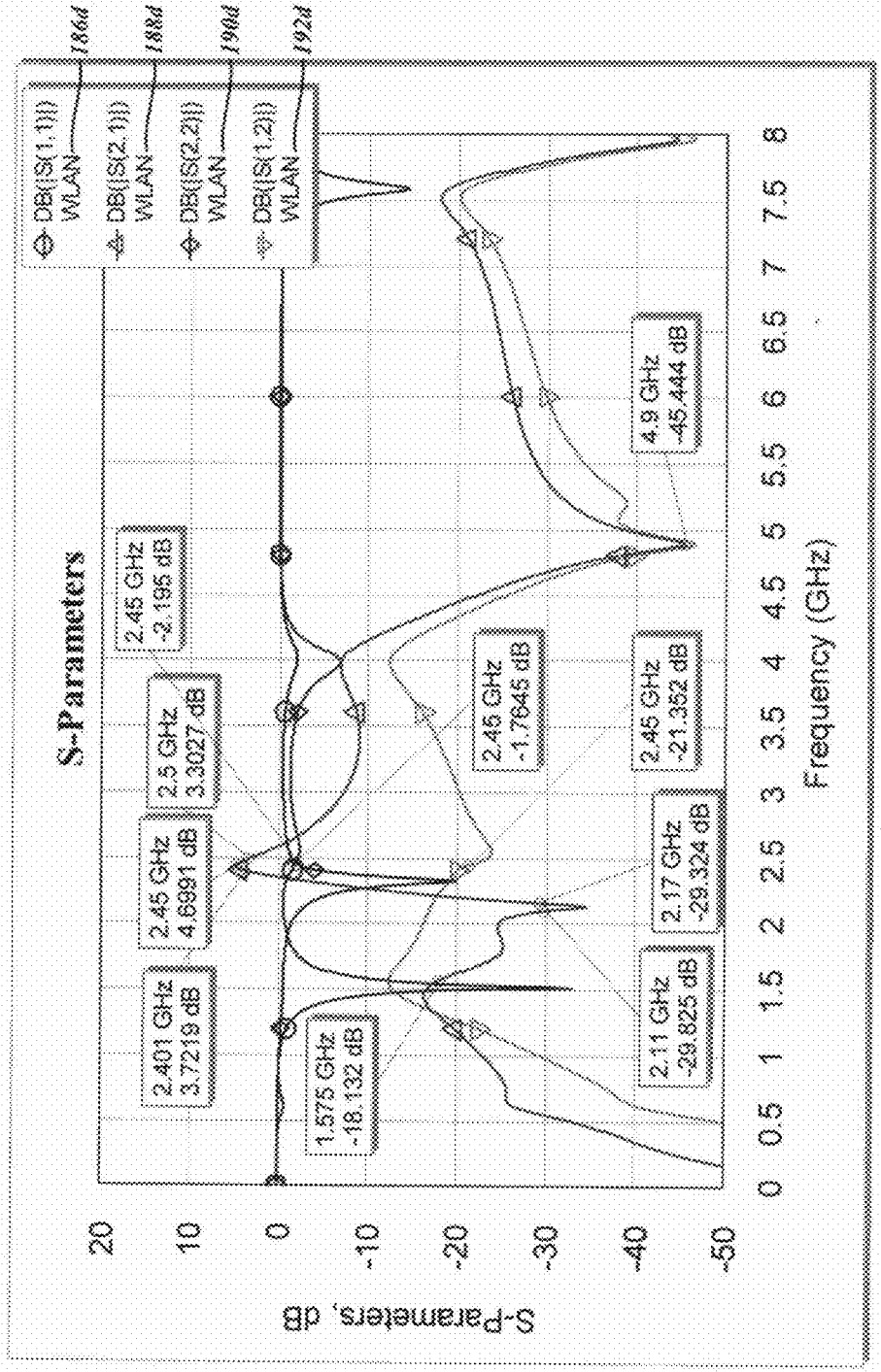

The graphs of FIGS. 24A-24D plot the simulated S-parameters over source mismatch phase with a source of 5 Ohms, and the capacitor C6 of 13 pF. Each of the graphs include a first plot 186 for the port 1 (input) reflection coefficient S11, a second plot 188 for the forward voltage gain S21, a third plot 190 for the port 2 (output) reflection coefficient S22, and a fourth plot 192 for the reverse voltage gain S12. FIG. 24A, along with plots 186a, 188a, 190a, and 192a is for a phase of 0 degrees, FIG. 24B, along with plots 186b, 188b, 190b, and 192b is for a phase of 45 degrees, FIG. 24C, with plots 186c, 188c, 190c, and 192c is for a phase of 90 degrees, and FIG. 24D with plots 186d, 188d, 190d, and 192d is for a phase of 135 degrees.

Figure 25A:
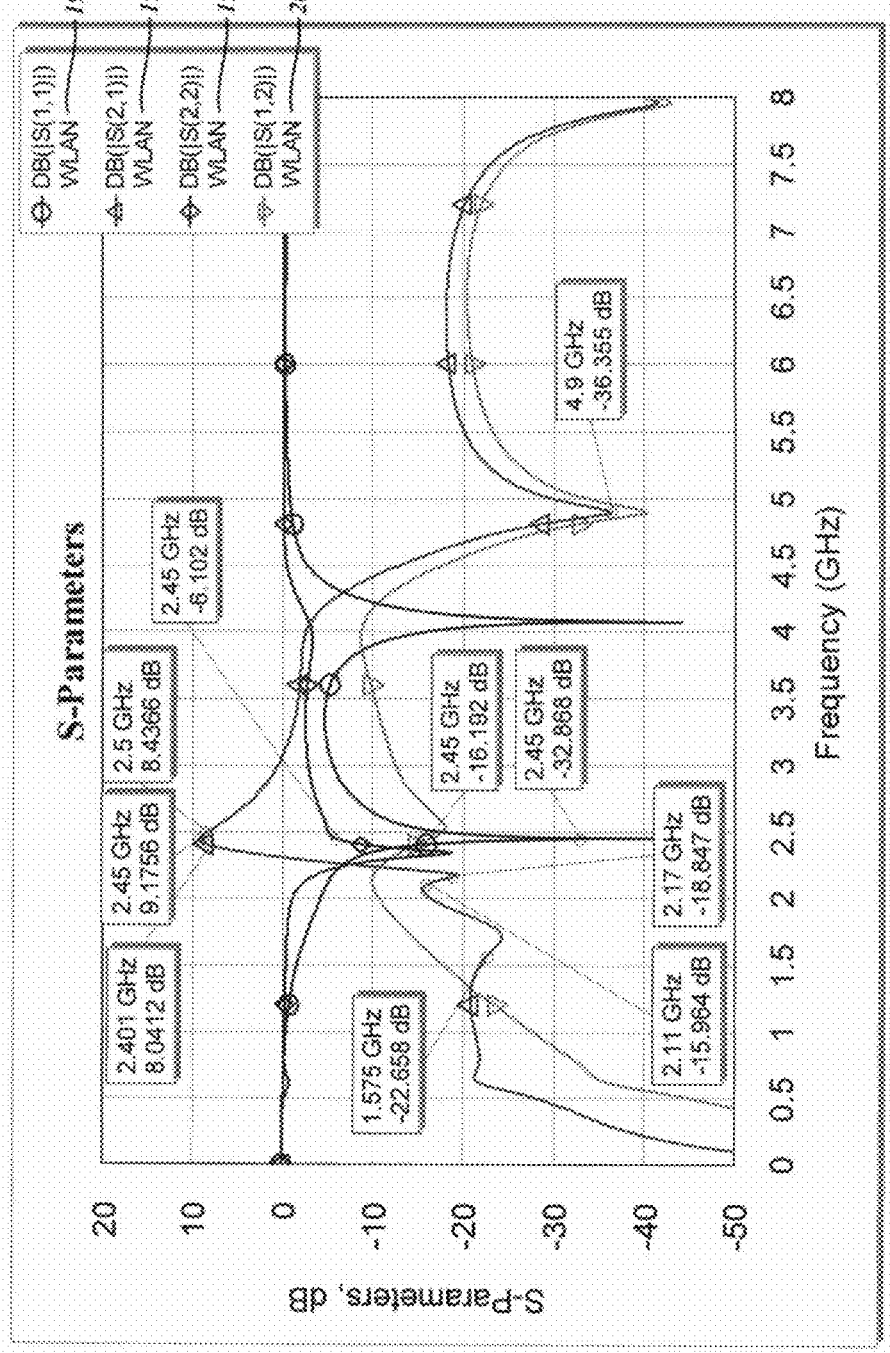
FIGS. 25A-25E are graphs of simulated S-parameters for different bond wire configurations.
Figure 25B:
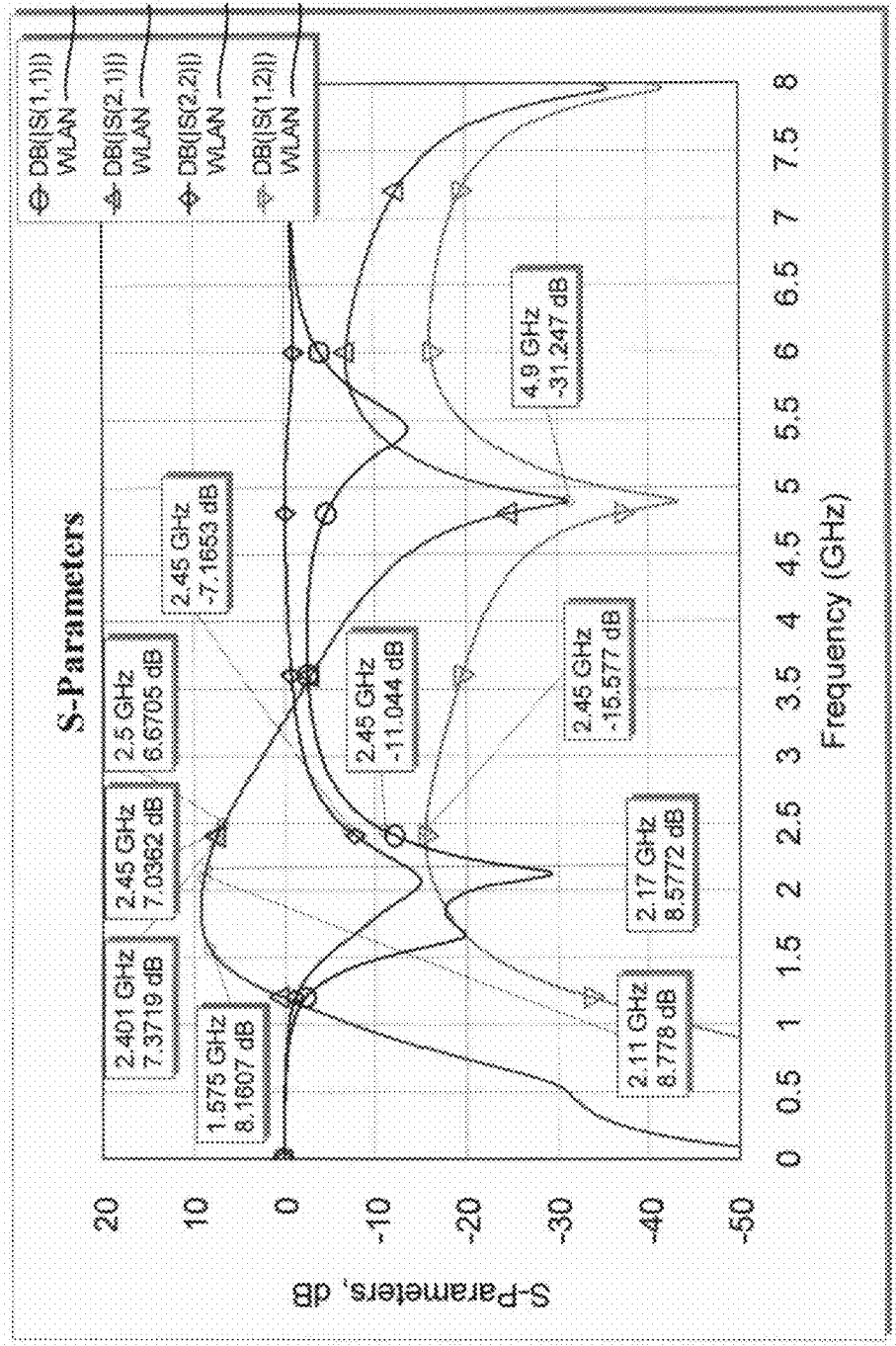
Figure 25C:
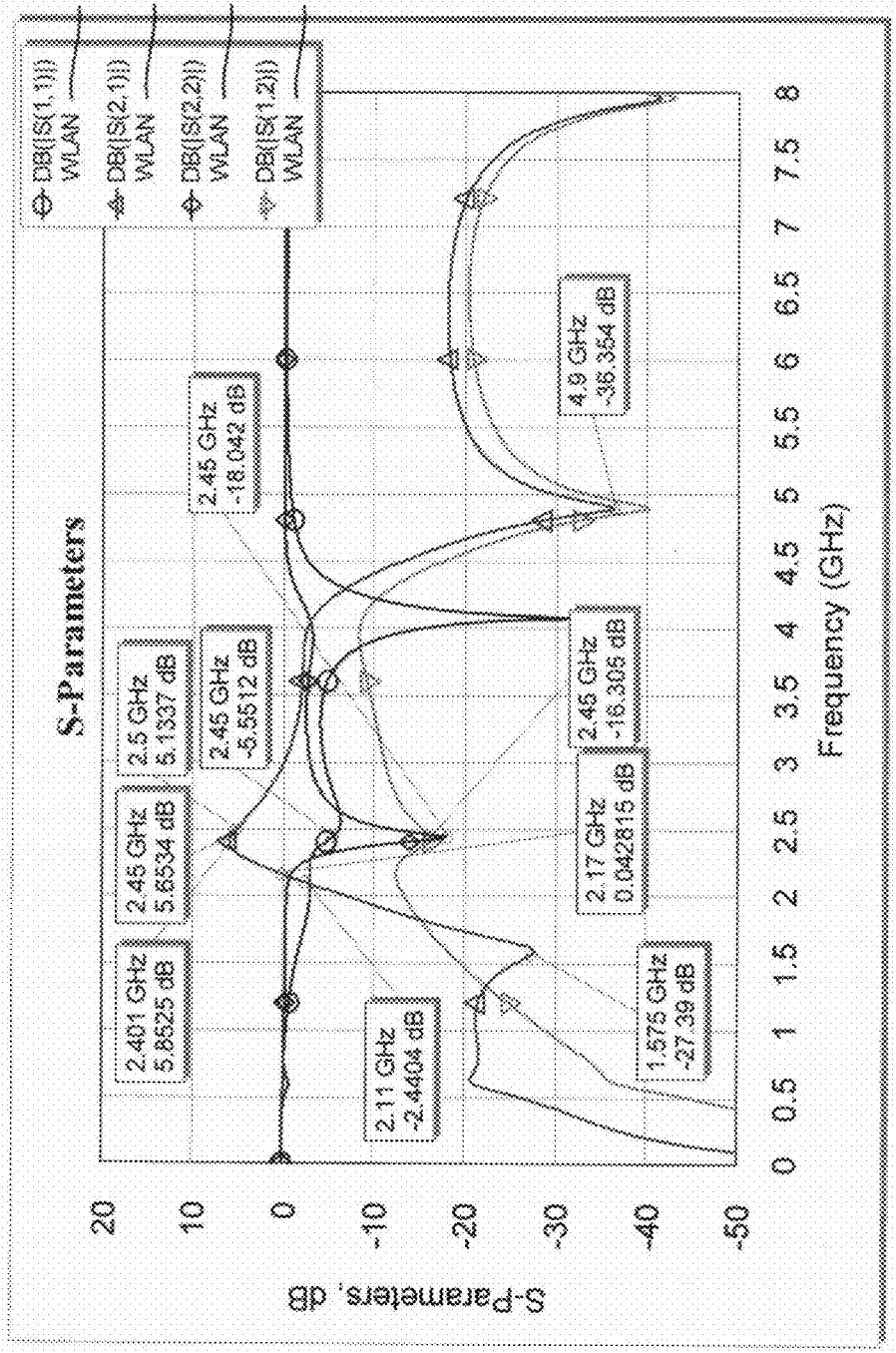
Figure 25D:
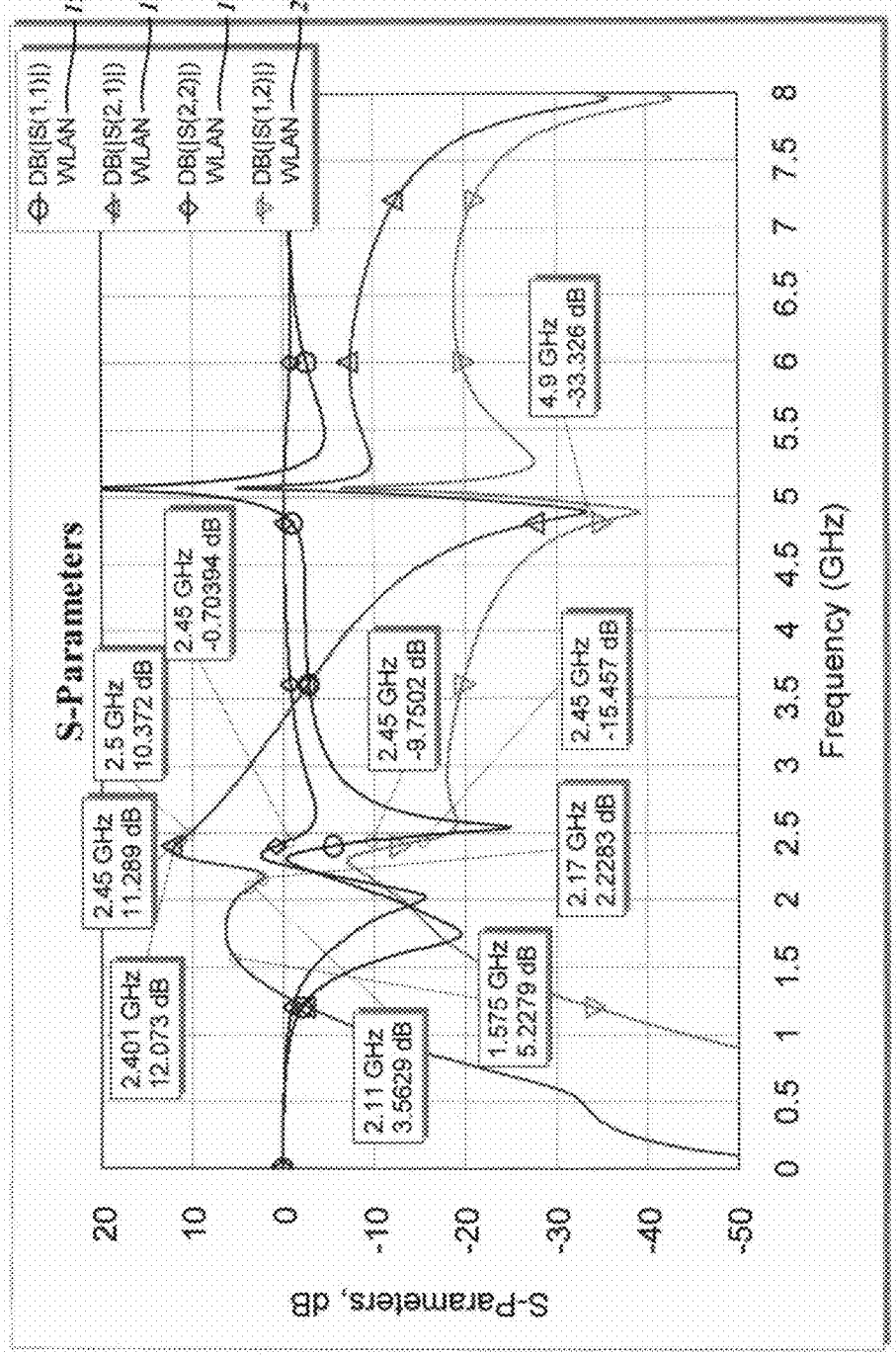
Figure 25E:
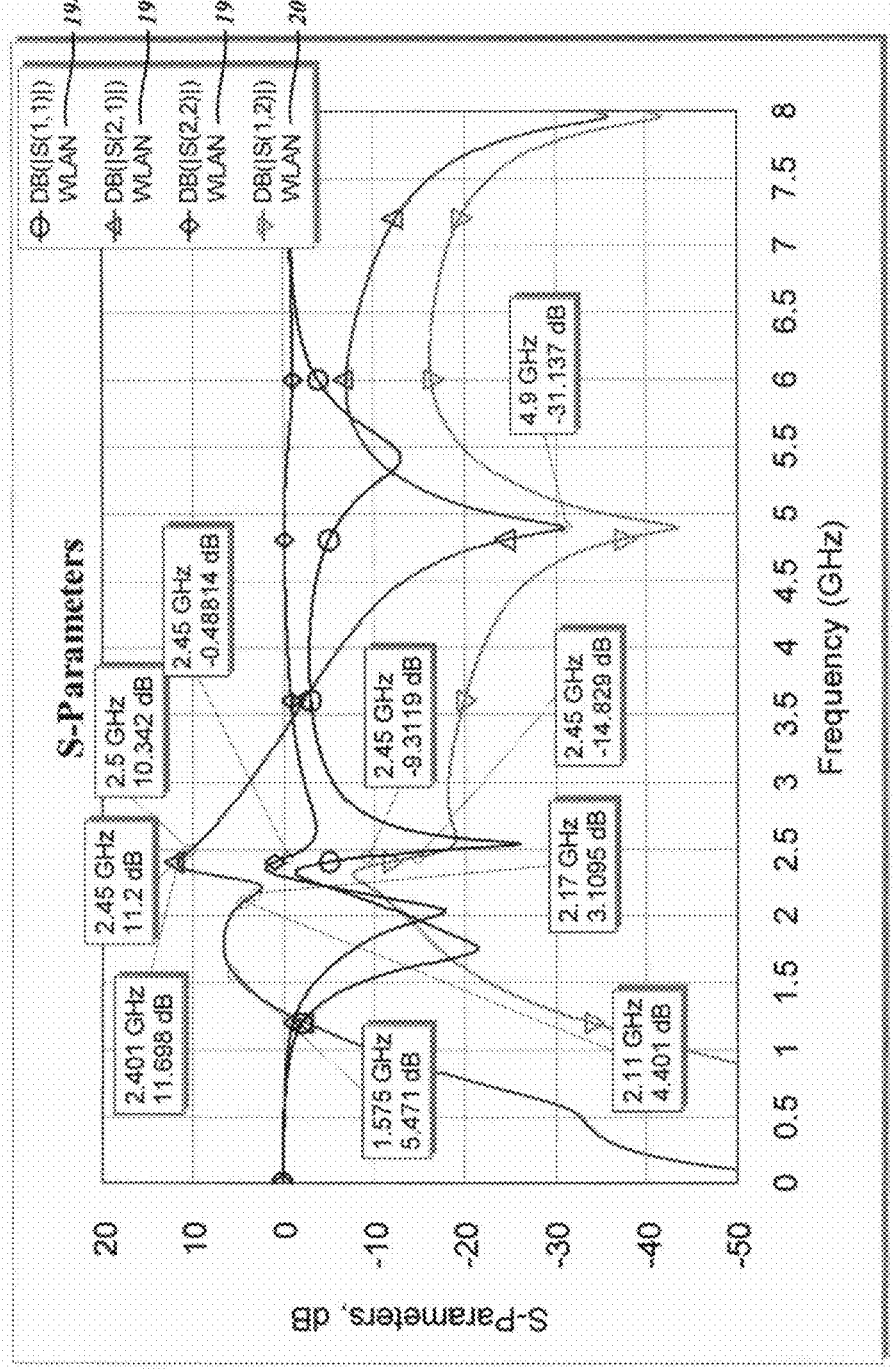

Furthermore, the graphs of FIGS. 25A-25E plot the simulated S-parameters for different bond wire configurations. Again, each graph includes include a first plot 194 for the port 1 (input) reflection coefficient S11, a second plot 196 for the forward voltage gain S21, a third plot 198 for the port 2 (output) reflection coefficient S22, and a fourth plot 200 for the reverse voltage gain S12. FIG. 25A, along with plots 194a, 196a, 198a, and 200a is for a configuration in which there are two bond wires and one cap. FIG. 25B, including plots 194b, 196b, 198b, and 200b is for a configuration with one bond wire and no parallel feedback. In contrast, FIG. 25C, including plots 194c, 196c, 198c, and 200c is for a configuration with one bond wire and parallel feedback. FIG. 25D with plots 194d, 196d, 198d, and 200d is a configuration with three bond wires, and no parallel feedback. FIG. 25E including plots 194e, 196e, 198e, and 200e is a configuration with two bond wires, and no parallel feedback.

Figure 26:
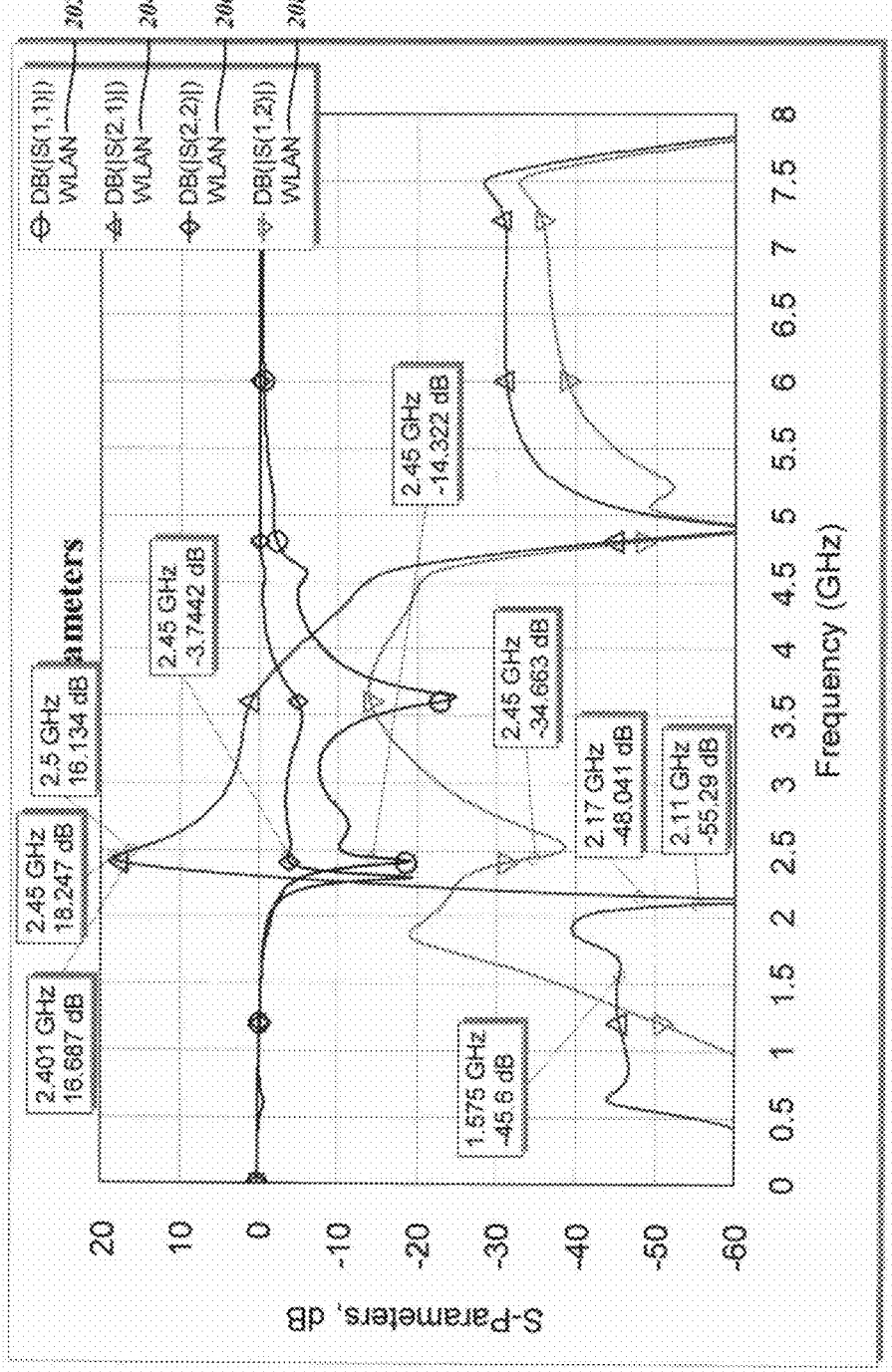
FIG. 26 is a graph of simulated S-parameters for a two-stage power amplifier.

As indicated above, the power amplifier architecture 110 can be configured as multiple stages. The S-parameter plot of FIG. 26, including a first plot 202 for the port 1 (input) reflection coefficient S11, a second plot 204 for the forward voltage gain S21, a third plot 206 for the port 2 (output) reflection coefficient S22, and a fourth plot 208 for the reverse voltage gain S12, shows that the rejection between the WLAN frequency band (2.45 GHz) and the WCDMA receive band (2.17 GHz) is above 65 dBc. This is understood to be sufficient for handset/mobile communication applications, and no addition filtering is needed at either the antenna or the power amplifier output. Furthermore, all other cellar bands and GPS band frequencies are rejected to an extent greater than 56 dB. As such, no other filtering is needed.

Figure 27:
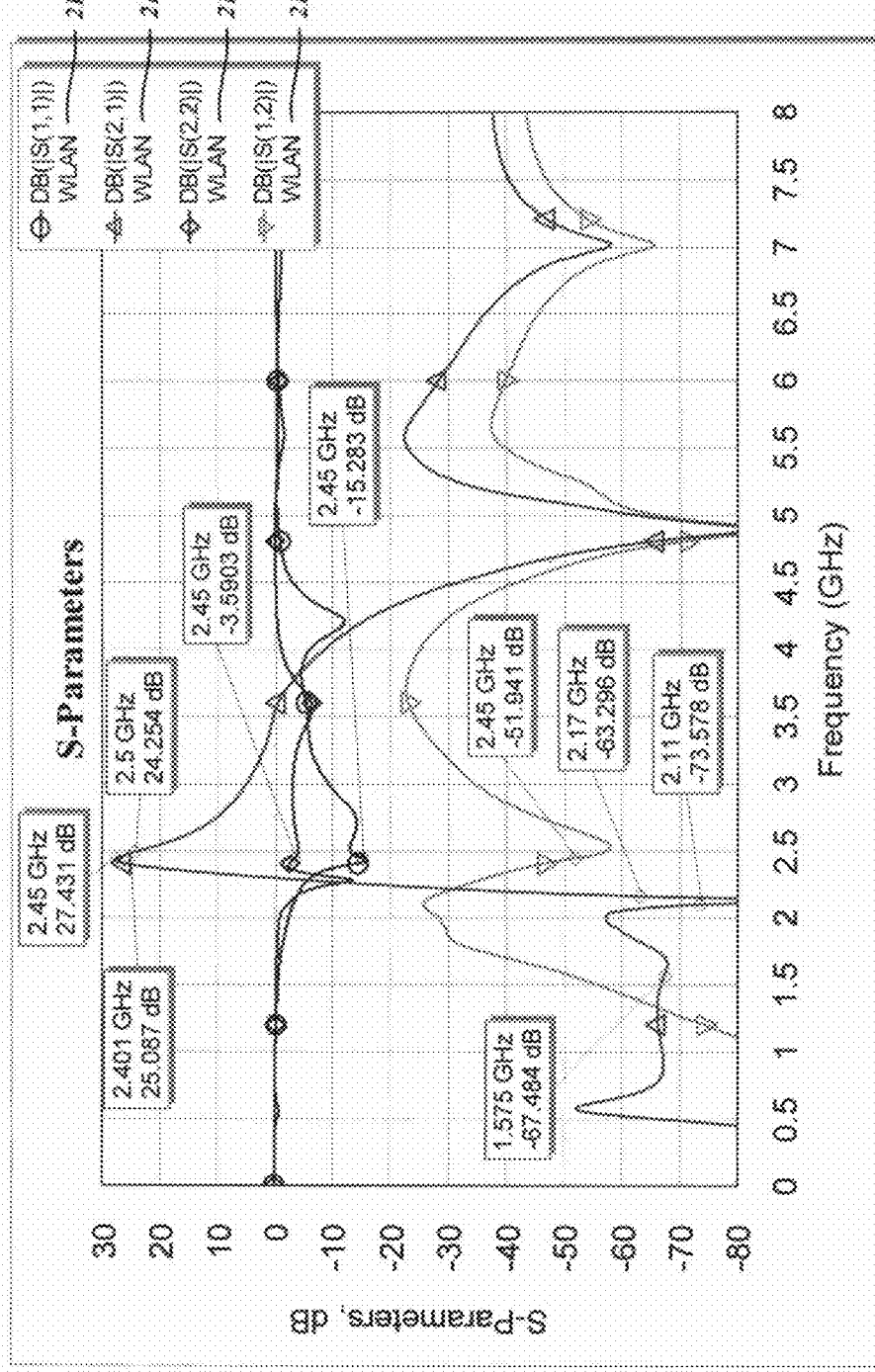
FIG. 27 is a graph of simulated S-parameters for a three-stage power amplifier with rejection notches at each stage.

Further improvements in filtering and rejection of WLAN frequency bands can be achieved with additional amplification stages (three stage amplifier simulation results are shown in FIG. 27), with a filter or rejection "notch" included in each stage. The rejection of unwanted noise/signals is at a level greater than 83 dB, which again, eliminates the need for additional filtering external to the power amplifier architecture 110. Other frequency bands including cellular and GPS modalities are also rejected at a level greater than 80 dB. Rejection levels this high may not be needed, so it may be possible to modify the configuration of the communications system 10 to utilize more closely spaced antennas.

The particulars shown herein are by way of example and for purposes of illustrative discussion of the embodiments of the present disclosure only and are presented in the cause of providing what is believed to be the most useful and readily understood description of the principles and conceptual aspects thereof. In this regard, no attempt is made to show details of the various embodiments with more particularity than is necessary for the fundamental understanding of the present disclosure, the description taken with the drawings making apparent to those skilled in the art how the several forms may be embodied in practice.

What is claimed is:

1. A power amplifier architecture for an operating frequency for connecting a transceiver to an antenna and including an input port and an output port, comprising:
    an input matching segment connected to the input port;
    an output matching segment connected to the output port;
    at least one filter with a range of rejection frequencies within a close proximity to the operating frequency;
    an amplifier segment including at least one transistor having a first terminal connected to the input matching segment, a second terminal connected to the output matching segment, and a third terminal connected to the filter in close proximity to a first inductive interconnection tying a junction connected to the third terminal to a ground; and
    a compensator connected to the input matching segment and the output matching segment to minimize instability of the filter.

2. The power amplifier architecture of claim 1, wherein the filter includes a first filter capacitor tied to the junction and a first filter inductor in series with the first filter capacitor and tied to the ground.

3. The power amplifier architecture of claim 2, wherein the first filter inductor is a second inductive interconnection extending in a parallel relationship to the first inductive interconnection, the first and second bond wires being magnetically coupled to each other.

4. The power amplifier architecture of claim 3, wherein a magnetic coupling coefficient between the first inductive interconnection and the second inductive interconnection is approximately 0.4 to 0.5.

5. The power amplifier architecture of claim 2, wherein the first filter capacitor and the first filter inductor have values corresponding to a small resistive impedance and reactive impedance at the operating frequency, and a large resistive impedance and reactive impedance at the range of the rejection frequencies.

6. The power amplifier architecture of claim 5, wherein the resistive impedance at the operating frequency is less than approximately 4 Ohms, and the resistive impedance at the range of rejection frequencies is greater than approximately 15 Ohms.

7. The power amplifier architecture of claim 5, wherein the reactive impedance at the operating frequency is approximately 0 Ohms, and the inductive reactive impedance at the range of rejection frequencies is greater than approximately 20 Ohms.

8. The power amplifier architecture of claim 2, wherein the filter includes a second filter capacitor tied to the junction and a second filter inductor in series with the second filter capacitor and tied to ground.

9. The power amplifier architecture of claim 8, wherein the first filter inductor and the second filter inductor are a second inductive interconnection and a third inductive interconnection, respectively, extending in a parallel relationship to the first inductive interconnection, the first, second, and third inductive interconnections being magnetically coupled to each other.

10. The power amplifier architecture of claim 9, wherein a first magnetic coupling coefficient between the first inductive interconnection and the second inductive interconnection, and a second magnetic coupling coefficient between the first inductive interconnection and the third inductive interconnection, are approximately 0.4 to 0.5, and a third magnetic coupling coefficient between the second inductive interconnection and the third inductive interconnection is approximately 0.2 to 0.3.

11. The power amplifier architecture of claim 2, wherein the filter includes a second filter capacitor tied to the third terminal and a second filter inductor in series with the second filter capacitor and tied to the ground, and a third filter inductor connected between the third terminal and the junction.

12. The power amplifier architecture of claim 11, wherein the first filter inductor and the second filter inductor are a second inductive interconnection and a third inductive interconnection, respectively, extending in a parallel relationship to the first inductive interconnection, the first, second, and third inductive interconnection being magnetically coupled to each other.

13. The power amplifier architecture of claim 1, wherein the amplifier segment includes a plurality of transistors connected in a multi-stage sequence, more than one of the transistors being connected to respective filters.

14. The power amplifier architecture of claim 1, wherein the compensator includes:
  a parallel resonant circuit with a first compensator capacitor and a compensator inductor, the parallel resonant circuit being defined by a resonance frequency approximate the operating frequency; and
  a second compensator capacitor connected in series with the parallel resonant circuit.

15. The power amplifier architecture of claim 14, wherein the compensator affects rejection characteristics at particular signal frequencies.

16. The power amplifier architecture of claim 1, wherein the first inductive interconnection is a bond wire.

17. The power amplifier architecture of claim 1, wherein the first inductive interconnection is an on-die printed inductor.

18. The power amplifier architecture of claim 1, wherein the transistor is a bipolar type in which the first terminal is a base terminal, the second terminal is a collector terminal, and the third terminal is an emitter terminal.

19. The power amplifier architecture of claim 1, wherein the transistor is a field effect type in which the first terminal is a gate terminal, the second terminal is a source terminal, and the third terminal is a drain terminal.

20. The power amplifier architecture of claim 1, wherein the at least one transistor fabricated on a semiconductor architecture selected from a group consisting of metal oxide semiconductor field effect, bipolar junction, heterojunction bipolar, metal semiconductor field effect, and high electron mobility.

21. A radio frequency (RF) front end architecture for connecting a transceiver to an antenna, comprising:
  a transmit input port connectible to an output line of the transceiver;
  a receive output port connectible to an input line of the transceiver;
  a power amplifier with an operating frequency connected to the transmit input port, the power amplifier including a input matching segment, an output matching segment, and an amplifier segment;
  a filter with a range of rejection frequencies connected to an emitter side of the amplifier segment;
  a compensator connected to the output matching segment and the input matching segment of the power amplifier to minimize instability effects associated with the emitter side filter;
  a low noise amplifier connected to the receive output port; and
  a switch having a first port connected to the antenna, a second port connected to the low noise amplifier, and a third port connected to the power amplifier, the low noise amplifier and the second being selectively connectible to the antenna by the switch.

22. The RF front end architecture of claim 21, wherein the filter includes components with values corresponding to a small resistive impedance and reactive impedance at the operating frequency, and a large resistive impedance and reactive impedance at the range of rejection frequencies.

23. The RF front end architecture of claim 22, wherein the resistive impedance at the operating frequency is less than approximately 4 Ohms, and the resistive impedance at the range of rejection frequencies is greater than approximately 15 Ohms.

24. The RF front end architecture of claim 22, wherein the reactive impedance at the operating frequency is approximately 0 Ohms, and the inductive reactive impedance at the range of rejection frequencies is greater than approximately 20 Ohms.

25. The power amplifier architecture of claim 21, wherein the compensator includes a parallel resonant circuit defined by a resonance frequency approximate the operating frequency.

26. The power amplifier architecture of claim 25, wherein the compensator affects rejection characteristics at particular signal frequencies.

27. An RF front end circuit connecting a first transceiver operating in a first frequency band to a first antenna and a second transceiver operating in a second frequency band to a second antenna, the front end circuit comprising:
  a first power amplifier connectible to a transmit line from the first transceiver;
  a first low noise amplifier connectible to a receive line from the first transceiver;
  a second power amplifier connectible to a transmit line from the second transceiver;
  a second low noise amplifier connectible to a receive line from the second transceiver; and
  a co-existence filter in a transmit chain defined by an interconnection between the transmit line from the second transceiver and the second antenna including the second power amplifier, the co-existence filter rejecting a portion of a transmitted signal of the second frequency band overlapping in frequency with a reception of the first frequency band;
  wherein the first power amplifier and the first low noise amplifier are connectible to the first antenna, the second power amplifier and the second low noise amplifier are selectively connectible to the second antenna, and the co-existence filter fabricated on-die together with the second power amplifier and the second low noise amplifier.

28. The RF front end circuit of claim 27, further comprising:
  a duplexer having a first port connected to an output of the first power amplifier, a second port connected to an input of the first low noise amplifier, and a third port connectible to the first antenna, the duplexer connecting the first power amplifier and the first low noise amplifier to the first antenna.

29. The RF front end circuit of claim 27, further comprising:
  a switch having a first port connected to an output of the second power amplifier, a second port connected to an input of the second low noise amplifier, and a third port connectible to the second antenna, the switch selectively connecting the second power amplifier and the second low noise amplifier to the second antenna.

30. The RF front end circuit of claim 27, wherein the first frequency band corresponds to a Wideband Code Division Multiple Access (WCDMA) mobile communications modality.

31. The RF front end circuit of claim 30, wherein the first frequency band ranges approximately between 2.11 GHz to 2.17 GHz, the first power amplifier and the first low noise amplifier being tuned therefor.

32. The RF front end circuit of claim 27, wherein the second frequency band corresponds to a Wireless Local Area Network (WLAN) data networking modality.

33. The RF front end circuit of claim 32, wherein the second frequency band ranges approximately between 2.4 GHz to 2.5 GHz, the second power amplifier and the second low noise amplifier being tuned therefor.

34. The RF front end circuit of claim 27, wherein the first power amplifier, the second power amplifier, the first low noise amplifier, the second low noise amplifier, and the co-existence filter are fabricated on a semiconductor architecture selected from a group consisting of metal oxide semiconductor field effect, bipolar junction, heterojunction bipolar, metal semiconductor field effect, and high electron mobility.

35. A power amplifier architecture for an operating frequency for connecting a transceiver to an antenna and including an input port and an output port, comprising:
 an input matching segment connected to the input port;
 an output matching segment connected to the output port;
 at least one filter with a range of rejection frequencies;
 an amplifier segment including at least one transistor having a first terminal connected to the input matching segment, a second terminal connected to the output matching segment, and a third terminal connected to the filter in close proximity to a first inductive interconnection tying a junction connected to the third terminal to a ground; and
 a compensator connected to the input matching segment and the output matching segment to minimize instability of the filter;
 wherein the filter includes a first filter capacitor tied to the junction and a first filter inductor in series with the first filter capacitor and tied to the ground.

36. The power amplifier architecture of claim 35, wherein the first filter inductor is a second inductive interconnection extending in a parallel relationship to the first inductive interconnection, the first and second bond wires being magnetically coupled to each other.

37. The power amplifier architecture of claim 35, wherein the first filter capacitor and the first filter inductor have values corresponding to a small resistive impedance and reactive impedance at the operating frequency, and a large resistive impedance and reactive impedance at the range of the rejection frequencies.

38. The power amplifier architecture of claim 35, wherein the filter includes a second filter capacitor tied to the junction and a second filter inductor in series with the second filter capacitor and tied to ground.

39. The power amplifier architecture of claim 38, wherein the first filter inductor and the second filter inductor are a second inductive interconnection and a third inductive interconnection, respectively, extending in a parallel relationship to the first inductive interconnection, the first, second, and third inductive interconnections being magnetically coupled to each other.

40. The power amplifier architecture of claim 35, wherein the filter includes a second filter capacitor tied to the third terminal and a second filter inductor in series with the second filter capacitor and tied to the ground, and a third filter inductor connected between the third terminal and the junction.

41. The power amplifier architecture of claim 40, wherein the first filter inductor and the second filter inductor are a second inductive interconnection and a third inductive interconnection, respectively, extending in a parallel relationship to the first inductive interconnection, the first, second, and third inductive interconnection being magnetically coupled to each other.

42. A power amplifier architecture for an operating frequency for connecting a transceiver to an antenna and including an input port and an output port, comprising:
 an input matching segment connected to the input port;
 an output matching segment connected to the output port;
 at least one filter with a range of rejection frequencies;
 an amplifier segment including at least one transistor having a first terminal connected to the input matching segment, a second terminal connected to the output matching segment, and a third terminal connected to the filter in close proximity to a first inductive interconnection tying a junction connected to the third terminal to a ground; and
 a compensator connected to the input matching segment and the output matching segment to minimize instability of the filter, the compensator including a parallel resonant circuit defined by a resonance frequency approximate the operating frequency and including a first compensator capacitor and a compensator inductor, and a second compensator capacitor connected in series with the parallel resonant circuit.

43. The power amplifier architecture of claim 42, wherein the compensator affects rejection characteristics at particular signal frequencies.

\* \* \* \* \*